United States Patent
Pille et al.

(10) Patent No.: US 10,804,266 B2
(45) Date of Patent: Oct. 13, 2020

(54) MICROELECTRONIC DEVICE UTILIZING STACKED VERTICAL DEVICES

(71) Applicant: INTERNATIONAL BUSINESS MACHINES CORPORATION, Armonk, NY (US)

(72) Inventors: Juergen Pille, Stuttgart (DE); Albert Frisch, Stuttgart (DE); Tobias Werner, Weil im Schoenbuch (DE); Rolf Sautter, Bondorf (DE); Dieter Wendel, Woernitz (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/193,009

(22) Filed: Nov. 16, 2018

(65) Prior Publication Data

US 2020/0161300 A1    May 21, 2020

(51) Int. Cl.
*H01L 27/092* (2006.01)
*H01L 21/8238* (2006.01)
(Continued)

(52) U.S. Cl.
CPC ........ *H01L 27/092* (2013.01); *H01L 21/8221* (2013.01); *H01L 21/823871* (2013.01); *H01L 21/823885* (2013.01); *H01L 23/5286* (2013.01); *H01L 23/535* (2013.01); *H01L 27/0207* (2013.01); *H01L 27/1104* (2013.01);
(Continued)

(58) Field of Classification Search
CPC ........ H01L 29/78642; H01L 29/78696; H01L 21/823885; H01L 23/1157; H01L 23/11524; H01L 23/11521; H01L 23/11568; H01L 23/2436; H01L 21/8221; H01L 29/7926; H01L 29/66666;
(Continued)

(56) References Cited

U.S. PATENT DOCUMENTS 6,229,169 B1 *  5/2001  Hofmann .............. H01L 27/108
                                                        257/296
7,098,478 B2   8/2006  Takaura et al.
(Continued)

FOREIGN PATENT DOCUMENTS

CN          1220494 A      6/1999
KR     20170014697 A      2/2017

OTHER PUBLICATIONS

De Marchi et al., "Top-Down Fabrication of Gate-All-Around Vertically Stacked Silicon Nanowire FETs With Controllable Polarity", IEEE Transactions on Nanotechnology, vol. 13, No. 6, Nov. 2014, pp. 1029-1038.

IMEC Magazine, "The Vertical Nanowire FET: Enabler of Highly Dense SRAMs", Semiconductor technology & processing, Sep. 2017, 13 pages, https://www.imec-int.com/en/imec-magazine/imec-magazine-september-2017/the-vertical-nanowire-fet-enabler-of-highly-dense-srams.

(Continued)

*Primary Examiner* — Caridad Everhart
(74) *Attorney, Agent, or Firm* — L. Jeffrey Kelly

(57) ABSTRACT

An embodiment may include a microelectronic device. The microelectronic device may include a first pair of transistors stacked vertically and connected in series. Each of the first pair of transistors are of the same type. The microelectronic device may include a second pair of transistors connected in parallel. The second pair of transistors being a different type than the first pair of transistors. The first pair of transistors and the second pair of transistors are arranged substantially perpendicular to the plurality of layers.

24 Claims, 48 Drawing Sheets

(51) Int. Cl.
*H01L 29/06* (2006.01)
*H03K 19/20* (2006.01)
*H01L 27/02* (2006.01)
*H01L 23/535* (2006.01)
*H01L 23/528* (2006.01)
*H01L 21/822* (2006.01)
*H01L 29/78* (2006.01)
*H03K 19/0948* (2006.01)
*H01L 27/11* (2006.01)
*H01L 29/423* (2006.01)

(52) U.S. Cl.
CPC ...... *H01L 29/0676* (2013.01); *H01L 29/7827* (2013.01); *H03K 19/0948* (2013.01); *H03K 19/20* (2013.01); *H01L 21/823807* (2013.01); *H01L 29/42392* (2013.01)

(58) Field of Classification Search
CPC ............ H01L 45/1233; H01L 27/0207; H01L 27/092; H03K 19/0948; H03K 19/20
See application file for complete search history.

(56) References Cited

U.S. PATENT DOCUMENTS

| | | | |
|---|---|---|---|
| 8,203,882 | B2 | 6/2012 | Hishida |
| 8,618,600 | B2 | 12/2013 | Slesazeck |
| 9,000,530 | B2 | 4/2015 | Balakrishnan et al. |
| 9,680,473 | B1 * | 6/2017 | Anderson ........... H01L 27/0207 |
| 9,711,511 | B1 | 7/2017 | Lim |
| 9,721,957 | B2 | 8/2017 | Nakanishi et al. |
| 9,761,726 | B1 | 9/2017 | Balakrishnan et al. |
| 9,831,317 | B1 | 11/2017 | Zang et al. |
| 10,366,983 | B2 | 7/2019 | Beigel |
| 2001/0002715 | A1 | 6/2001 | Armacost |
| 2010/0046294 | A1 | 2/2010 | Jeong |
| 2015/0060767 | A1 | 3/2015 | Xiao et al. |
| 2015/0348961 | A1 * | 12/2015 | Isobe ................. H01L 27/0266 361/56 |
| 2015/0372145 | A1 | 12/2015 | Cheng et al. |
| 2016/0063163 | A1 | 3/2016 | Moroz et al. |
| 2017/0053982 | A1 | 2/2017 | Cai et al. |
| 2017/0125424 | A1 | 5/2017 | Pao et al. |
| 2017/0221884 | A1 | 8/2017 | Machkaoutsan et al. |
| 2018/0122793 | A1 * | 5/2018 | Moroz ................. H01L 27/1104 |

OTHER PUBLICATIONS

Li, "Architecting SkyBridge-CMOS", University of Massachusetts Amherst ScholarWorks@UMassAmherst Masters Thesis Dissertations and Theses, 2015, 69 pages, http://scholarworks.umass.edu/masters_theses_2/157/.

Müller, et al., "Gate-controlled WSe2 transistors using a buried triple-gate structure", Nanoscale Research Letters, Nov. 22, 2016, 6 pages, vol. 11, No. 512, https://www.ncbi.nlm.nih.gov/pmc/articles/PMC5120059/.

Veloso et al., "Challenges and Opportunities of Vertical FET Devices using 3D Circuit Design Layouts", 2016 IEEE SOI-3D-Subthreshold Microelectronics Technology Unified Conference (S3S) 2016, 3 pages, IEEE, Leuven, BEL http://ieeexplore.ieee.org/document/7804409/.

Wang, et al., "Gate-All-Around FET Based 6T SRAM Design Using a Device-Circuit Co-Optimization Framework", 2017 IEEE 60th International Midwest Symposium on Circuits and Systems (MWSCAS), Oct. 2, 2017, pp. 1113-1116, Los Angles, CA, USA, http://ieeexplore.ieee.org/document/8053123/.

Weis, et al., "Stacked 3-Dimensional 6T SRAM Cell With Independent Double Gate Transistors", 2009 IEEE International Conference on IC Design and Technology, May 18-20, 2009, 3 pages, IEEE, Austin, TX, USA, http://ieeexplore.ieee.org/document/5166288/.

Yu et al., "Vertically Stacked Multi-Heterostructures of Layered Materials for Logic Transistors and Complementary Inverters", Nat Mater, Mar. 2013, vol. 12, No. 3, pp. 246-252, http://www.ncbi.nim.nih.gov/pmc/articles/PMC4249642.

Notification of Transmittal of the International Search Report and Written Opinion of the International Searching Authority, or the Declaration, International Application No. PCT/IB2019/058989, dated Jan. 31, 2020, 9 pages.

IBM: List of IBM Patents or Patent Applications Treated as Related (Appendix P), Feb. 5, 2020, 2 pages.

Pending U.S. Appl. No. 16/192,905, filed Nov. 16, 2018, entitled: "Integrated Circuit With Vertical Structures on Nodes of a Grid", 83 pages.

Pending U.S. Appl. No. 16/192,963, filed Nov. 16, 2018, entitled: "Microelectronic Device With a Memory Element Utilizing Stacked Vertical Devices", 84 pages.

Pending U.S. Appl. No. 16/192,992, filed Nov. 16, 2018, entitled: "Buried Conductive Layer Supplying Digital Circuits", 83 pages.

* cited by examiner

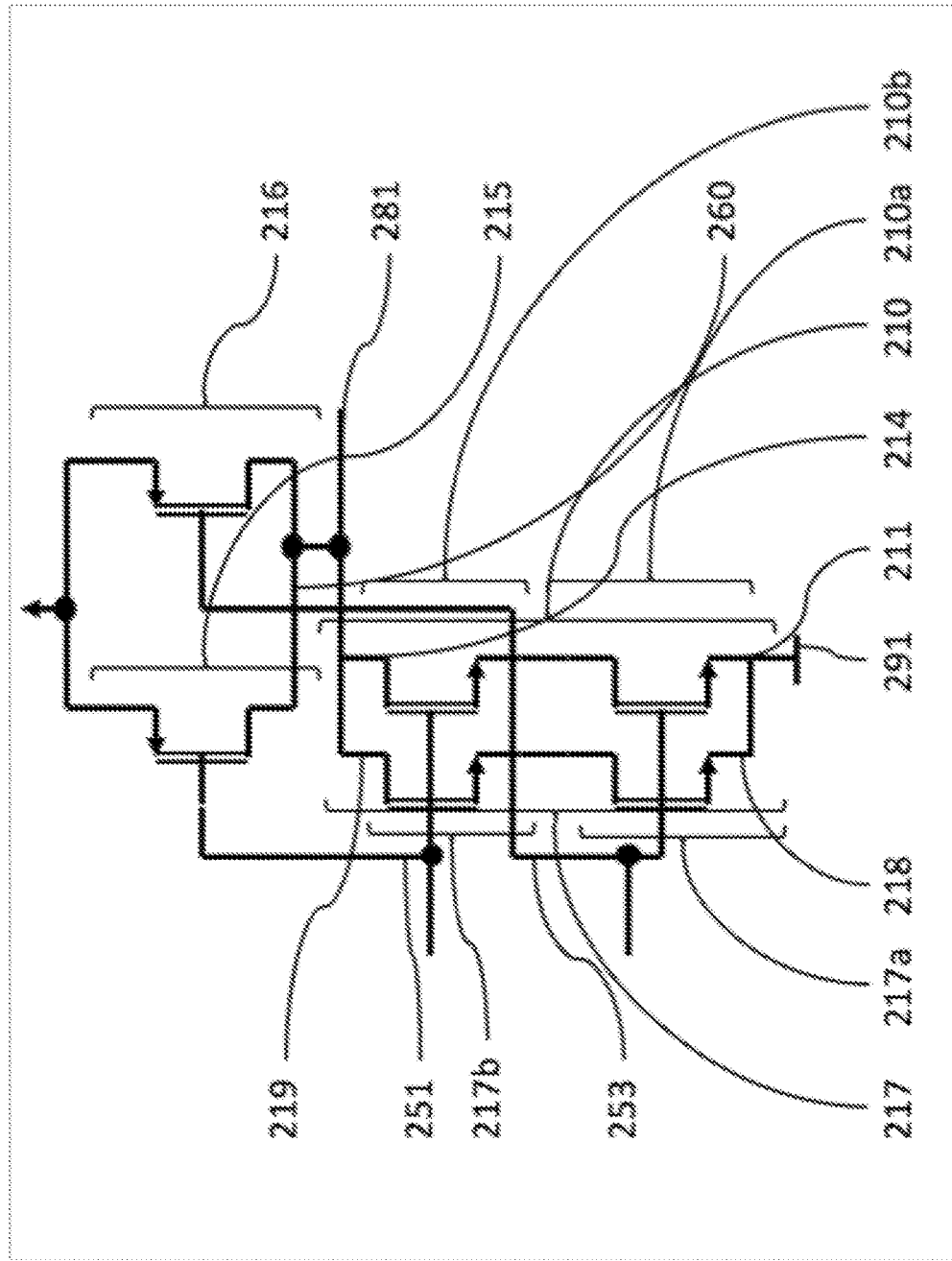

ary logic functions, such as using NAND gates and NOR gates. Signal lines are provided for transmitting data, for example, the result of a Boolean operation or data (to be) stored in a cell (e.g., a SRAM cell). The cells of the integrated circuit include field effect transistors (FETs), each including a drain region, a source region, a channel region and a gate region. Typically, the FETs are formed in the lowest layers of the integrated circuit. The layers comprising the signal lines and the power supply rails are provided in layers above the FETs.

Vertical interconnect access contacts (VIAs) are provided to connect the drain regions, the source regions and the gates of the FETs to the signal lines and the power supply rails. Each VIA leads to contact capacitances and resistances at the interface to the respective regions of the FETs, signal lines and power supply rails. Moreover, each VIA enlarges the surface area required for the manufacture of the integrated circuit. Therefore, there may be a need for reducing the amount of VIAs required for the manufacture of an integrated circuit.

Moreover, the individual VIAs may require alignment with the source regions and the gates of the FETs, and the signal lines and the power supply rails. There may be a need for facilitating the manufacture of vertical structures connecting conductors extending in different layers of the integrated circuit.

MICROELECTRONIC DEVICE UTILIZING STACKED VERTICAL DEVICES

BACKGROUND

The current disclosure relates to an integrated circuit and a method for manufacturing thereof.

Most of the time, integrated circuits include multiple adjacent layers which are deposited and structured one after the other. Power supply rails are provided to supply power to the cells of the integrated circuit. Cells of the integrated circuit may include static random access memory (SRAM) cells for storing data and logic cells for performing combinatorial logic functions, such as using NAND gates and NOR gates. Signal lines are provided for transmitting data, for example, the result of a Boolean operation or data (to be) stored in a cell (e.g., a SRAM cell). The cells of the integrated circuit include field effect transistors (FETs), each including a drain region, a source region, a channel region and a gate region. Typically, the FETs are formed in the lowest layers of the integrated circuit. The layers comprising the signal lines and the power supply rails are provided in layers above the FETs.

Vertical interconnect access contacts (VIAs) are provided to connect the drain regions, the source regions and the gates of the FETs to the signal lines and the power supply rails. Each VIA leads to contact capacitances and resistances at the interface to the respective regions of the FETs, signal lines and power supply rails. Moreover, each VIA enlarges the surface area required for the manufacture of the integrated circuit. Therefore, there may be a need for reducing the amount of VIAs required for the manufacture of an integrated circuit.

Moreover, the individual VIAs may require alignment with the source regions and the gates of the FETs, and the signal lines and the power supply rails. There may be a need for facilitating the manufacture of vertical structures connecting conductors extending in different layers of the integrated circuit.

SUMMARY

Shortcomings of the prior art are overcome, and additional advantages are provided through the provision of the integrated circuit and the method according to the independent claims. Advantageous embodiments are described in the dependent claims.

According to an embodiment, an integrated circuit is provided that includes multiple adjacent layers, where the integrated circuit includes a plurality of vertical structures, where the vertical structures extend in a vertical direction that is substantially perpendicular to the layers of the integrated circuit, where the vertical structures includes at least one vertical connection element and at least one vertical channel region, and where the vertical structures are arranged above nodes of a virtual two-dimensional regular grid. There may be nodes of the grid, on which no vertical structure is provided. The regularity of the grid may facilitate manufacturing the integrated circuit.

According an embodiment, an integrated circuit is provided. The integrated circuit includes multiple adjacent layers that include a stack of one or more field effect transistors (FETs) (e.g., a first FET and a second FET). The FETs each include a channel region. The channel regions of the FETs of the stack are electrically connected in series. The stack extends in a vertical direction that is substantially perpendicular to the layers (e.g., layers of the integrated circuit). The first FET and the second FET are of the same type.

According to an embodiment, the two opposed ends of the stack correspond to a power support end and a signal end. The power support end is connected to a power supply rail of the integrated circuit. The signal end is connected to signal lines of the integrated circuit.

According to an embodiment, the FETs of the stack are of the same type, wherein the channel regions of the FETs of the stack are electrically connected in series, wherein the two opposed ends of the stack correspond to a power support end and a signal end, and wherein the power support end is connected to a power supply rail of the integrated circuit.

According to an embodiment, several cell types (i.e., cells performing Boolean operations or storing data) within an integrated circuit require two FETs of the same type connected in series. A stack of two FETs extending in a vertical direction may facilitate wiring and routing within and between the functional cells. This may allow for a higher cell density within the integrated circuit.

According to an embodiment, the power supply rail may be provided as a buried conductive layer in a substrate of the integrated circuit. In particular, the power supply rail may be formed as a heavily doped semiconductor region. The heavily doped semiconductor region may be formed by an ion implant process. Alternatively, the heavily doped semiconductor region may be formed by a diffusion process. The low resistive power supply rail may be formed by different process options (e.g., compound methods).

According to an embodiment, the channel regions of the FETs of the stack are provided in layers between the layer comprising the power supply rail of the integrated circuit and layers comprising signal lines of the integrated circuit. Separating the layer(s) comprising signal lines and the layer(s) comprising the power supply rail(s) may substantially reduce the routing complexity of the integrated circuit. In particular, the number of VIA contacts and wire lengths may be reduced. This may allow for a higher device density of the integrated circuit and/or a reduced power consumption of the integrated circuit.

According to an embodiment, the stack may be formed by epitaxy on the heavily doped semiconductor region forming the power supply rail. The dopant concentration may be changed during epitaxy.

According to an embodiment, the channel regions of the FETs of the stack are horizontal channel regions in which charge carriers move in a direction parallel to the layers of the integrated circuit in a conductive state of the FETs. The stack may include two classical planar FETs one above the other, where the source region of one of the one classical planar FETs is electrically connected to the drain region of the other classical planar FET. Alternatively, the stack may include two FinFETs in series with a source-drain connection. The fins of the FinFETs may be provided parallel or orthogonal to each other.

According to an embodiment, the first FET and/or the second FET includes more than one vertical channel region. Providing more than one vertical channel may allow for an easier adaptation of the FET to different electrical requirements. The vertical channel regions may have substantially the same dimensions to improve process stability for manufacturing the integrated circuit. Substantially the same dimension may refer to dimensions which only fluctuate due to unavoidable deviations during the processing of the integrated circuit. The characteristic of a FET of the integrated circuit may be tuned by selecting the number of vertical channel regions. For example, a FET may include two times the amount of vertical channel regions of another FET if the FET has to provide twice the current of the other FET. Hence, the dimensions of the FETs may be quantized.

According to an embodiment, the vertical channel region has a cross section having a longitudinal axis and a transversal axis, wherein the longitudinal axis and the transversal axis have substantially the same length. For example, the vertical channel region may have a circular cross section. A circular cross section may result from exposure using a mask with quadratic features due to exposure artifacts at the corners of the quadrant. In an embodiment, the vertical channel region may have a hexagonal cross section. For example, the vertical channel region may be formed using a semiconductor having a hexagonal crystal structure. Moreover, in an embodiment, the vertical channel region may have a triangular cross section. The triangle may be an equilateral triangle. Using a vertical channel region with a cross section having a longitudinal axis and a transversal axis of substantially the same length may result in FETs having a particularly narrow channel.

According to an embodiment, the vertical channel region may be formed by epitaxial growth in a direction vertical to the layers. Epitaxial growth may allow for a precise definition of the length (e.g., vertical length) of the vertical channel region. In particular, the length of vertical channel regions of several FETs provided in the same layer of the integrated circuit may be formed to be substantially the same. Deviations in channel lengths induced by patterning processes, for example using extreme ultra violet (EUV) lithography, may be avoided.

According to an embodiment, the longitudinal axis is longer than the transversal axis. For example, the vertical channel region may have a rectangular or elliptical cross section. Vertical channel regions having an elongated cross section with a longer longitudinal axis and a shorter transversal axis, or vice versa, may allow for a wider channel for a given cross section area.

According to an embodiment, the longitudinal axis of the elongated cross section is substantially perpendicular to a longitudinal direction of the power supply rail. Such an arrangement may optimize usage of the space vertically above the power supply rail while providing narrow quantized channels.

According to an embodiment, the stack includes a common nanowire. The common nanowire includes the channel regions of the multiple FETs. A region located between the channel region of the first FET and the channel region of the second FET may at the same time form the source/drain region of the first FET and the drain/source region of the second FET.

According to an embodiment, the first FET and/or the second FET is a gate-all-around FET. Providing a gate-all-around embodiment of the channel region of the first/second FET may improve the electrical characteristics of the FET. Boundary effects at boundaries of the gate extending parallel to the channel region may be avoided.

According to an embodiment, the integrated circuit includes a second stack of two FETs. The two FETs of the second stack are of the same type. The two FETs of the second stack have a different type than the first FET and the second FET. A power end of the second stack is connected to another power supply rail.

According to an embodiment, the integrated circuit includes a SRAM cell. The SRAM cell includes a memory element and an access FET. The memory element includes a first inverter comprising a first inverter FET connected to a power supply rail. The first inverter FET is the first FET of the stack. The access FET is the second FET of the stack. The access FET is electrically connected to a bitline.

According to an embodiment, the proposed SRAM cell may require less VIAs than a classical SRAM cell. Therefore, the proposed SRAM cell may have a smaller footprint and the SRAM cell density of the integrated circuit may be increased. Furthermore, wires connecting elements of the proposed SRAM cell may be shorter, thus, reducing power consumption of the integrated circuit due to wire capacitances. The bitline may be considered as a signal line of the integrated circuit.

According to an embodiment, the integrated circuit includes two mirror-symmetrical SRAM cells. Providing mirror-symmetrical SRAM cells may allow for an increased density of the SRAM cells of the integrated circuit.

According to an embodiment, the mirror-symmetrical SRAM cells share the power supply rail. The mirrored-symmetrical SRAM cells sharing the power supply rail may allow for the provision of a wider power supply rail. Thus, voltage fluctuations along the power supply rail may be better mitigated.

According to an embodiment, the integrated circuit includes a logic cell. The logic cell includes the stack and a second pair of FETs. The second pair of FETs is of a different type than the first FET and the second FET. The two FETs of the second pair are electrically arranged in parallel. The two FETs of the second pair form vertical structures different from the stack.

According to an embodiment, a gate of one FET of the stack and a gate of one FET of the second pair are connected to each other and correspond to a first input of the logic cell. The gate of the FET of the stack and the gate of the one FET of the second pair extend in the same layer within the layered structure of the integrated circuit. In an embodiment, the gate of one FET of the stack and the gate of the one FET of the second pair may be formed as one piece.

According to an embodiment, the gate of one FET of the stack and the gate of one FET of the second pair are connected to each other and correspond to a second input of the logic cell. The gate of the one FET of the stack and the gate of the one FET of the second pair extend in different layers of the layer structure of the integrated circuit.

According to an embodiment, the power supply rails extend in at least one layer located at one first end of the stack and/or the vertical structure. Signal interconnect conductors extend in a layer located at a second, opposite end of the stack or vertical structure.

According to an embodiment, the logic cell is a NAND gate or a NOR gate.

According to an embodiment, the integrated circuit includes more than one cell selected from the group of SRAM cells and logic cells described herein, wherein the selected cells share at least one power supply rail.

According to an embodiment, the selected cells share one of the VDD power supply rail and the ground power supply rail and use a different power supply rail for the further potential.

According to an embodiment, the selected cells share both power supply rails.

According to an embodiment, there may be nodes of the grid, on which no vertical structure is provided. The regularity of the grid may facilitate manufacturing the integrated circuit.

According to an embodiment, a longitudinal spacing between two nodes of the grid in a longitudinal direction is equal to a transversal spacing between two nodes of the grid in a transversal direction, wherein the longitudinal direction is perpendicular to the transversal direction. In particular, the grid may correspond to a checker-board.

According to an embodiment, a longitudinal spacing between two nodes of the grid in a longitudinal direction is different from the transversal spacing between two nodes of the grid in a transversal direction, wherein the longitudinal direction is perpendicular to the transversal direction. Doing so allows for a better insulation between two power supply rails providing different voltages if the power supply rails extend along a transversal or longitudinal direction of the grid. In particular, the differing longitudinal and transversal spacing may reduce the amount of leakage currents and/or unintentional capacitances.

According to an embodiment, the grid has a hexagonal pattern. A hexagonal pattern may allow for a particular dense provision of the vertical structures.

An embodiment may include a microelectronic device. The microelectronic device may include a first pair of transistors stacked vertically and connected in series. Each of the first pair of transistors are of the same type. The microelectronic device may include a second pair of transistors connected in parallel. The second pair of transistors being a different type than the first pair of transistors. The first pair of transistors and the second pair of transistors are arranged substantially perpendicular to the plurality of layers.

An embodiment may include a microelectronic device. The microelectronic device may include a first pair of transistors stacked vertically and connected in series. Each of the first pair of transistors are of the same type. The microelectronic device may include a second pair of transistors connected in parallel. The second pair of transistors being a different type than the first pair of transistors. The first pair of transistors and the second pair of transistors are arranged substantially perpendicular to the plurality of layers. A gate of one transistor of the first pair of transistors and a gate of one transistor of the second pair of transistors are connected to each other and correspond to a first input of the microelectronic device. The gate of the one transistor of the first pair of transistors and the gate of the one transistor of the second pair of transistors are arranged in the same layer of the microelectronic device. A gate of one transistor of the first pair of transistors and a gate of one transistor of the second pair of transistors are connected to each other and correspond to a second input of the microelectronic device. The gate of the one transistor of the first pair of transistors and the gate of the one transistor of the second pair of transistors are arranged in different layers of the microelectronic device.

An embodiment may include a method of forming a microelectronic device. The method may include forming a first pair of transistors stacked vertically and connected in series. Each of the first pair of transistors are of the same type. The method may include forming a second pair of transistors connected in parallel. The second pair of transistors being a different type than the first pair of transistors. The first pair of transistors and the second pair of transistors are formed substantially perpendicular to the plurality of layers.

An embodiment may include a method of forming a microelectronic device. The method may include forming a first pair of transistors stacked vertically and connected in series. Each of the first pair of transistors are of the same type. The method may include forming a second pair of transistors connected in parallel. The second pair of transistors being a different type than the first pair of transistors. The first pair of transistors and the second pair of transistors are formed substantially perpendicular to the plurality of layers. A gate of one transistor of the first pair of transistors and a gate of one transistor of the second pair of transistors are connected to each other and correspond to a first input of the microelectronic device. The gate of the one transistor of the first pair of transistors and the gate of the one transistor of the second pair of transistors are arranged in the same layer of the microelectronic device. A gate of one transistor of the first pair of transistors and a gate of one transistor of the second pair of transistors are connected to each other and correspond to a second input of the microelectronic device. The gate of the one transistor of the first pair of transistors and the gate of the one transistor of the second pair of transistors are arranged in different layers of the microelectronic device.

In particular, there is provided a method for manufacturing an integrated circuit comprising multiple adjacent layers with any one of the features mentioned before. Concerning advantageous effects of the proposed method, reference is made to the description of the embodiments of the integrated circuit described in this disclosure.

Additional features and advantages are realized through the techniques disclosed herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent through the following detailed description taken in conjunction with the accompanying drawings in which:

FIGS. 1a-6a show circuit diagrams with elements of a NAND gate;

FIGS. 1b-6b show the physical structure of the elements shown in FIGS. 1a-6a;

FIG. 7a shows a circuit diagram of a balanced NAND gate;

FIG. 7b shows the physical structure of the balanced NAND gate of FIG. 7a;

FIGS. 8a-13a show a circuit diagrams with element of a NOR gate;

FIGS. 8b-13b show the physical structure of the elements shown in FIGS. 8a-13a;

FIGS. 14a-20a show circuit diagrams with elements of a SRAM cell;

FIGS. 14b-20b show the physical structure of the elements shown in FIGS. 14a-20a;

DETAILED DESCRIPTION

Figure 1A:
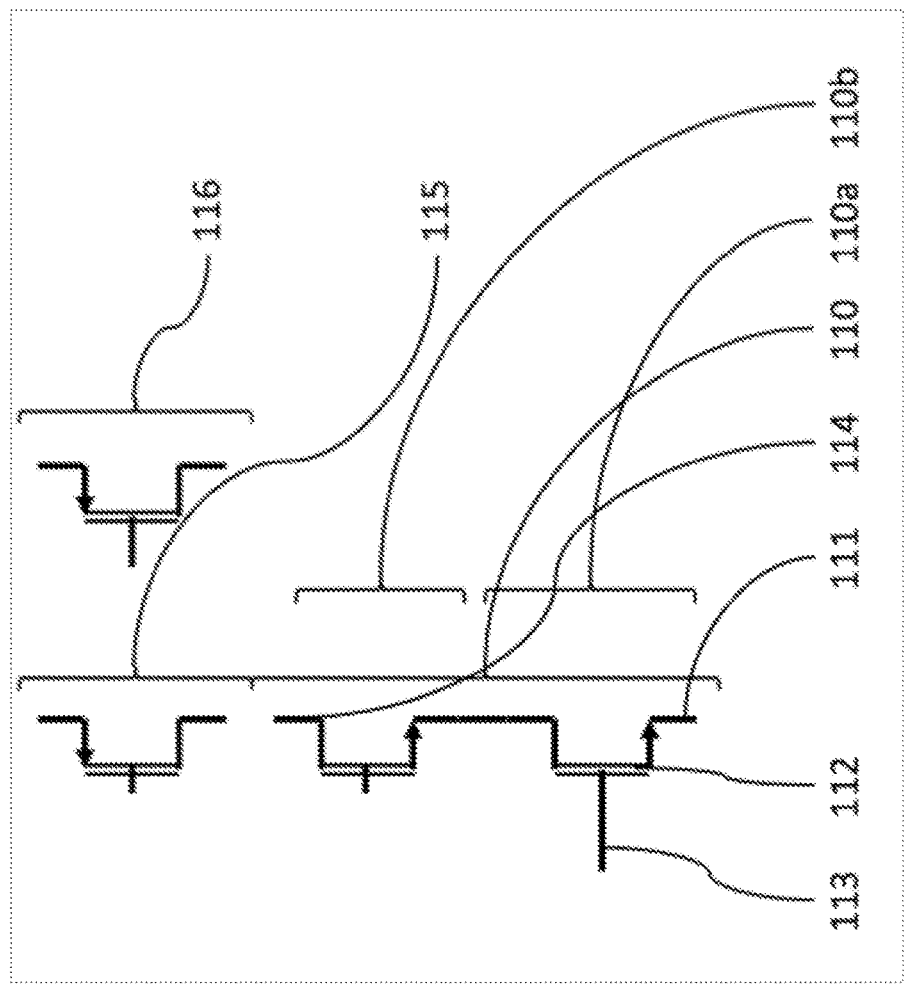

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention. Furthermore, it should be noted that while this description may refer to some components of the structure in the singular tense, more than one component may be depicted throughout the figures.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In an embodiment, substantial (and its derivatives) denote a difference by a generally accepted engineering or manufacturing tolerance for similar devices, up to, for example, 10% deviation in value or 10° deviation in angle.

In the semiconductor industry, lithography limitations may be problematic when scaling down integrated circuits. Issues that may arise include current supply system resistance impacts on performance, electromigration reliability on lower levels, reduced wireability due to wiring resources applied to power and ground and lithography impacts due to non-uniform track images.

One solution to lithography limitations may include scaling down circuits and building the devices in a vertical dimension (i.e., in a third dimension). Scaling down circuits may include using buried contacting layers below (i.e., opposite to the wiring stack) the active area supplying power and ground. For example, the ground (GND) is below the n-channel FET (nFET) area and the voltage source (VSS) is below the p-channel FET (pFET) area. An advantage may be provided by having the power and the ground supplied from opposite ends of the wiring stack. Advantages may also include an optimized density, no electromigration, more space for signal wires, accessibility to signal pins, providing uniform pitch on lower metal and vertical interconnect access (VIA) layers, and less VIAs.

An additional advantage may include avoiding interference between the signal lines and the power supply rails of the integrated circuit. This may allow for a greater flexibility for placing the logic cells of the integrated circuit.

FIGS. 1a-6a show circuit diagram elements of a NAND gate and FIGS. 1b-6b show the corresponding elements of a physical structure of an integrated circuit 100 that include multiple adjacent layers. For a better understanding, the integrated circuit 100 is shown with an increasing number of elements and in some of the figures, some elements are hidden behind other elements (i.e., can be seen from differing angles not necessarily shown in each figure). FIGS. 1a-6a correspond to FIGS. 1b-6b in terms of electrical circuit diagrams. In the following description, reference is made primarily to the physical structure as shown in FIGS. 1b-6b.

Referring to FIGS. 1a/b, the integrated circuit 100 includes a stack 110 of a first field effect transistor (FET) 110a and a second FET 110b. Both FETs 110a, 110b each include a channel region. The channel region of the first FET 110a is covered by a gate dielectric 112 and a gate 113. The channel regions of the FETs 110a and 110b of the stack 110 are electrically connected in series. The stack 110 extends in a direction V which is substantially perpendicular to the layers of the integrated circuit 100. The two FETs 110a, 110b of the stack 110 are of the same type. For example, both FETs of the stack 110 may be n-channel FET (nFETs) or both FETs of the stack 110 may be p-channel FETs (pFETs). The two opposed ends of the stack 110 of FETs 110a, 110b correspond to a power support end 111 and a signal end 114.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In an embodiment, substantial (and its derivatives) denote a difference by a generally accepted engineering or manufacturing tolerance for similar devices, up to, for example, 10% deviation in value or 10° deviation in angle.

The channel regions of the stack 110 (i.e., the channel regions of the first FET 110a and the second FET 110b) may be vertical channel regions. Vertical channel regions may refer to channel regions in which charge carriers may move in a direction substantially orthogonal to the layers of the integrated circuit 100 in a conductive state of the first FET 110a and/or second FET 110b.

The first FET 110a and the second FET 110b may include more than one vertical channel region. In the embodiment shown in FIG. 1b, the stack 110 is shown as a single column having a circular cross section. However, the stack 110 may also include a bundle of vertical columns, wherein the channel regions are each covered by a gate dielectric and the gate dielectrics are surrounded by a common gate.

Figure 1B:
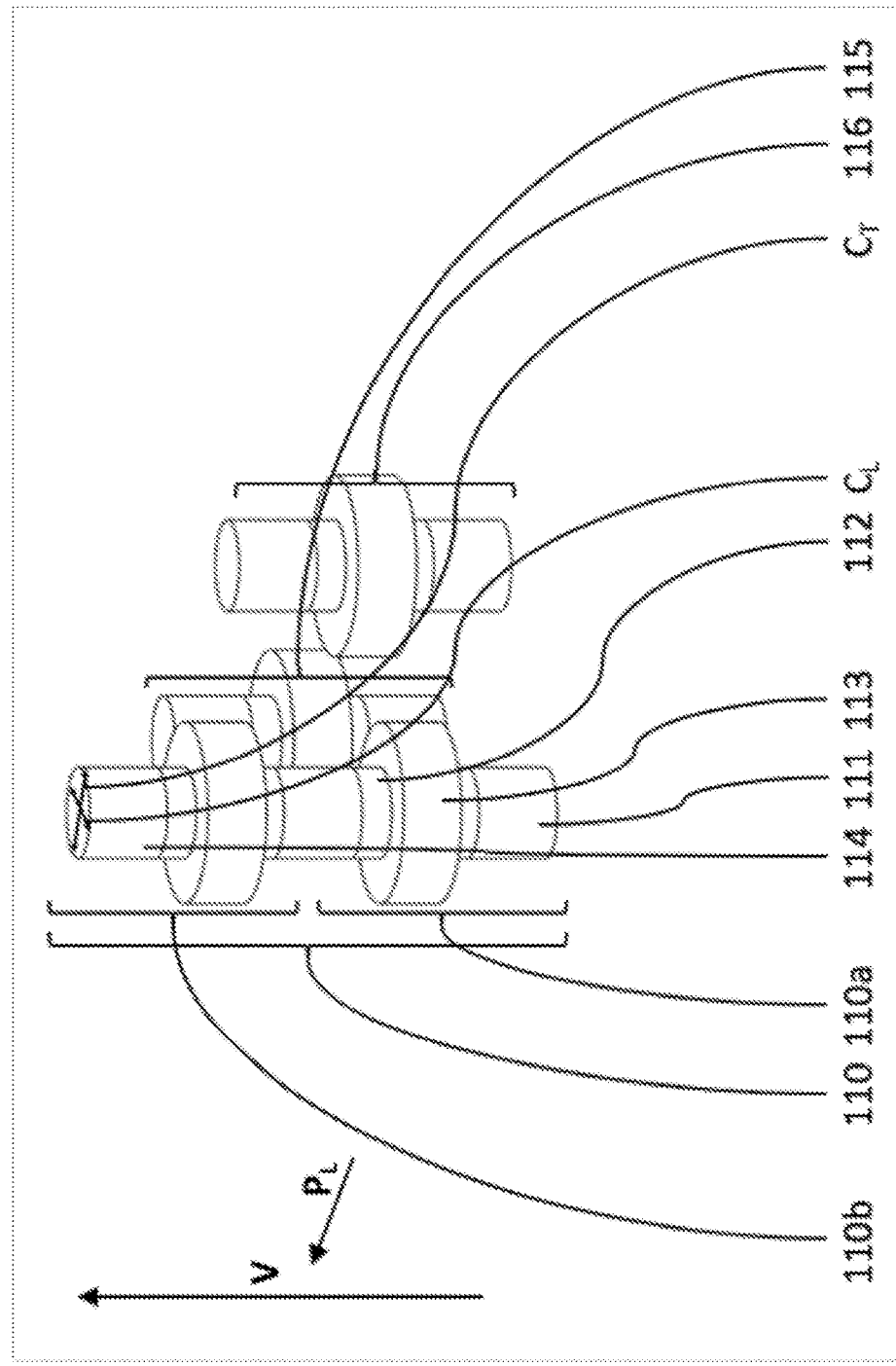

Cross sections of vertical channel regions may have a longitudinal axis $C_L$ and a transversal axis $C_T$. As shown in FIG. 1b, the longitudinal axis $C_L$ and the transversal axis $C_T$ may have substantially the same length. In the embodiment shown in FIG. 1b, the cross sections are approximately circular cross sections. Further cross sections with a longitudinal axis $C_L$ and transversal axis $C_T$ of approximately the same length may be quadratic cross sections, hexagonal cross sections and/or triangular cross sections.

Alternatively, vertical channel regions may have an elongated cross section, wherein the longitudinal axis $C_L$ is longer than the transversal axis $C_T$. For example, the cross section may have a rectangular or elliptical shape.

The stack 110 may include a common nanowire, wherein the common nanowire includes the channel regions of the FETs 110a and 110b of the stack 110. However, the stack 110 may also have a shape different from a nanowire.

An embodiment shown in FIG. 1b, the first FET 110a and the second FET 110b are both gate-all-around FETs. The gates of the FETs 110a and 110b completely surround the channel regions of the FETs 110a and 110b. This may improve the electrical characteristics of the FETs 110a, 110b.

In addition, the integrated circuit 100 includes a second pair of FETs 115, 116, which may be formed as vertical structures different from the stack 110. The FET 115 may also be formed as a different vertical structure than the FET 116. Thus, the stack 110, the FET 115 and the FET 116 may form three different columns extending in the direction V. The lower ends of the FETs 115 and 116 may be considered as power support ends.

As shown in FIGS. 1a-1b, the gate 113 of the first FET 110a and the gate of the FET 116 may be provided in the same layer of the integrated circuit 100.

Figure 2A:
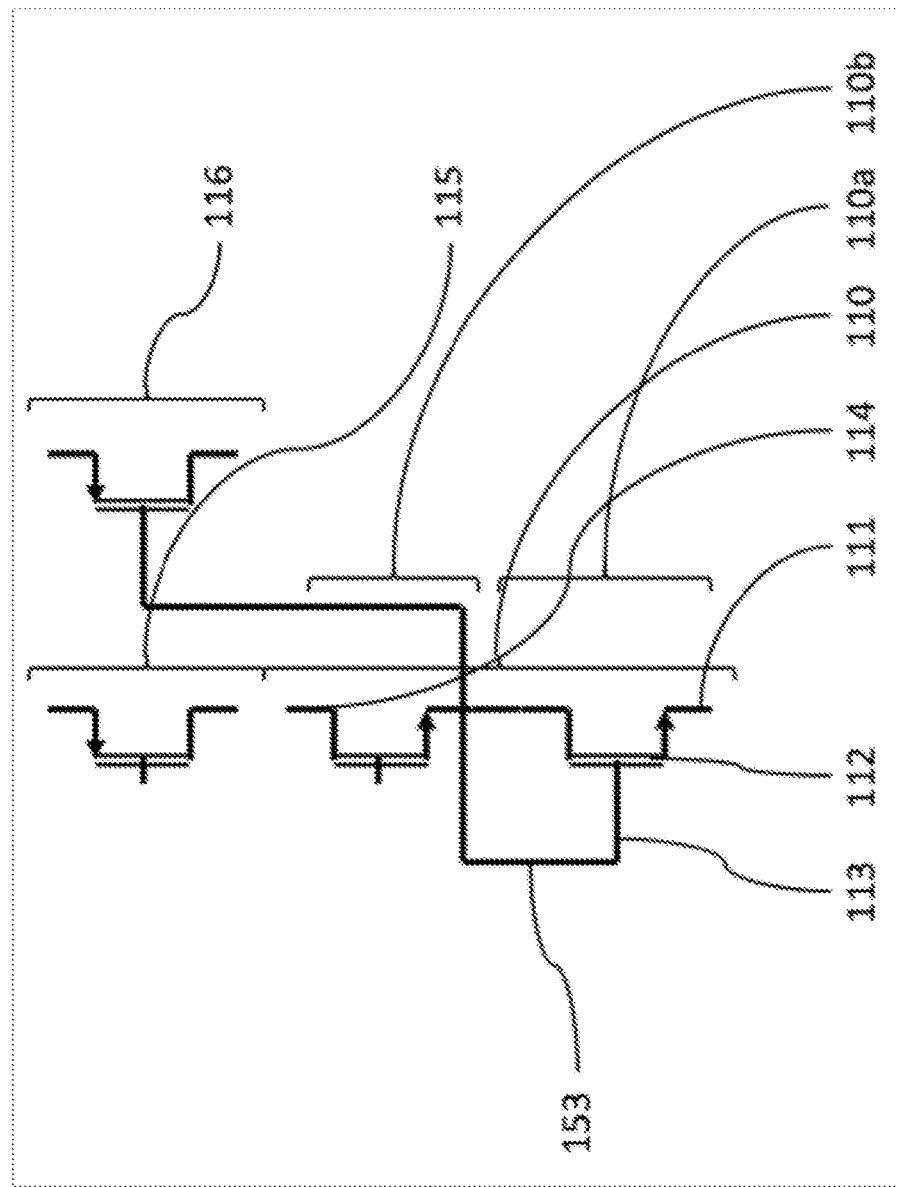
Figure 2B:
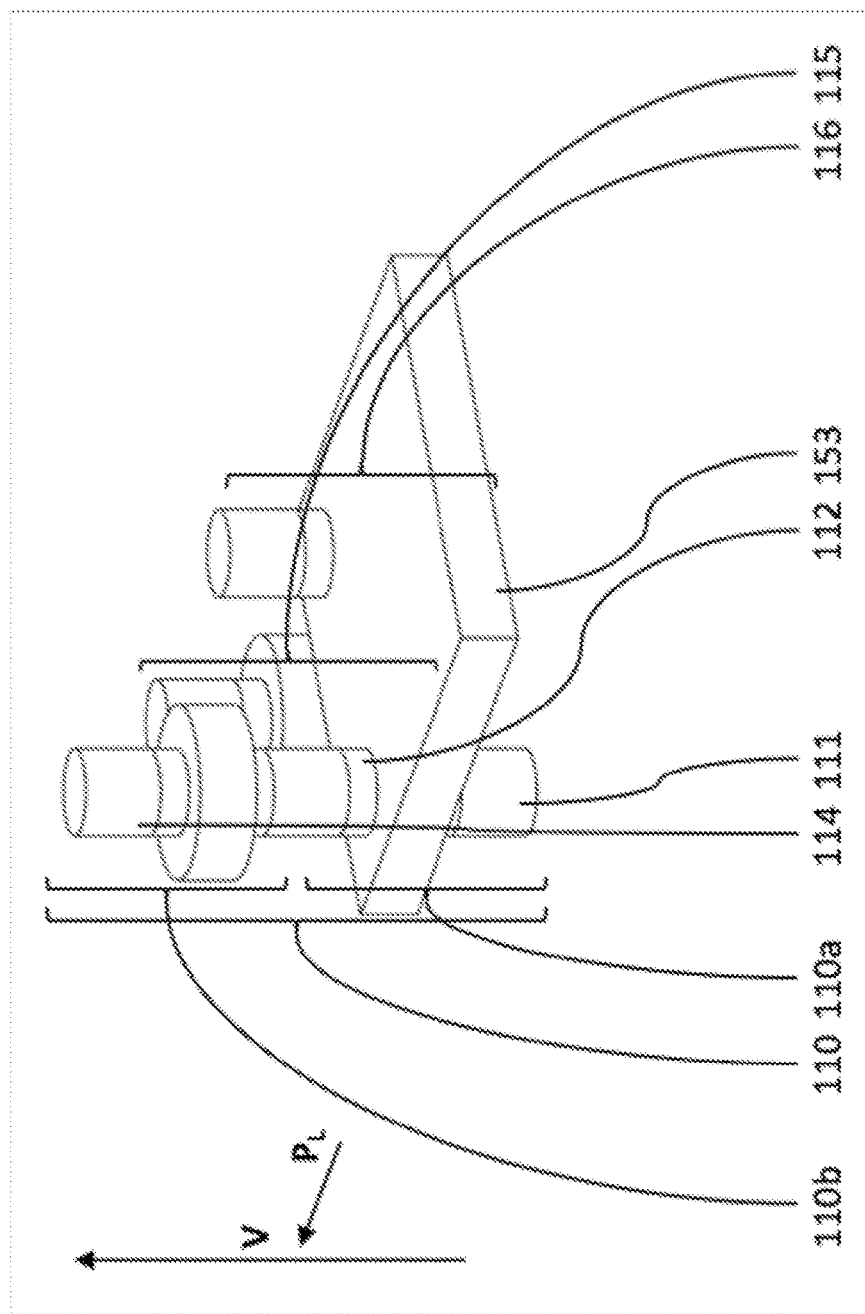

Referring now to FIGS. 2a/2b, the gate 113 of the first FET and the gate of the FET 116 may be electrically connected with a conductive element 153. The conductive element 153 may be provided in the same layer as the gate 113 of the first FET 110a and the gate of the FET 116. In particular, the gate 113 of the first FET 110a, the conductive element 153 and the gate of the FET 116 may be formed as one piece of a single material. Alternatively, the gate 113 of the first FET 110a and the gate of the FET 116 may be formed of different materials. For example, the material of the gate of the first FET 110a and the gate of the FET 116 may be selected to obtain a certain threshold voltage of the first FET 110a and the FET 116. The material of the conductive element 153 may be selected to have a particularly low resistivity.

Figure 3A:
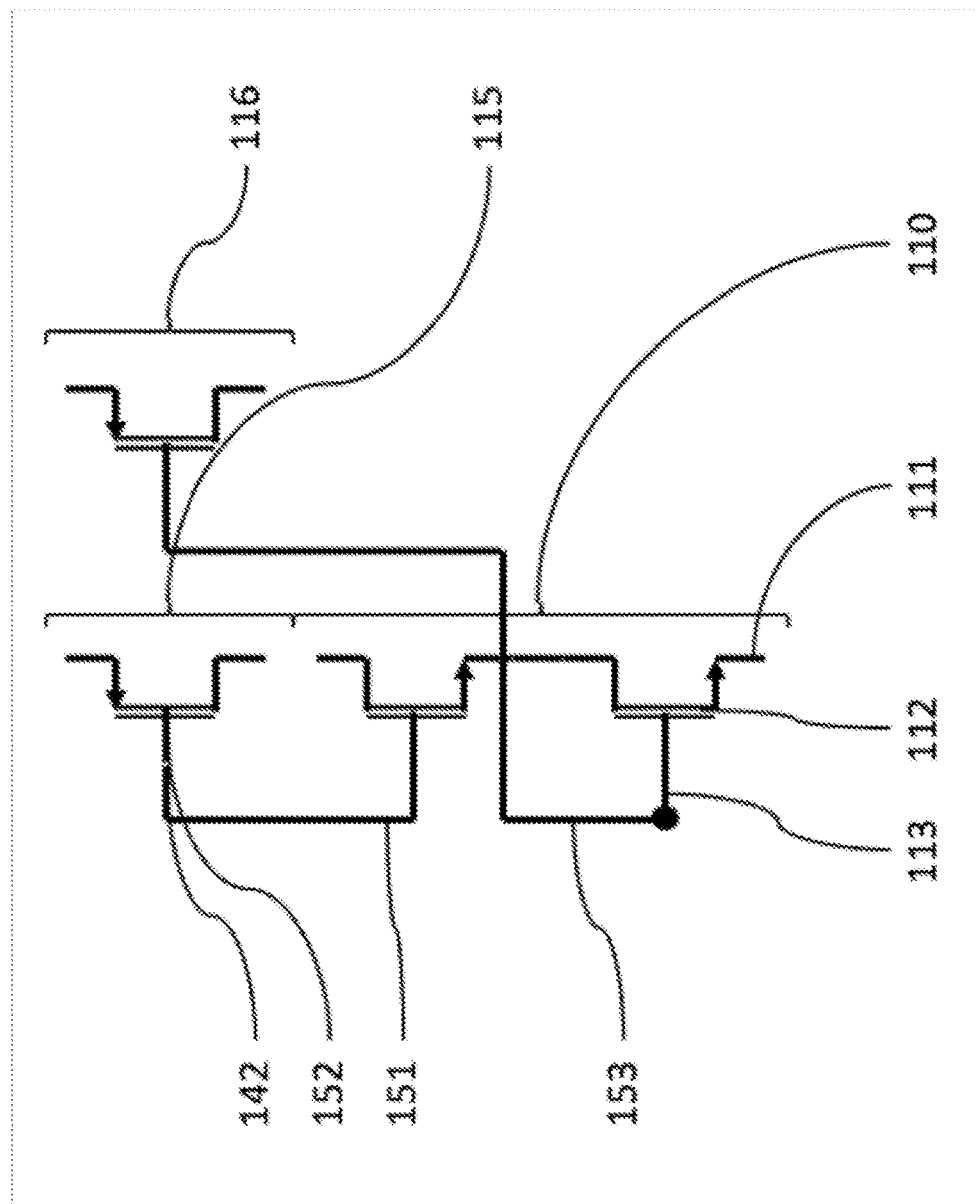
Figure 3B:
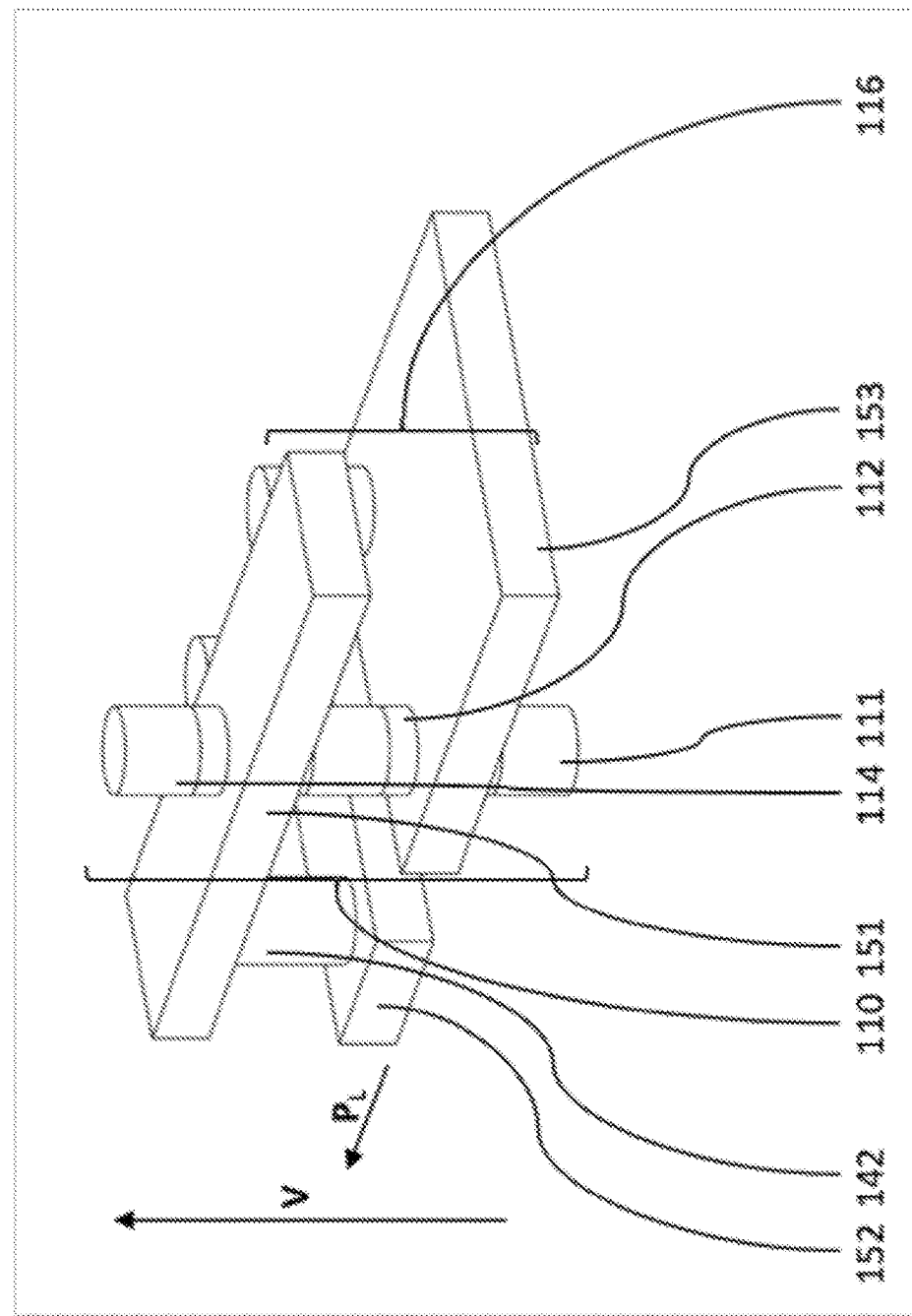

Referring now to FIGS. 3a/3b, the gate of the FET 115 may be electrically connected to the gate of the second FET 110b with conductive elements 151, 152. Therefore, the integrated circuit 100 may include a conductive element 151 extending in the same layer as the gate of the second FET 110b. The conductive element 151 and the gate of the second FET 110b may be formed as one piece. This may facilitate manufacturing the integrated circuit 100. They may also be formed of different materials as explained with respect to gate 113 and conductive element 153 above. Another conductive element 152 may be provided in the same layer as the gate of the FET 115. Said layer may correspond to the layer in which the gate 113 of the first FET 110a, the gate of the FET 116 and the conductive element 153 are formed.

The gate of the FET 115 and the conductive element 152 may be formed as one piece. They may also be formed of different materials as explained with respect to gate 113 and conductive element 153 above. The vertical conductive element 142 may electrically connect the conductive element 151 and the conductive element 152.

Vertical conductive elements of the integrated circuits disclosed in this specification may be formed of a metal. Metals may have a particularly high conductivity. Moreover, metals may facilitate heat distribution within the integrated circuit. Thermal hotspots may be avoided. Alternatively, vertical conductive elements of the integrated circuit may be formed of a semiconductor material. Vertical conductive elements may be formed of the same semiconductor material as a source region, a channel region or a drain region of a FET of the integrated circuit. Using the same semiconductor material for the vertical conductive elements and the FETs may avoid contamination of the FETs with materials which could deteriorate the electrical characteristic of the FETs. Moreover, it may be possible to use the same process for forming the vertical conductive elements and the vertical channel regions of the FETs. Physical dimensions (e.g., a cross section, a width, a length or a height) of the vertical conductive elements and the FETs may be the same. Patterning during manufacture of the integrated circuit may be easier if the number of features having different dimensions is reduced.

Figure 4A:
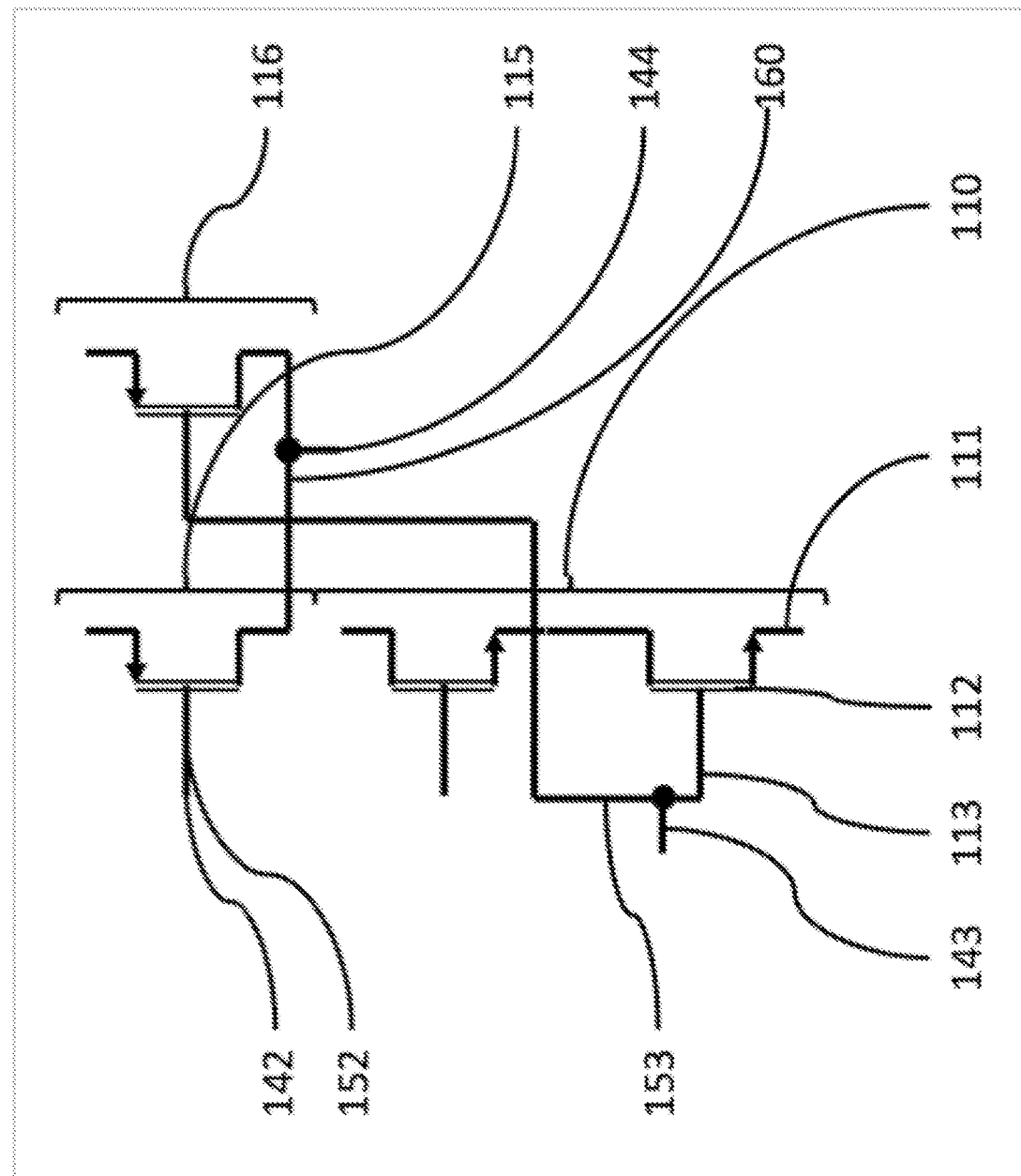
Figure 4B:
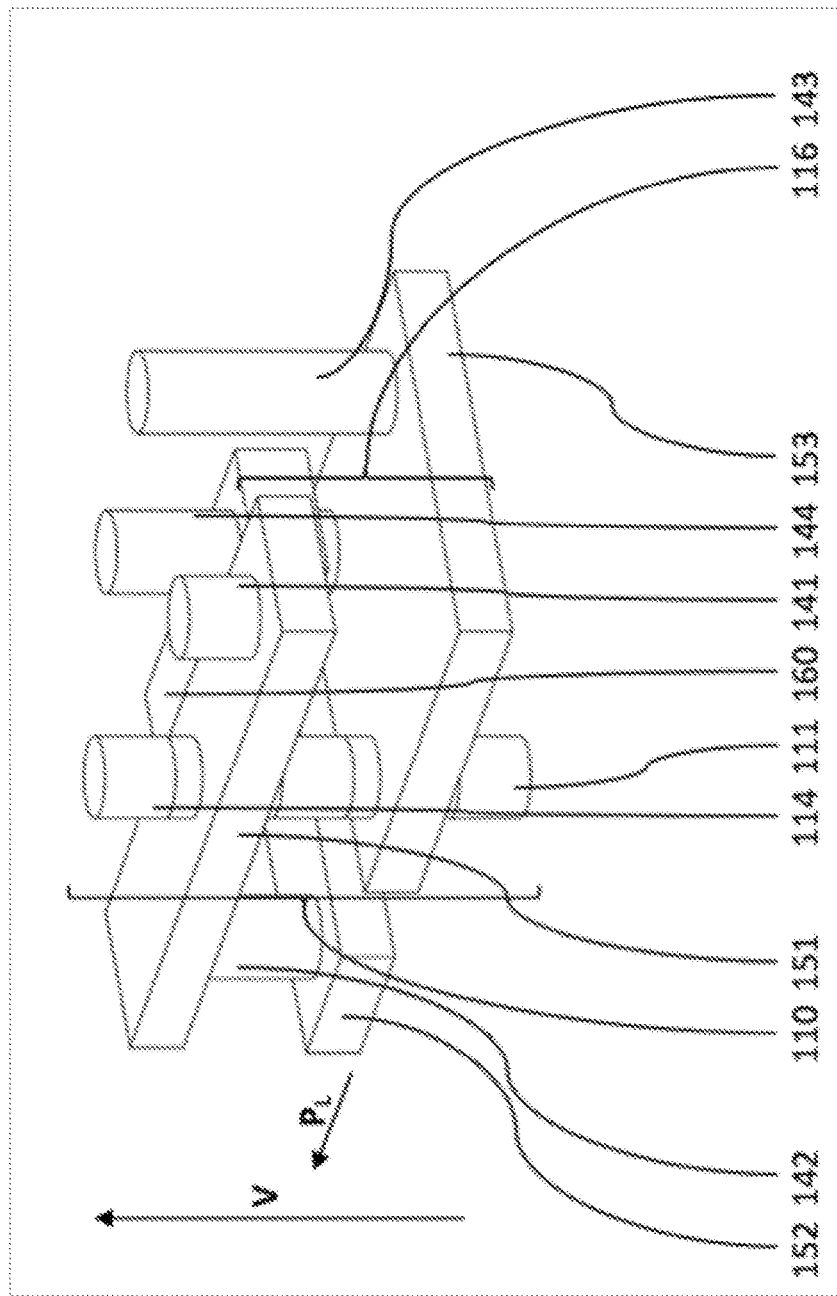

Referring now to FIGS. 4a/b, the integrated circuit 100 may include an internal connection element 160 connecting the FET 115 and the FET 116. The internal connection element 160 may extend in a single layer of the integrated circuit 100. Charge carriers may move in the internal connection element 160 substantially parallel to the layers of the integrated circuit 100. The internal connection element 160 electrically connects the upper ends of the FETs 115 and 116.

Internal connection elements of the integrated circuits disclosed in this specification may be formed of a metal. Alternatively, the internal connection elements of the integrated circuit may be formed of a semiconductor material. In particular, the internal connection elements of the integrated circuit may be formed of the same semiconductor material as the material of source and/or drain regions of the FETs of the integrated circuit. This may avoid contact resistances between the source and/or drain regions of the FETs of the integrated circuit and the internal connection elements.

The integrated circuit 100 may further include a vertical conductive element 143 and a vertical conductive element 144. The vertical conductive element 143 may be electrically connected with the conductive element 153. The vertical conductive element 143 may extend from the conductive element 153 in an upward direction. The vertical conductive element 144 may be electrically connected with the internal connection element 160. The vertical conductive element 144 may extend from the internal connection element 160 in an upward direction.

Figure 5A:
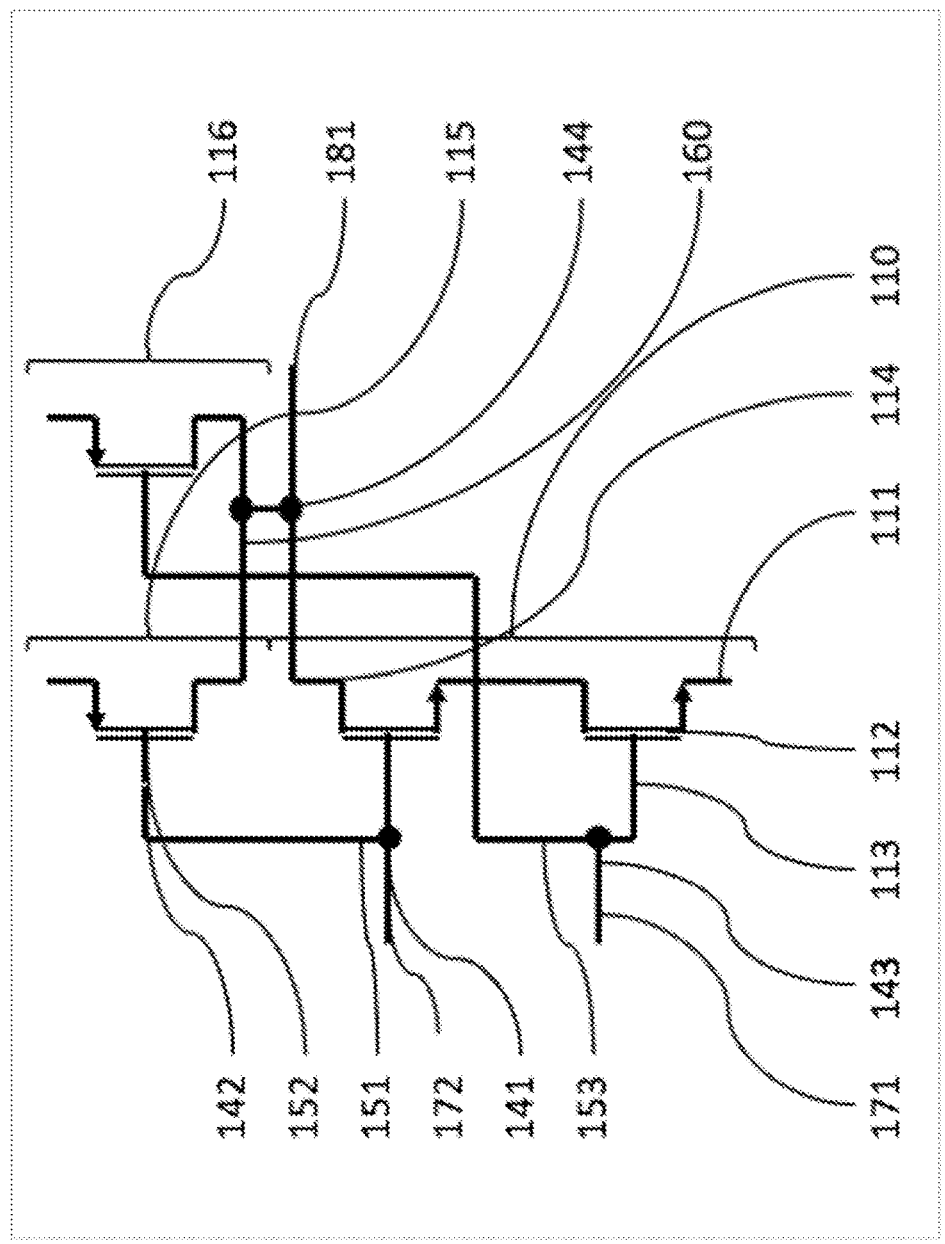
Figure 5B:
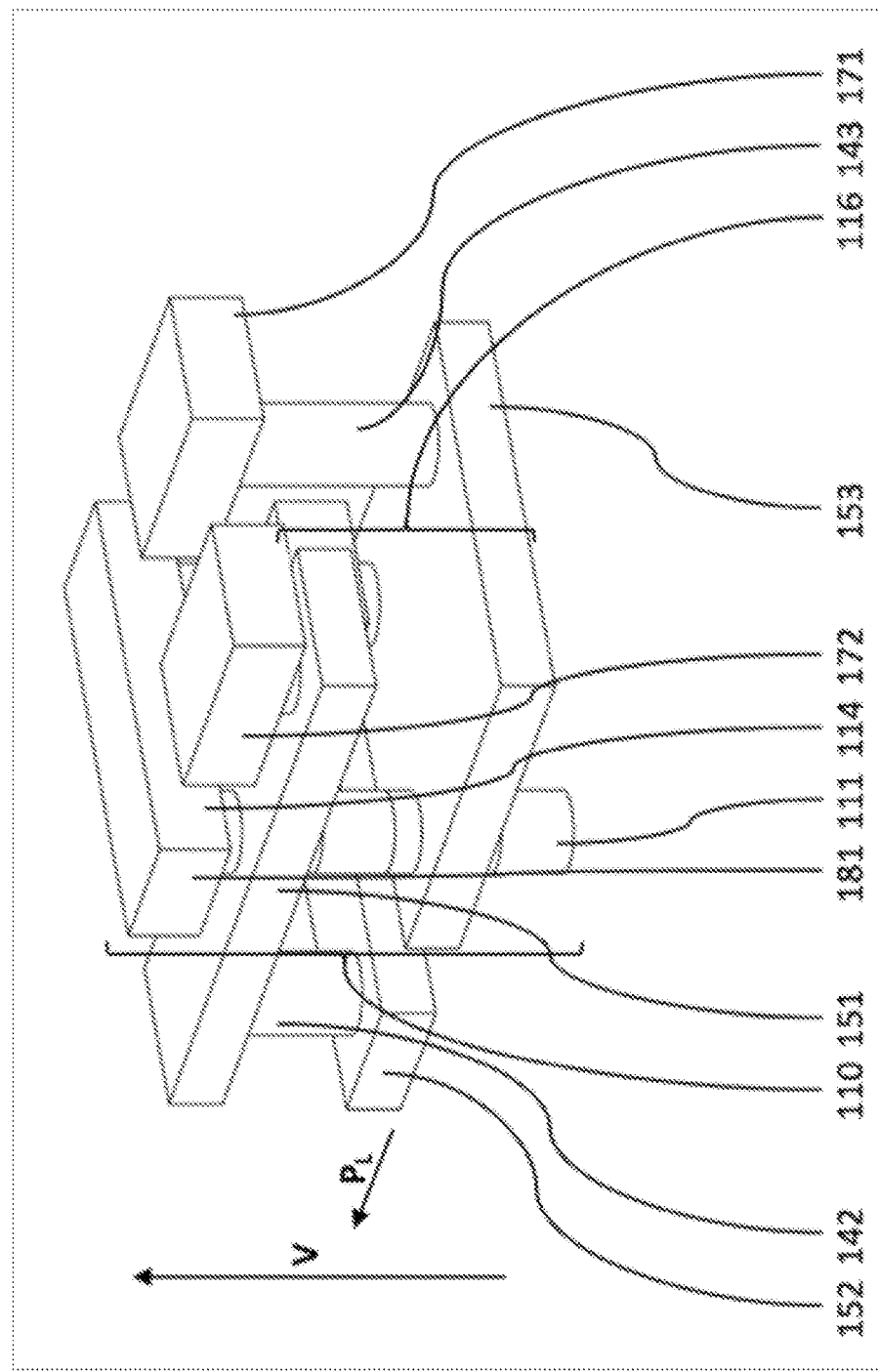

Referring now to FIGS. 5a/5b, the vertical conductive element 143 may be electrically connected to a first input 171 of the integrated circuit 100. Thus, a gate of the FET 110a (FIGS. 1-2) of the stack 110 (FIGS. 1-2) and a gate of the FET 116 (FIGS. 1-3) are connected to each other and may correspond to a first input 171 of the integrated circuit 100.

Moreover, the gate of the FET 110b (FIGS. 1-2) and the gate of the FET 115 (FIGS. 1-2) extend in different layers of in the integrated circuit 100. The gate of the second FET 110b and the gate of the FET 115 are connected to each other via the conductive element 151, the vertical conductive element 142 and the conductive element 152 and further via an additional vertical conductive element 141 (FIG. 4) to a second input 172 of the integrated circuit 100. An end of the stack 110 may correspond to a signal end 114. The signal end 114 of the stack 110 may be connected to an output 181 of the integrated circuit 100. The vertical conductive element 144 (FIG. 4) may provide an electrical connection from the internal connection element 160 (FIG. 4) to the output 181 of integrated circuit 100.

Figure 6A:
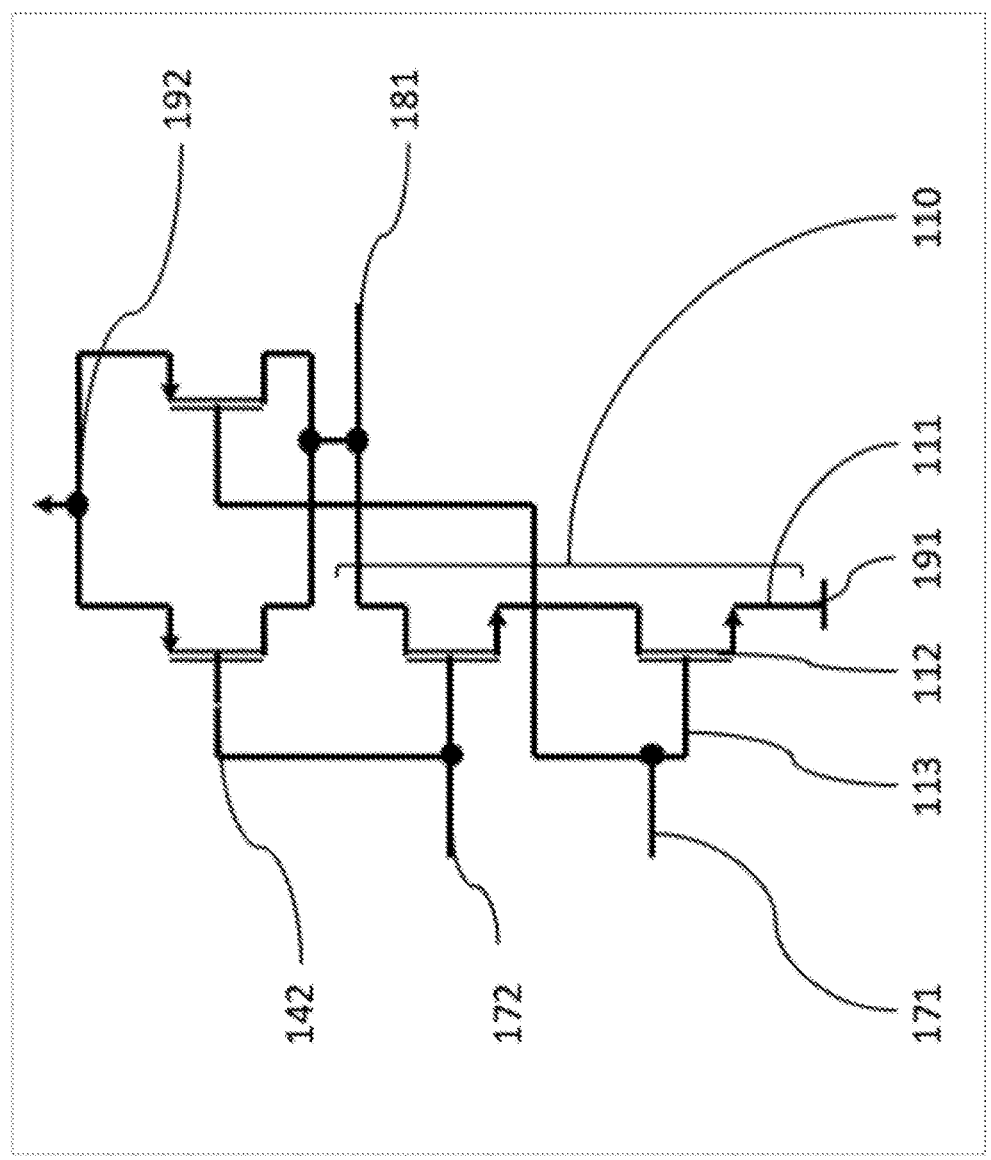
Figure 6B:
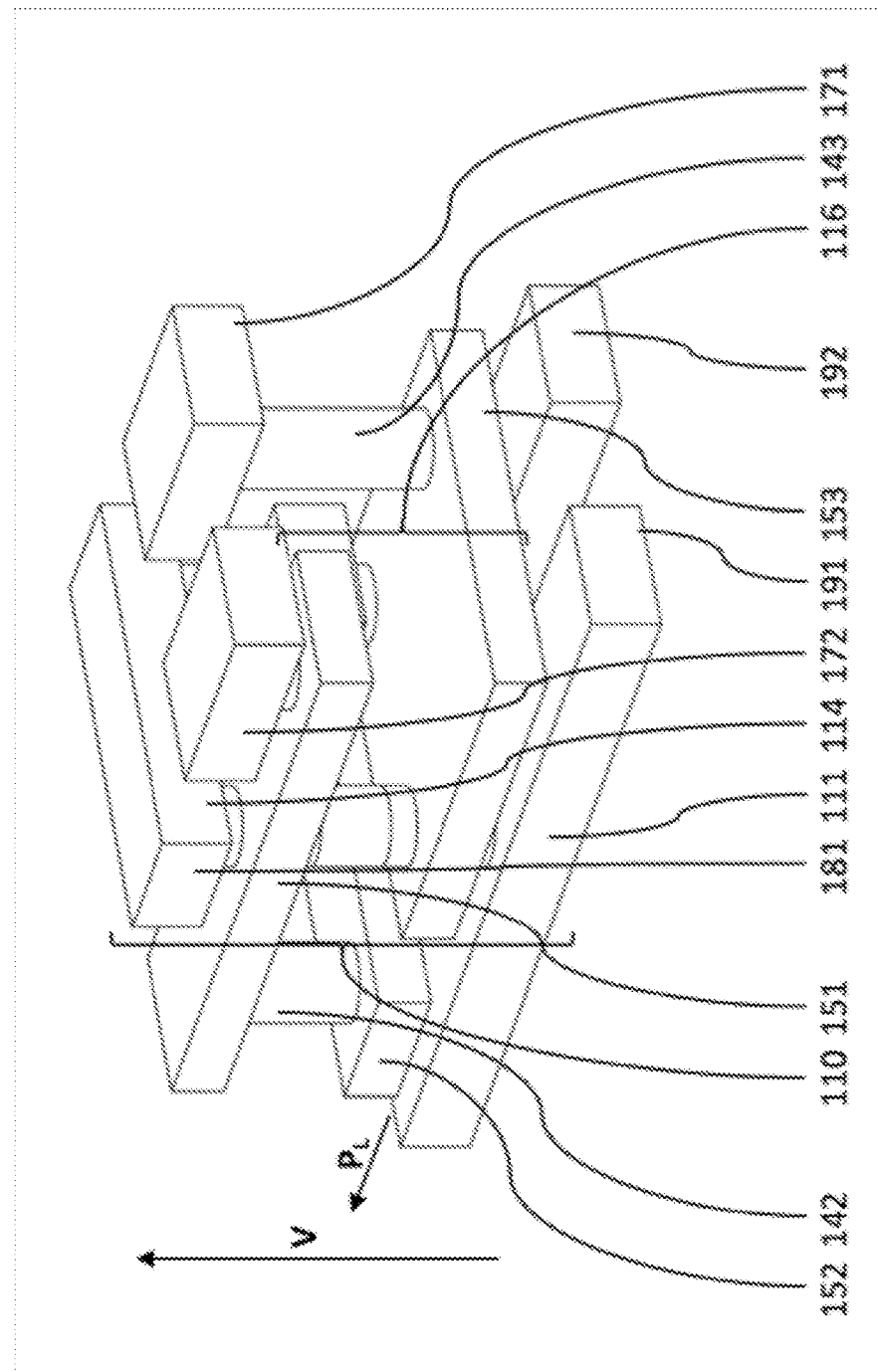

Referring now to FIGS. 6a/6b, the power support end 111 of the stack 110 may be connected to a power supply rail 191 of the integrated circuit 100. A power support end of the FET 115 (FIGS. 1-2) and a power support end of the FET 116 (FIGS. 1-2) may be both connected to another power supply rail 192. The power supply rail 191 and the power supply rail 192 may be provided parallel to each other.

The electrically connected elements of the integrated circuit 100 may be considered a logical cell 100, in particular a NAND gate 100 with inputs 171 and 172 and an output 181. The inputs 171 and 172 and the output 181 may be considered as signal lines of the integrated circuit. Additional local and global signal wiring layers on top of the shown input and output layer may exist.

As shown in the integrated circuit 100 (i.e., FIGS. 1b-6b) the channel regions of the FETs 110a, 110b, 115, 116 of the integrated circuit 100 may be provided between a layer that includes the signal lines 171, 172, 181 and a layer that includes the power supply rails 191, 192. Thus, interferences between the signal lines and the power supply rails of the integrated circuit may be avoided. This may allow for a greater flexibility for placing the logic cells of the integrated circuit.

Using FETs with vertical channel regions to form the integrated circuit of FIGS. 1-6 may reduce the need for additional vertical connection elements, because the vertical channel regions already provide some electrical connections between the different layers of the integrated circuit.

The power supply rail 191 may provide a ground voltage GND and the power supply rail 192 may provide a high potential voltage VDD for driving the integrated circuit 100. The FETs 110a and 110b of the stack 110 may be nFETs and the FETs 115 and 116 may be pFETs.

FETs of the disclosed integrated circuits may be provided in regular intervals in the extension direction of the power supply rails. The distance between the FETs in the extension direction of the power supply rails and the distance between the FETs in a direction perpendicular to the extension direction of the power supply rails may be equal. Such a regular arrangement of the FETs may facilitate reliably manufacturing the integrated circuit. Moreover, a regular arrangement of FETs may allow for optimizing the density of FETs of the integrated circuit.

Figure 7B:
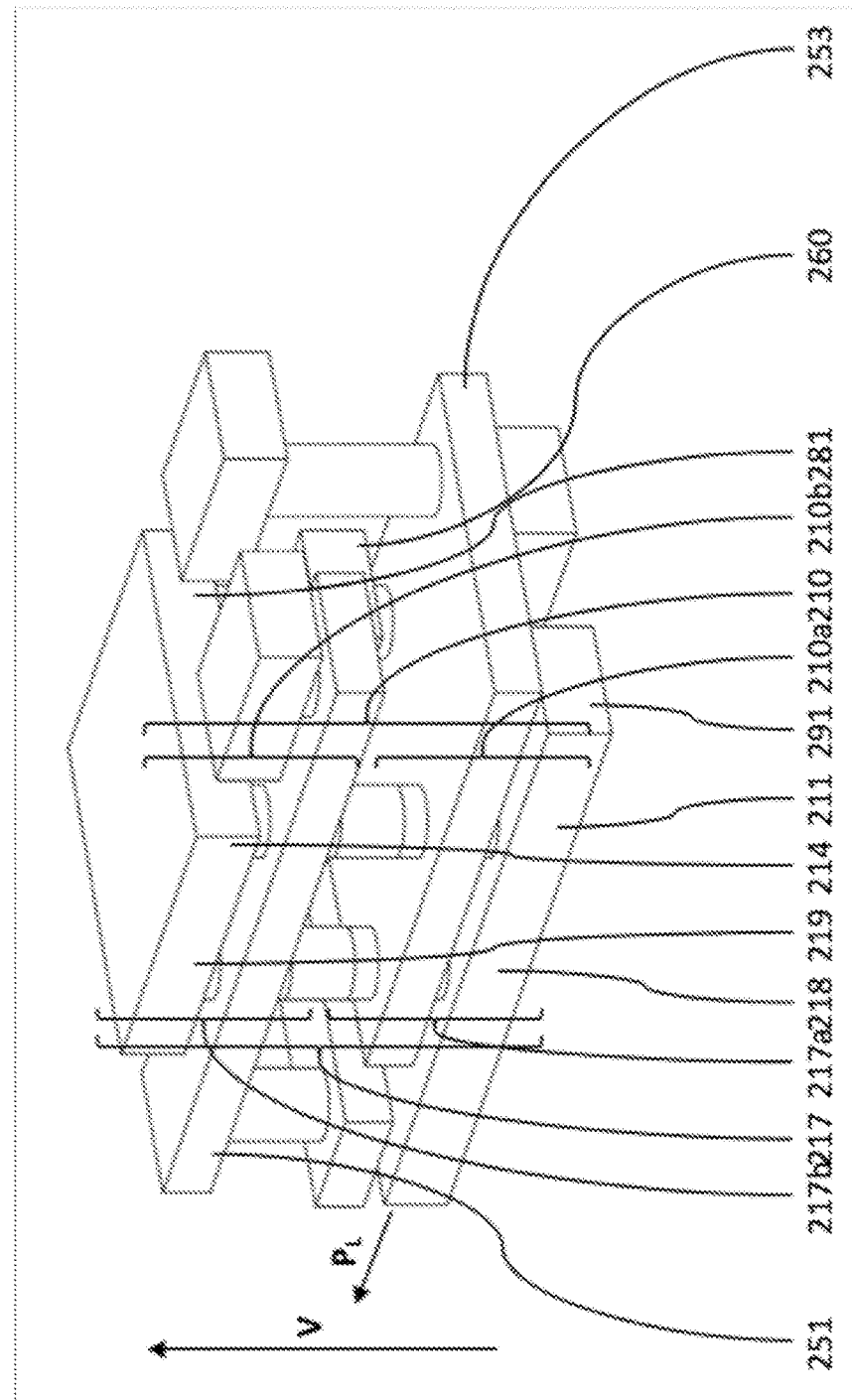
Figure 7C:
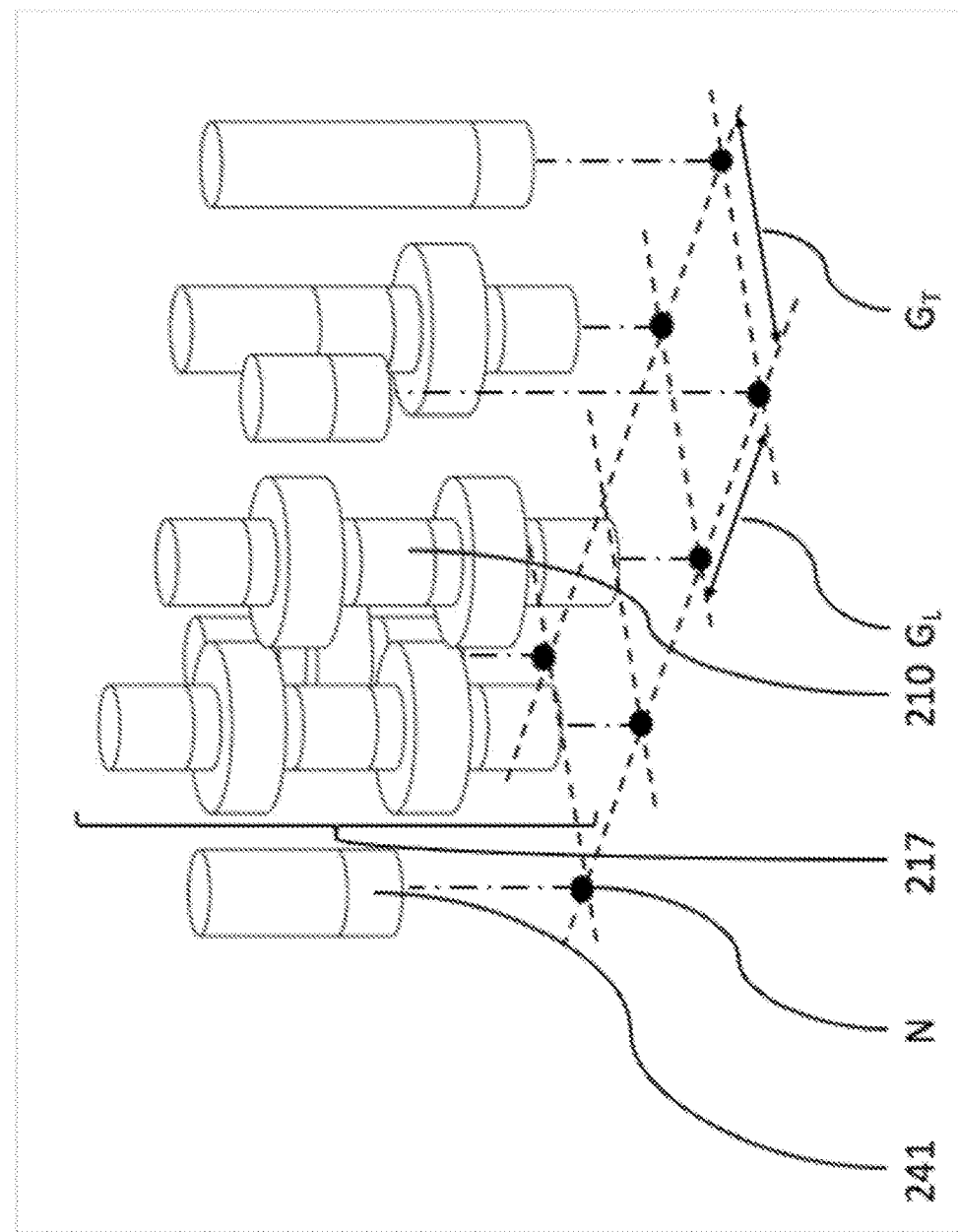
FIG. 7c shows vertical structures on nodes of a grid.

FIGS. 7a-7d shows an integrated circuit 200 that corresponds to the integrated circuit 100 described hereinbefore. FIG. 7a is a circuit diagram of a balanced NAND gate, FIG. 7b shows the physical structure of the balanced NAND gate, FIG. 7c shows vertical structures on nodes of a grid and FIG. 7d further illustrates FIG. 7c.

Referring now to FIGS. 7a, 7b, an integrated circuit 200 that includes multiple adjacent layers in accordance with an embodiment of the present invention. The integrated circuit 200 corresponds to the integrated circuit 100 described hereinbefore. In addition to a stack 210 including a first FET 210a and a second FET 210b corresponding to the first stack 110 of the integrated circuit 100, the integrated circuit 200 includes an additional stack 217 including a third FET 217a and a fourth FET 217b.

Power support ends 211 and 218 of both stacks 210 and 217 may be connected to a power supply rail 291. Signal ends 214 and 219 of boths stacks 210 and 217 may be connected to an output 281 of the integrated circuit 200. Moreover, the gate of the first FET 210a, the gate of the third FET 217a and a connection element 253 may extend in the same layer of the integrated circuit. In particular, the gate of the first FET 210a, the gate of the third FET 217a and the connection element 253 may be formed as one piece. The gate of the second FET 210b and the gate of the fourth FET 217b may also extend in a single layer together with a connection element 251.

The resistance of a stack of two FETs may be larger than the resistance of a vertical structure that may only include one FET. Thus, providing an additional stack 217 electrically connected in parallel to the stack 211 may result in an integrated circuit 200 having a more balanced characteristic compared to the integrated circuit 100. In particular, the impedance at the output 281 of the integrated circuit 200 may be less dependent on the voltage provided at the output 281 of the integrated circuit 200.

Figure 7D:
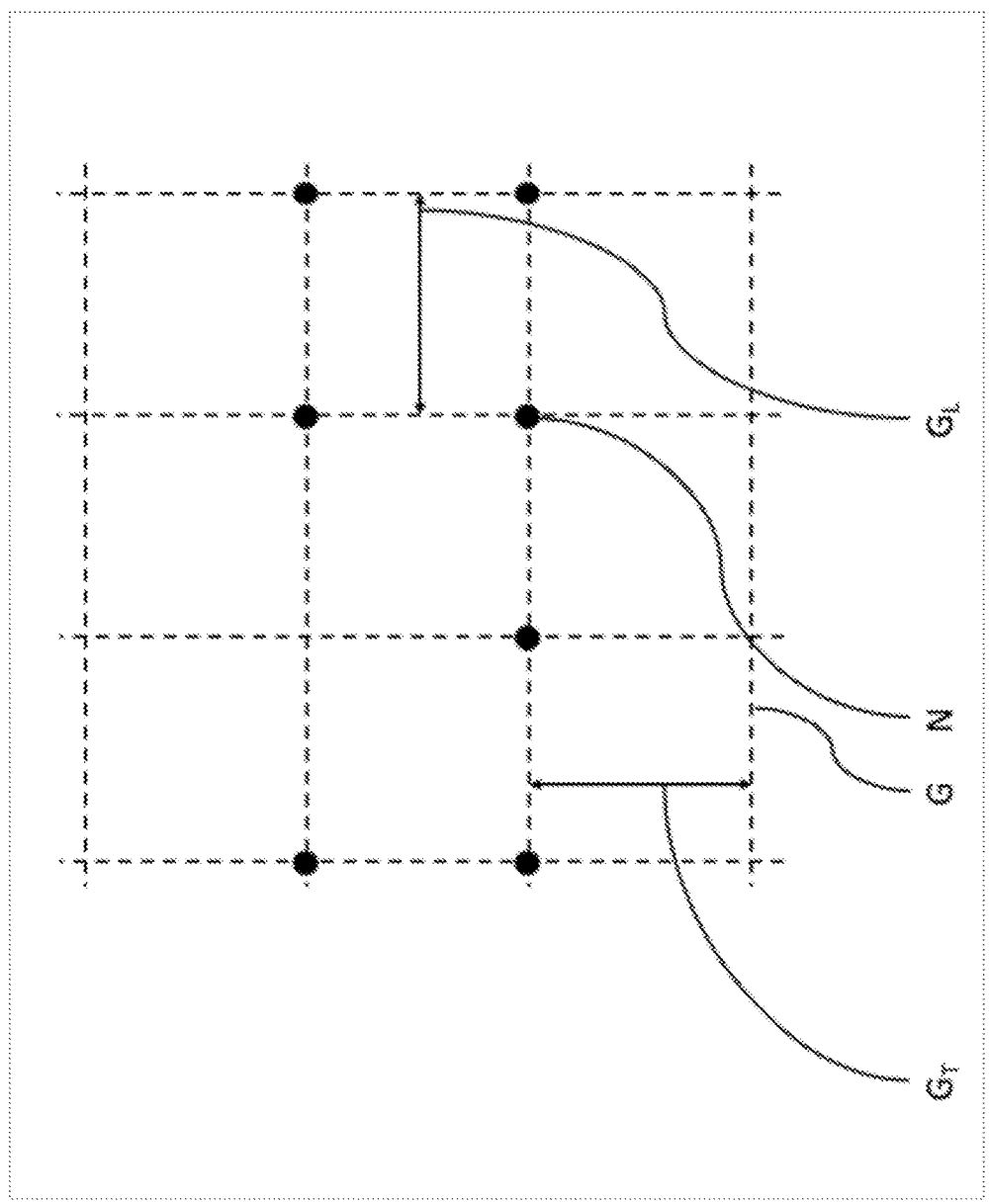
FIG. 7d further illustrates the grid of FIG. 7c.

FIGS. 7c and 7d illustrate that the vertical structures of the integrated circuit 200, in particular the vertical structures 241, 210, 217 of the integrated circuit 200, are arranged above nodes N of a virtual two-dimensional regular grid G. The grid G has a translational symmetry. Moreover, the grid G has a rotational symmetry as turning the grid by 90° leads to the very same grid. The longitudinal spacing $G_L$ between two nodes of the grid in a longitudinal direction is equal to the transversal spacing $G_T$ between two nodes of the grid in a transversal direction, wherein the longitudinal direction is perpendicular to the transversal direction.

FIGS. 8a-13a show the circuit diagram elements of a Logic NOR gate and FIGS. 8b-13b show the corresponding elements of a physical structure of an integrated circuit 300 that include multiple adjacent layers. The integrated circuit 300 is shown with an increasing number of elements. FIGS. 8a-13a correspond to FIGS. 8b-13b in terms of electrical circuit diagrams. In the following description, reference is made primarily to the physical structure as shown in FIGS. 8b-13b.

Figure 8A:
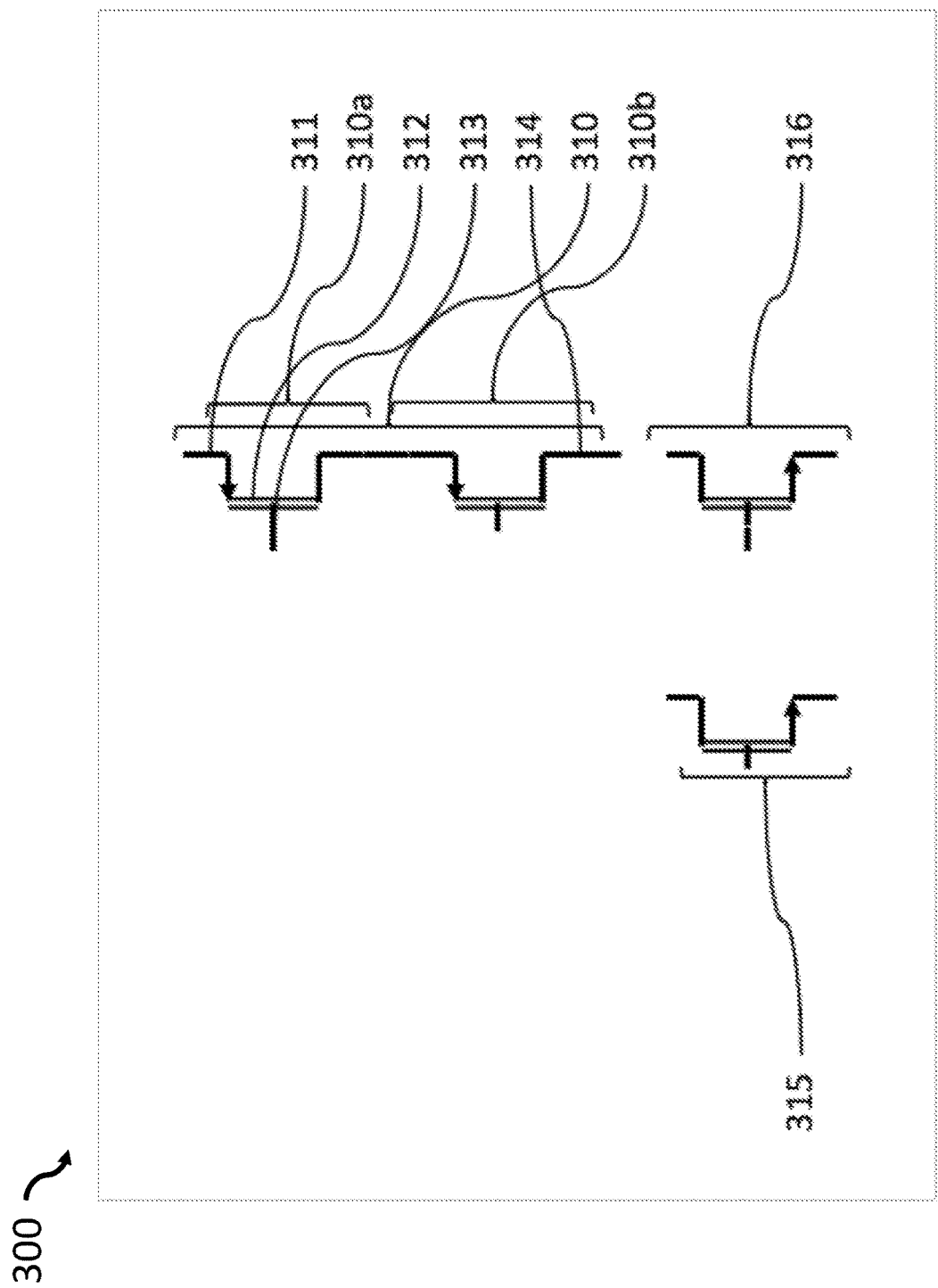
Figure 8B:
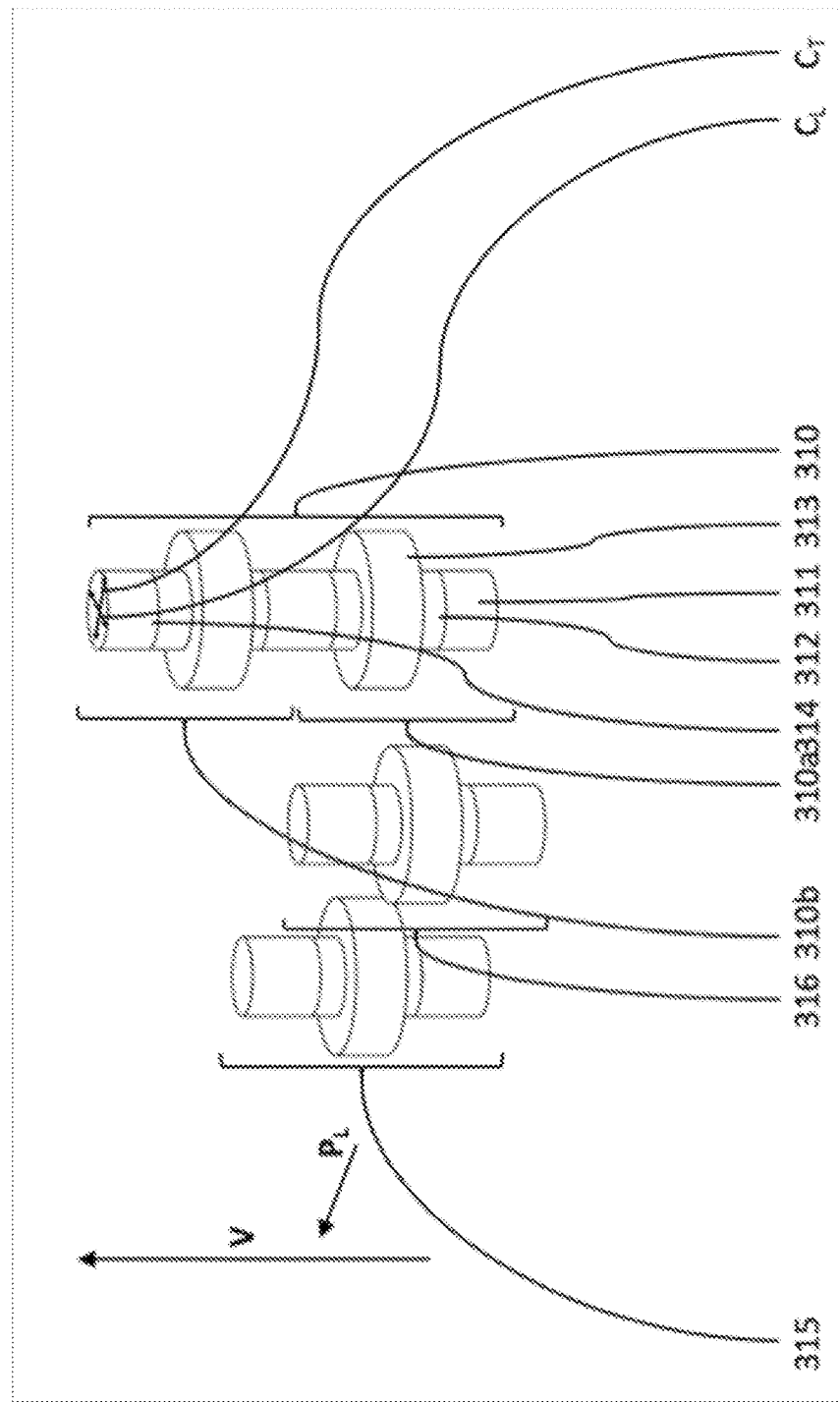

Referring now to FIG. 8b, the integrated circuit 300 includes a stack 310. The stack 310 includes a first field effect transistor (FET) 310a and a second FET 310b. The first FET 310a includes a channel region covered by a gate dielectric 312 and a gate 313. A channel region of the second FET 310b is electrically connected in series with the channel region of the first FET 310a. The first FET 310a and the second FET 310b are stacked in a direction V which is substantially perpendicular to the layers of the integrated circuit 300. The two FETs 310a and 310b are of the same type. For example, both FETs of the stack 310 may be p-channel FETs, pFETs, or both FETs 310a, 310b of the stack 310 may be n-channel FETs, nFETs. A first end of the stack 310 may be considered as power support end 311 and the other end at the opposite side as signal end 314.

Charge carriers may move in the channel regions of the first FET 310a and the second FET 310b (i.e., in the channel regions of the stack 310) in a direction, which is substantially perpendicular to the layers of the integrated circuit 300, if the channels are open (i.e., in a conductive state of the first FET 310a and the second FET 310b). Thus, the channel regions may be considered as vertical channel regions.

According to FIG. 8b, the stack 310 is shown as one pillar. The cross section of the pillar corresponds to a circle. In an alternative embodiment, the stack 310 may include several pillars each having a vertical channel region. The vertical channel regions may each be covered by a gate dielectric (e.g., a gate oxide) and the gate dielectrics may be surrounded by a common gate. Typically, the pillars will have the same cross section to facilitate manufacturing of the integrated circuit. It is also conceivable that the pillars have different cross sections to allow for a better fine tuning of the electrical characteristics of the FETs.

The vertical channel regions may have cross sections having a longitudinal axis $C_L$ and a transversal axis $C_T$. As shown in FIGS. 8b-13b, the longitudinal axis $C_L$ may be as long as the transversal axis $C_T$. Cross sections with approximately equal longitudinal axis $C_L$ and transversal axis $C_T$ may be, for example, circles, quadrats, triangles and hexagons.

In an embodiment, the longitudinal axis $C_L$ of the cross section of the vertical channel regions may be longer than the transversal axis $C_T$. Such a cross section may be called elongated cross section. Rectangles or ellipses may be examples for elongated cross sections.

The stack 310 may be formed from a common nanowire, wherein the common nanowire includes the channel regions of the FETs 310a and 310b of the stack 310. In other embodiments, the shape of the stack 310 may differ from a nanowire.

The gate of the FETs shown in FIGS. 8b-13b, in particular the first FET 310a and the second FET 310b, may be gate-all-around FETs. The gates of the FETs completely surrounded the channel regions of the FETs.

According to FIG. 8b, a second pair of FETs 315, 316 is provided in the integrated circuit 300. The FET 315 and the FET 316 may be formed as different vertical structures of the integrated circuit 310. The FETs 315, 316 may also each be formed as vertical structures different from the stack 310. A single layer of the integrated circuit 300 includes both the gate 313 of the first FET 310a and the gate of the FET 316.

Figure 9A:
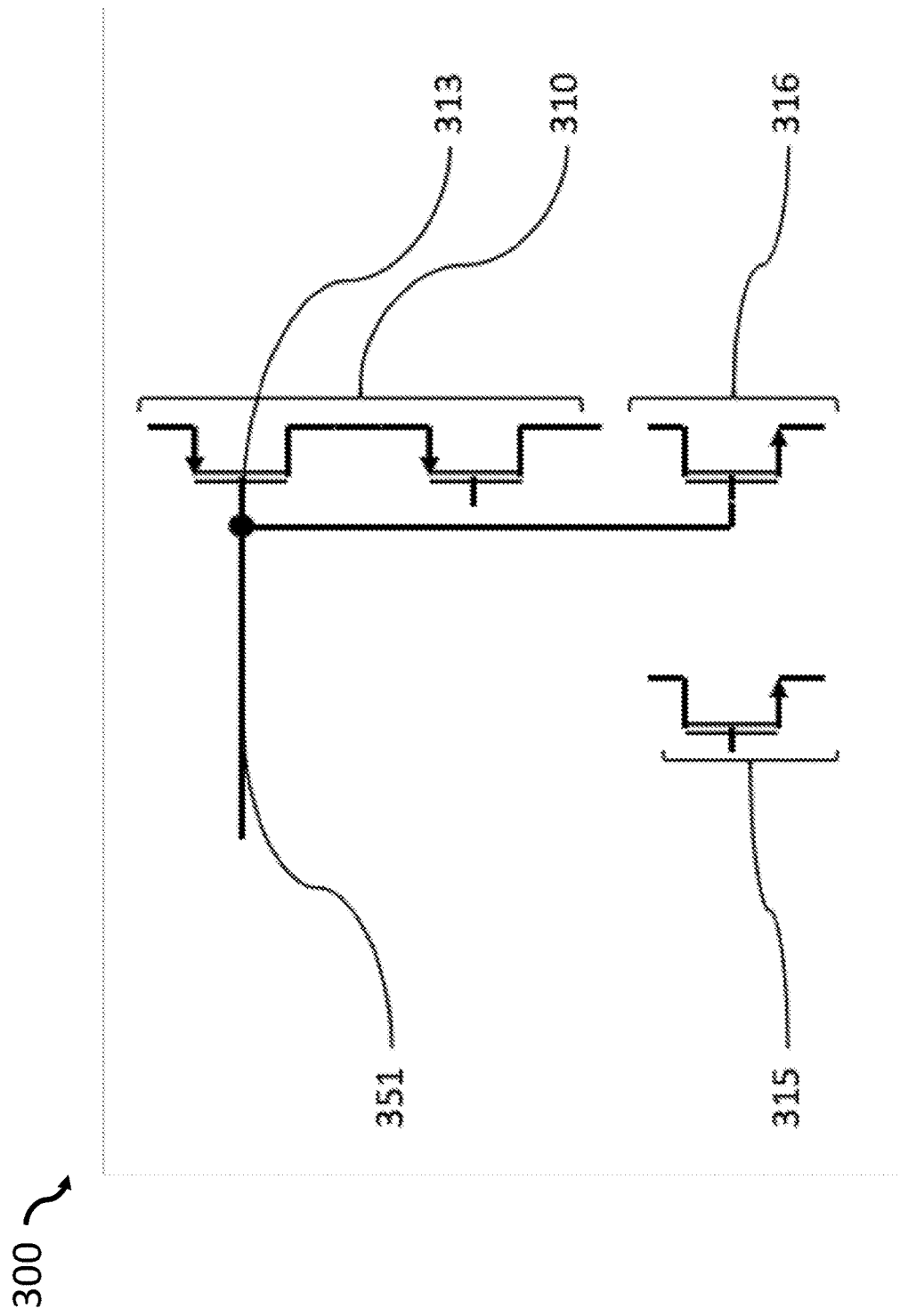
Figure 9B:
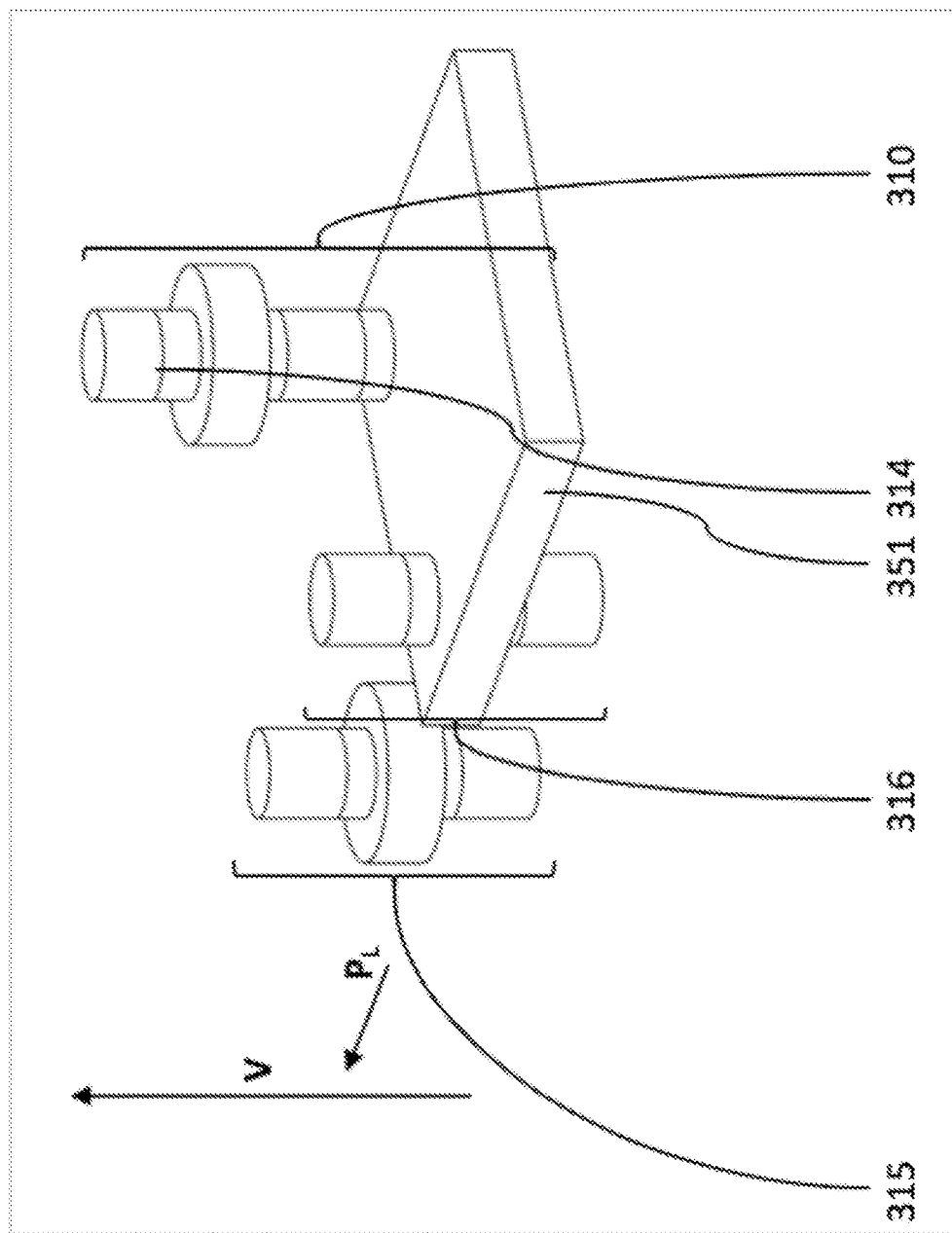

As shown in FIG. 9b, a conductive element 351 provided in the same layer that includes the gate 313 (shown in FIGS. 8a-13a, 8b) of the first FET 310a (shown in FIGS. 8a, 8b) and the gate of the FET 316 may electrically connect the gate 313 of the first FET 310a and the gate of the FET 316. The gate 313 of the first FET 310a, the conductive element 351 and the gate of the FET 316 may be formed as one piece.

Figure 10A:
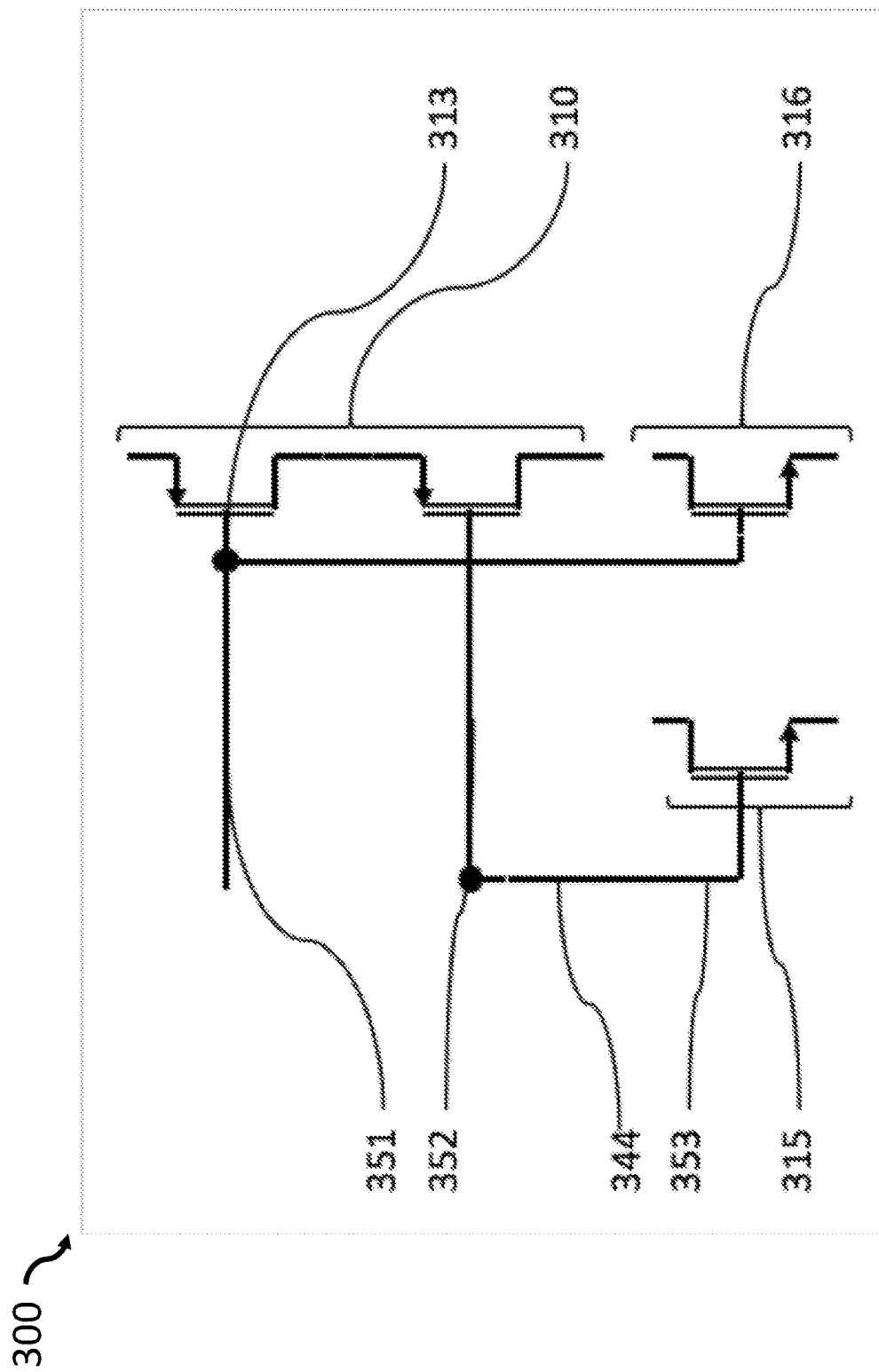
Figure 10B:
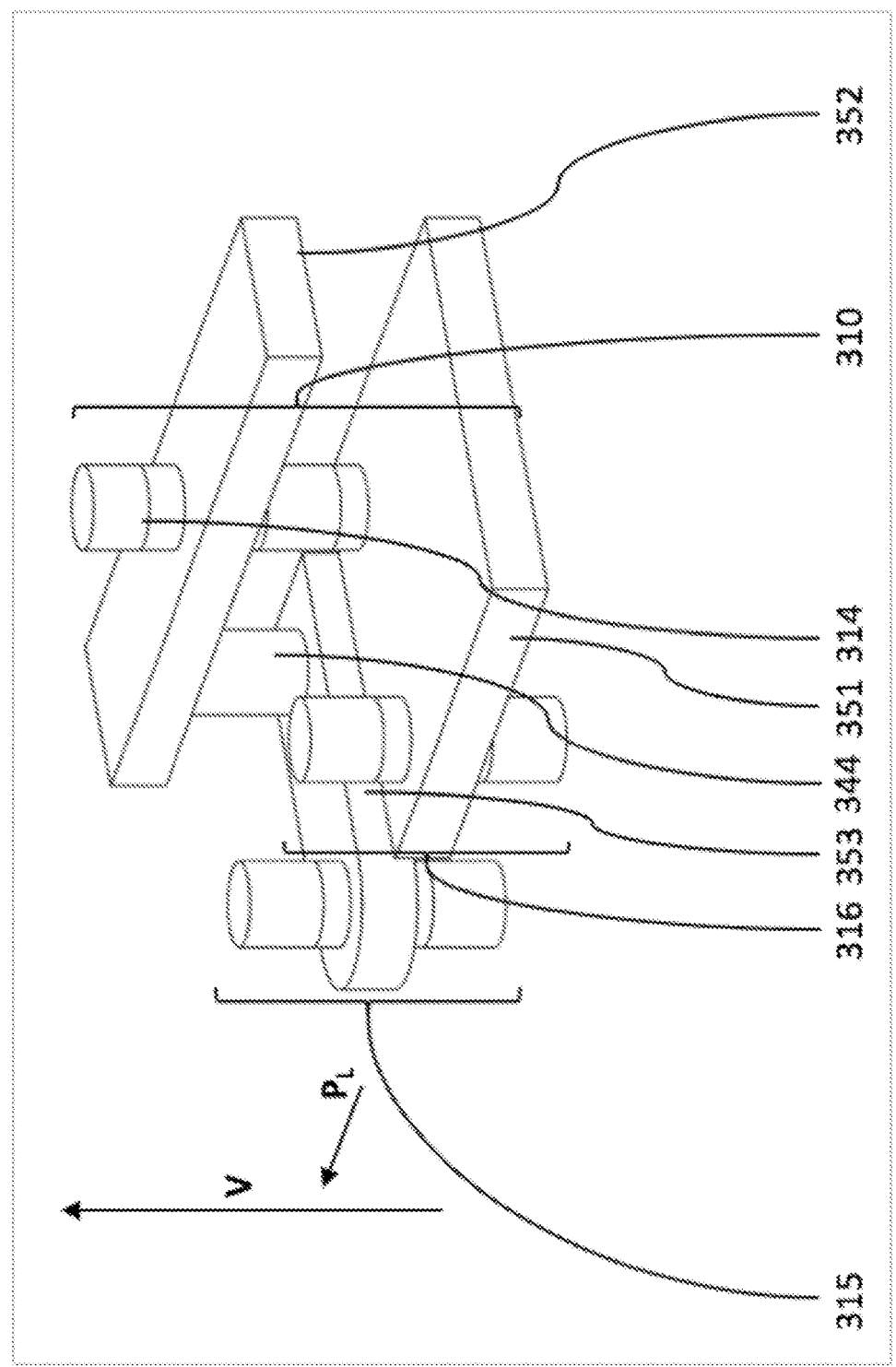

The gate of the second FET 310b (shown in FIGS. 8a, 8b) is provided in a different layer of the integrated circuit 300 than the gate of the FET 315. As shown in FIG. 10b, the gate of the FET 310b is electrically connected to the gate of the FET 315. The electrical connection may be established by the depicted conductive element 353, the vertical conductive element 344 and the conductive element 352. The conductive element 353 and the gate of the FET 315 may be formed as one part. Alternatively or in addition, the gate of the FET 310b and the conductive element 352 may also be formed as one piece.

Figure 11A:
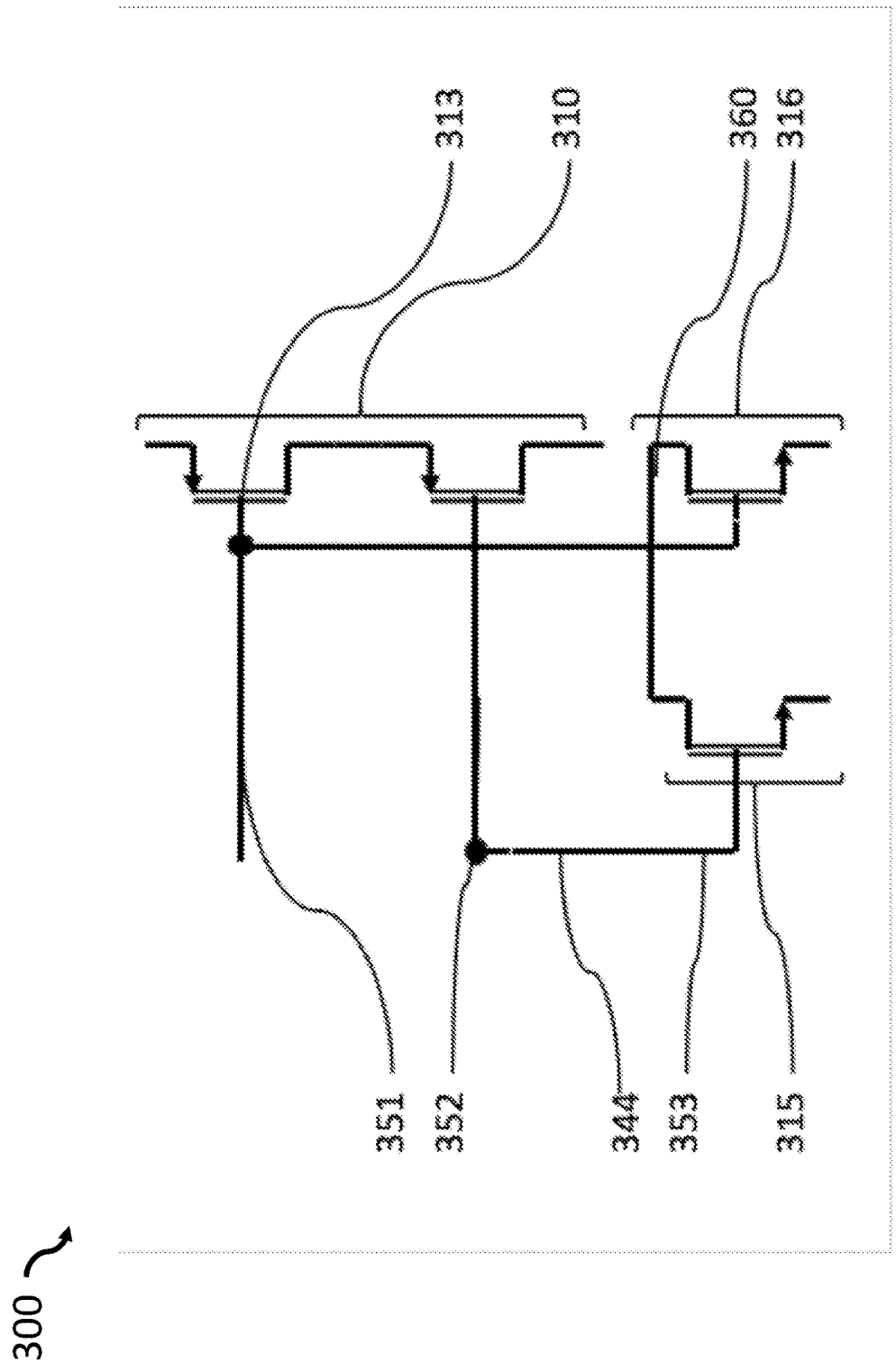
Figure 11B:
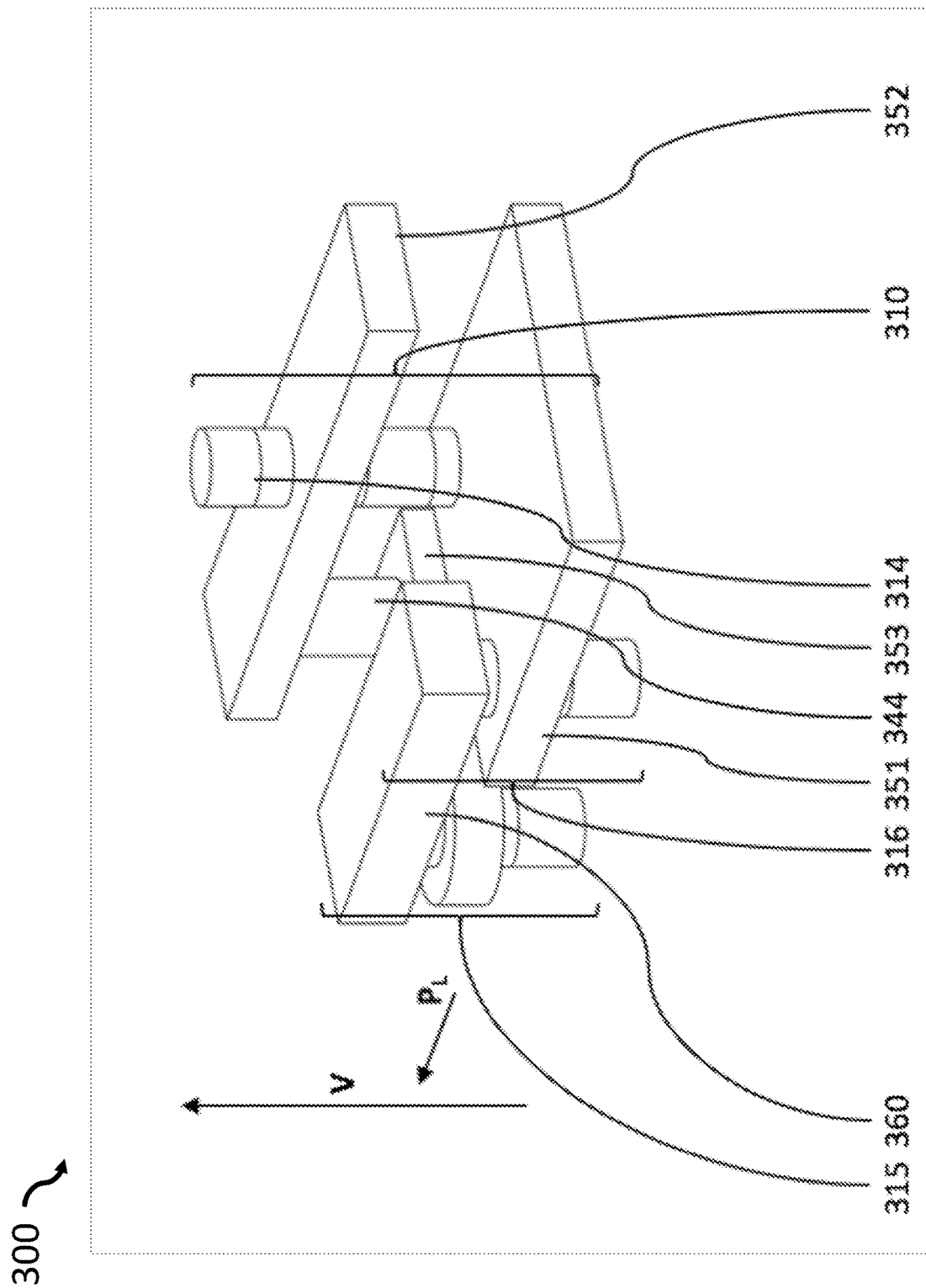

As shown in FIG. 11b, an internal connection element 360 may provide an electrical connection between the FET 315 and the FET 316. The internal connection element 360 is provided in a single layer of the integrated circuit 300. Electrical currents may flow substantially parallel to the layers of the integrated circuit 300 in the internal connection element 360. The internal connection element 360 may in particular connect the upper ends of the FETs 315 and 316. The lower ends of the FETs 315 and 316 may be considered as power support ends.

Figure 12A:
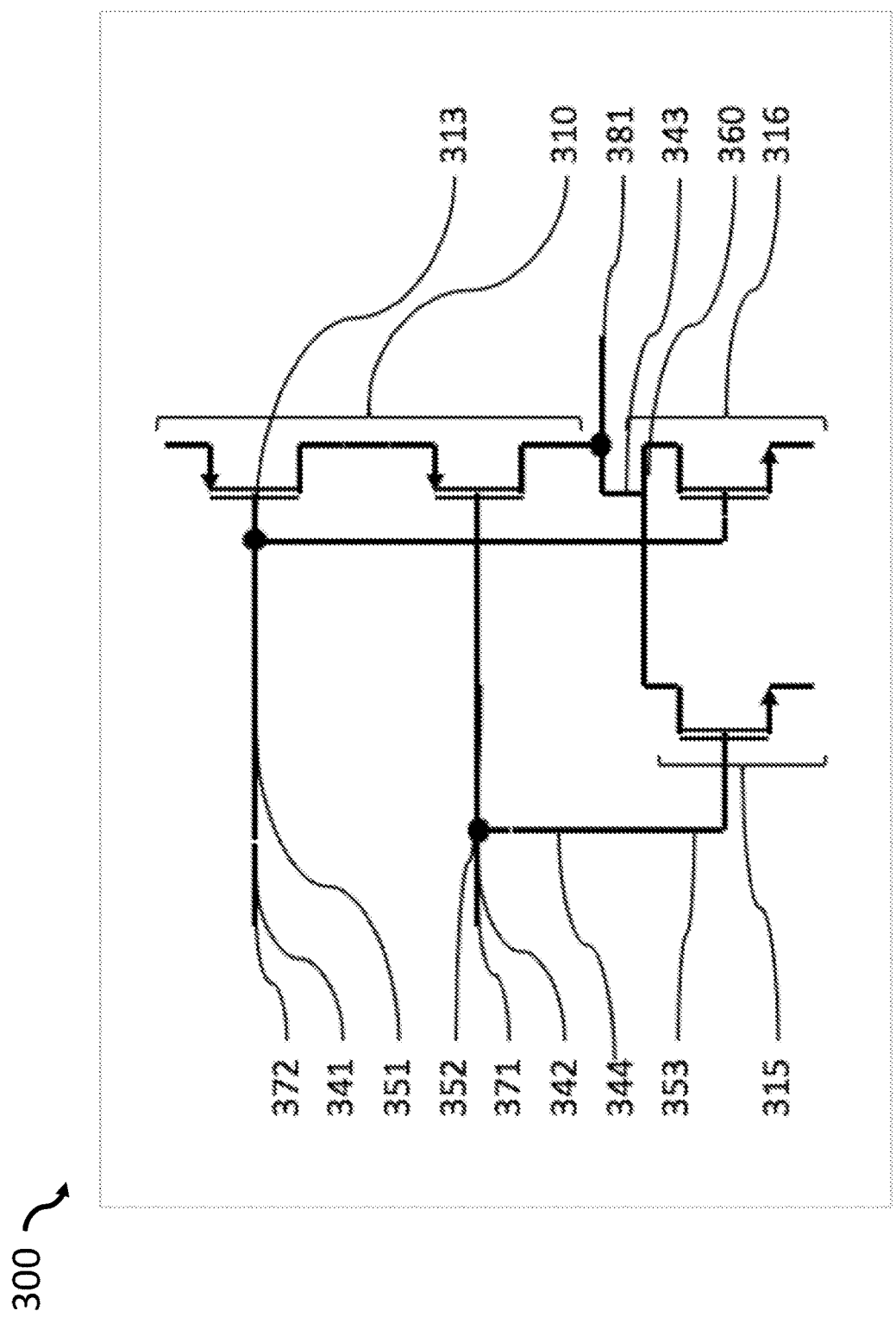
Figure 12B:
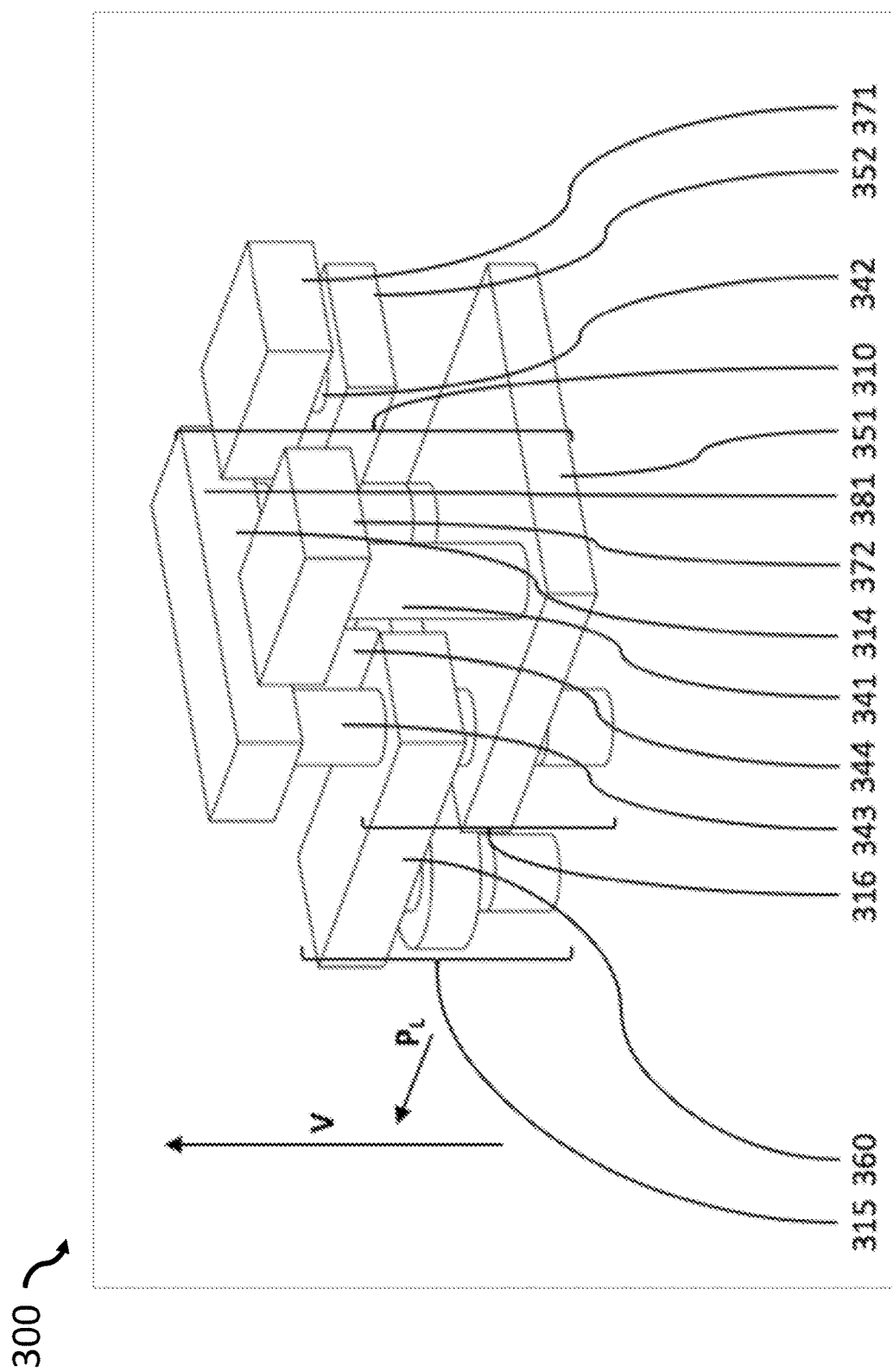

FIG. 12b shows a vertical conductive element 343 electrically connecting the internal connection element 360 to an output 381 of the integrated circuit 300. The output 381 is furthermore electrically connected to the signal end 314 of the stack 310.

A vertical conductive element 341 electrically connects the conductive element 351 to an input 372 of the integrated circuit 300. Another vertical conductive element 342 provides an electrical connection between the conductive element 352 and another input 371 of the integrated circuit 300.

Figure 13A:
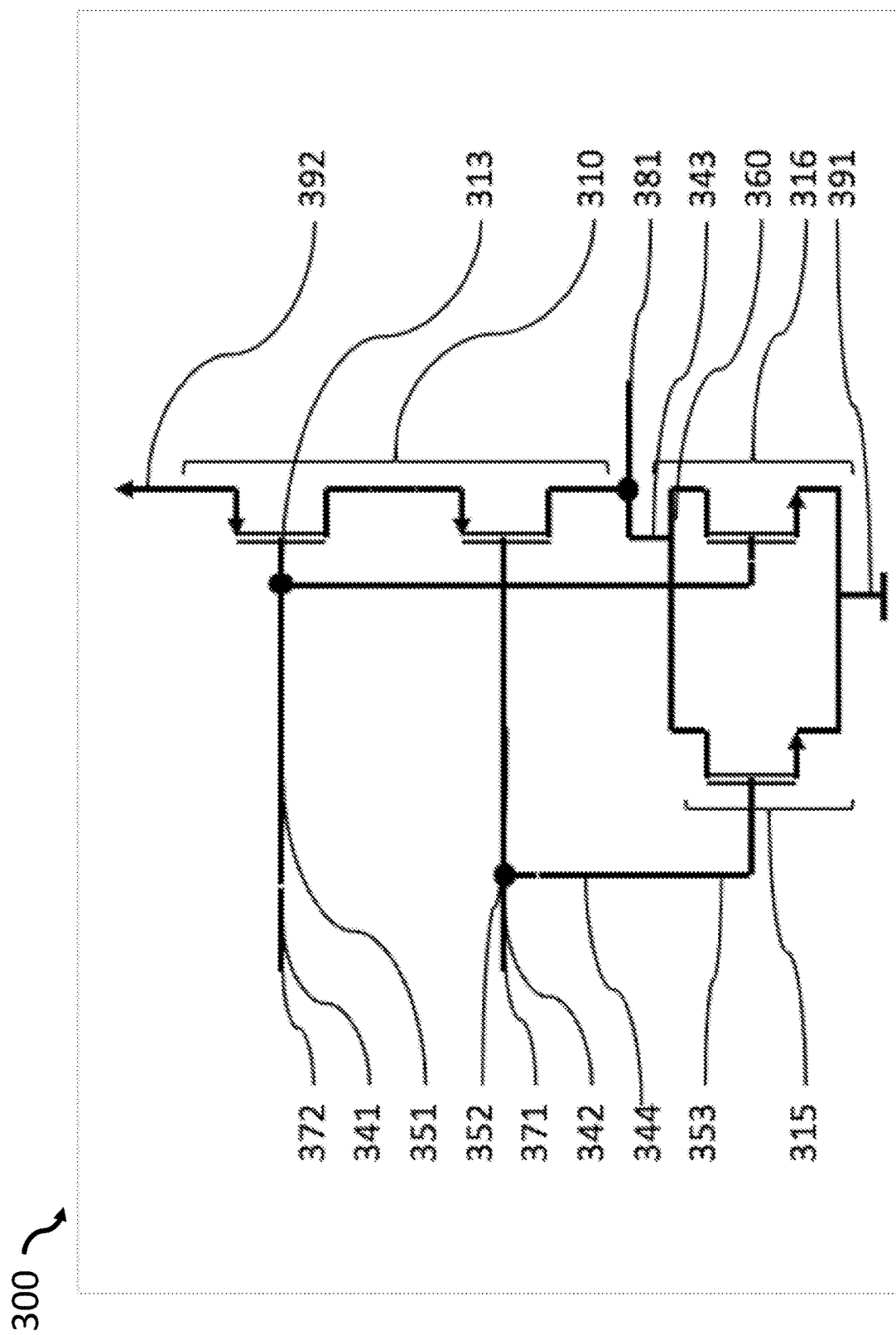
Figure 13B:
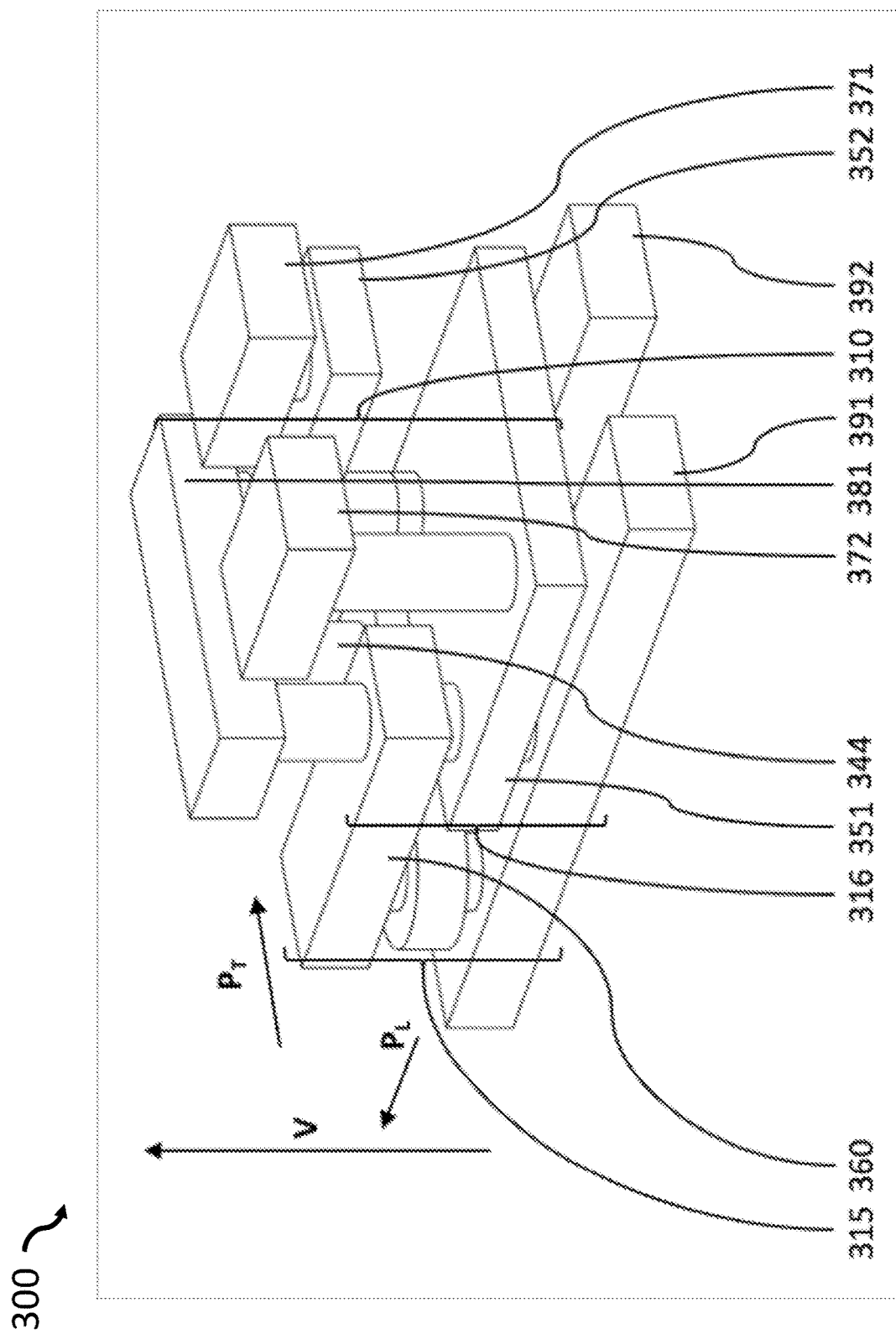

According to FIG. 13b, the power support end of the stack 310 is connected to a power supply rail 392 and the power support ends of the FETs 315 and 316 are connected to another power supply rail 391.

The power supply rail 391 may provide a ground voltage GND and the power supply rail 392 may provide a high potential voltage VDD for driving the integrated circuit 300. The FETs 310a, 310b (shown in FIGS. 8a, 8b) of the stack 310 may be pFETs and the FETs 315 and 316 may be nFETs.

The electrically connected elements of the integrated circuit 300 correspond to a logical cell, in particular a NOR gate.

The physical structure of the NOR gate 300 may be mirror-symmetric to the physical structure of the NAND gate 100, wherein the power supply rails 191 (shown in FIGS. 6a, 6b) and 391 provide both a ground voltage GND, wherein the power supply rails 192 (shown in FIGS. 6a, 6b) and 392 provide both a high potential voltage VDD, and wherein the type of the FETs 110a, 110b (shown in FIGS. 1-2a and 1-2b), 115 (shown in FIGS. 1a-6a, 1b-2b) and 116 (shown in FIGS. 1a-5a, 1b-5b) is opposite to the type of the FETs 310a, 310b and 315, 316, respectively.

An integrated circuit may include a sub-circuit corresponding to the integrated circuit 100 and a sub-circuit corresponding to the integrated circuit 300, which share the power supply rails 191/391 and 192/392. This may be an example of an integrated circuit that includes multiple adjacent layers, wherein the integrated circuit includes a (first) stack 110 of two FETs of the same type and second stack 310 of two FETs of the same type, which is different than the type of the FETs of the (first) stack 110, wherein a power end of the (first) stack 110 is connected to a power supply rail 191/391 and a power end of the second stack 310 is connected to another power supply rail 192/392.

Extending from NAND and NOR, as shown as an example of logic cells, multiple combinations of p- and n-channel stacks and p- and n-channel single devices may be made with p-channels located above or below VDD rails and n-channels located above or below GND rails. Using the multiple variations of p- and n-channel stacks and devices, the devices may be connected to appropriately form the desired function with the connection elements shown in the NAND and NOR examples.

FIGS. 14a-20a show circuit diagram elements of a SRAM Cell and FIGS. 14b-20b show the corresponding elements of a physical structure of an integrated circuit 400 that include multiple adjacent layers. For a better understanding, the integrated circuit 300 is shown with an increasing number of elements. FIGS. 14a-20a correspond to FIGS. 14b-20b in terms of electrical circuit diagrams. In the following description, reference is made primarily to the physical structure as shown in FIGS. 14b-20b.

Referring now to FIGS. 14b-20b, elements of a physical structure of an integrated circuit 400 having a layered structure. In particular, FIGS. 14b-20b disclose elements of a SRAM cell 400. The integrated circuit 400 is shown with an increasing number of elements from FIG. 14b to FIG. 20b. FIGS. 14a-20a correspond to FIGS. 14b-20b in terms of electrical circuit diagrams. The following description focuses on the physical structure of the integrated circuit 400 and the electrical circuit diagrams are mainly provided for a better understanding of the function of the respective elements.

Figure 14A:
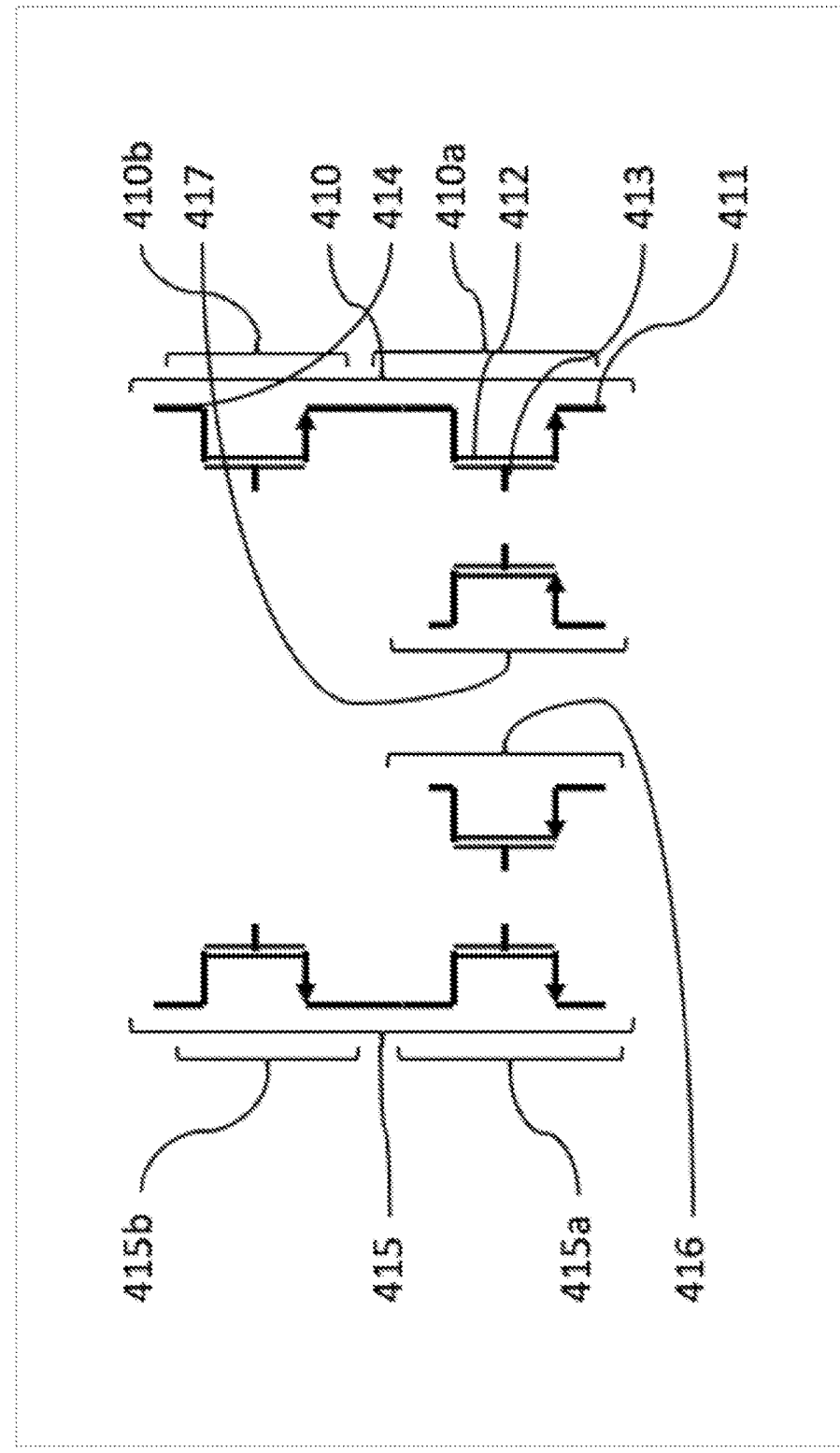
Figure 14B:
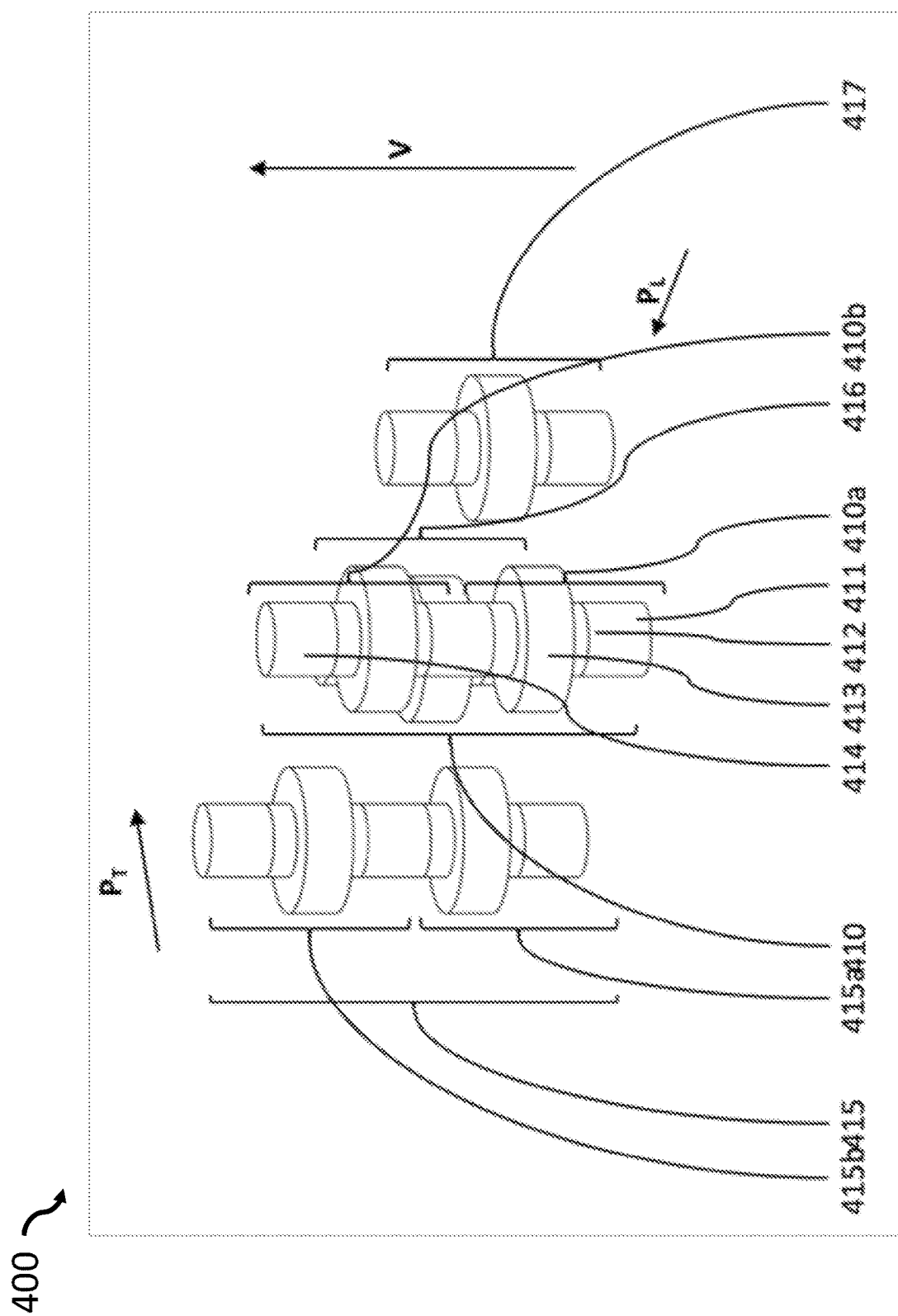

As shown in FIG. 14b the integrated circuit 400 includes a (first) stack 410 of a first field effect transistor (FET) 410a and a second FET 410b. The first FET 410a and the second FET 410b each include a channel region. The channel regions of the first FET 410a and the second FET 410b are electrically connected in series. The (first) stack 410 extends in a vertical direction V that is substantially perpendicular to the layers. The first FET 410a and the second FET 410b of the stack 410 are of the same type. The two opposed ends of the stack 410 correspond to a power support end 411 and a signal end 414.

Figure 20A:
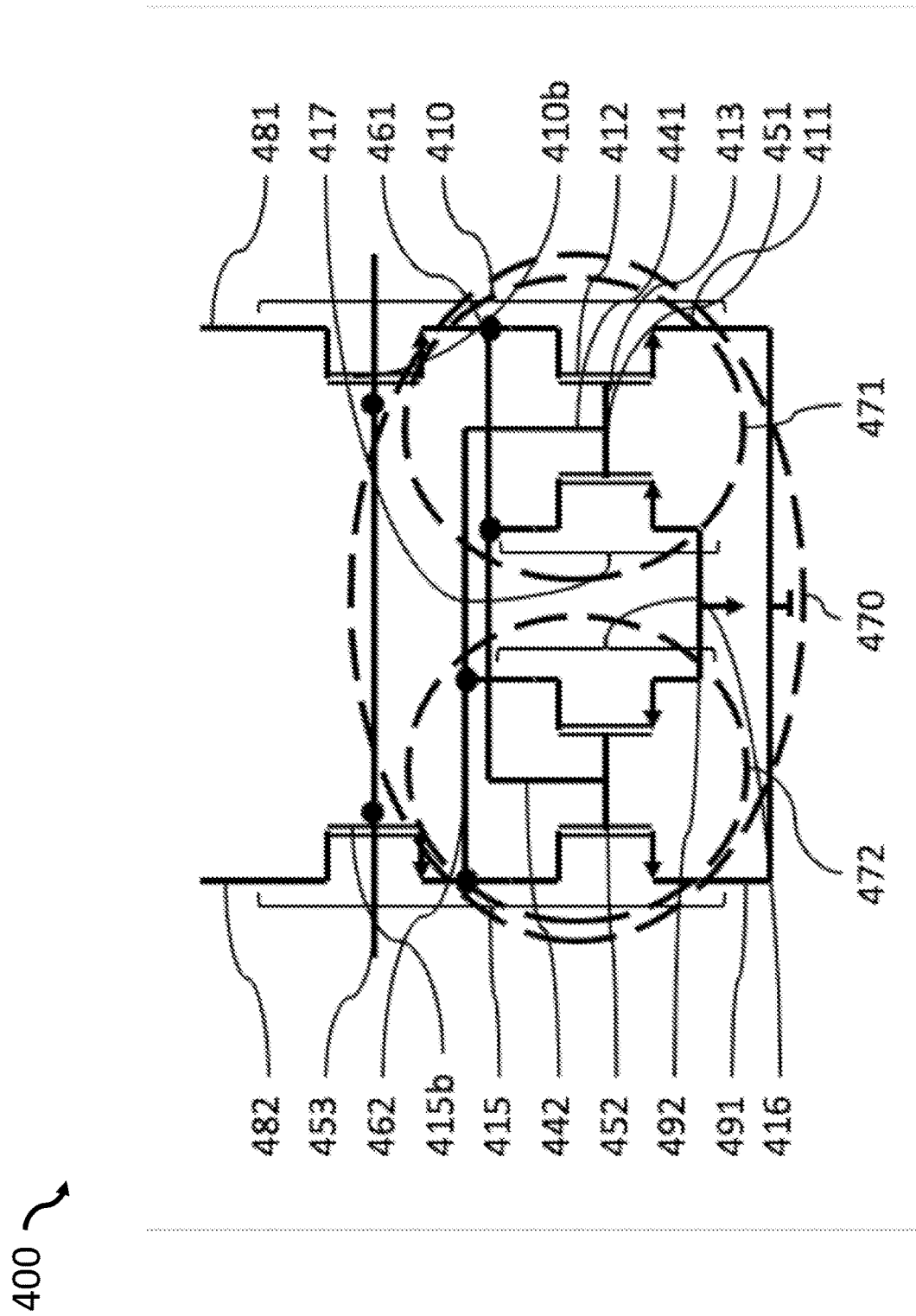

The integrated circuit 400 may correspond to a SRAM cell 400. The SRAM cell 400 includes a memory element 470 as shown in FIG. 20a. The memory element 470 (shown in FIG. 20a) includes a first inverter 471 (shown in FIG. 20a) that includes a first inverter FET 410a. The first inverter FET 410a is shown as first FET 410a of the (first) stack 410 in FIG. 14b and is connected to a power supply rail 491 (shown in FIGS. 20a, 20b). The SRAM cell 400 further includes an access FET 410b electrically connected to a bitline 481 (shown in FIGS. 20a, 20b). The access FET 410b is shown as second FET 410b of the (first) stack 410 in FIG. 14b.

As shown in FIG. 14b, the integrated circuit/SRAM cell 400 includes a second stack 415 that may include two FETs 415a and 415b. The channel regions of the two FETs 415a and 415b are electrically connected in series. In particular, a source region of one of the two FETs 415a and 415b may correspond to a drain region of the other one of the two FETs 415a and 415b. A lower end of the stack 415 may be called a power support end and an upper end of the stack 415 may be called a signal end of the stack 415.

Figure 20B:
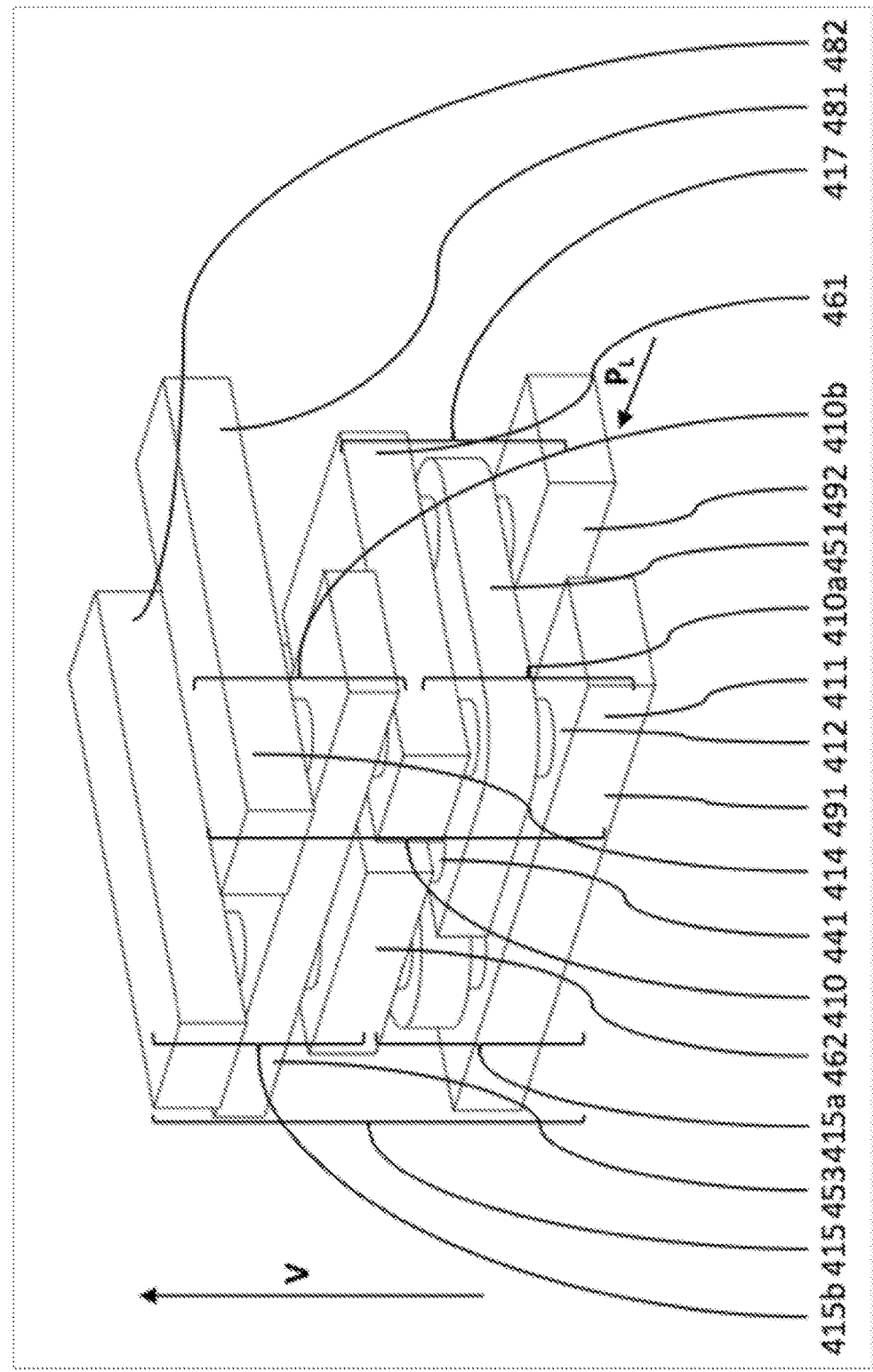

The channel regions of the (first) stack 410 and the second stack 415 are provided in two layers between the layer that includes the power supply rail 491 (shown in FIGS. 20a, 20b) and layers that include signal lines, in particular the bitline 481 and the bitline 482 of the integrated circuit 400 as shown in FIG. 20b. The bitline 482 may also be considered as a complementary bitline 482, because the bitlines 481 and 482 are configured for transmitting complementary data. The separation of the layer that includes the gates of the FETs 410a and 415a and the layer that includes the gates of the FETs 410b and 415b from the layer that includes the power supply rails 491 and 492 and the layer that includes the bitlines 481 and 482 may substantially reduce the routing complexity of the integrated circuit 400. In particular, less VIA contacts may be required and shorter wires may be sufficient for manufacturing the integrated circuit. This may increase the device density of an integrated circuit. Moreover, it may reduce power consumption induced by wire capacitances.

The channel regions of the stacks 410 and 415 shown in FIG. 14b are vertical channel regions. In vertical channel regions, charge carriers may move in a direction substantially perpendicular to the layers of the integrated circuit 400 in a conductive state of the respective FETs.

The first inverter 471 shown in FIG. 20a further includes a second inverter FET 417 that includes a gate. The second inverter FET 417 is of a different type than the first inverter FET 410a (shown in FIGS. 14-17a, 14-20b) that includes a gate. An end of the second inverter FET 417 is connected to a further power supply rail 492. The second inverter 472 also includes two FETs, namely the FET 415a (shown in FIGS. 14-17a, 14-20b) and the FET 416. The FET 416 is hidden behind the stack 410 in FIG. 14b. The stack 410, the stack 415, the FET 417 and the FET 416 may be arranged in corners of a rectangle, when seen from above. In particular, the stack 410, the stack 415, the FET 417 and the FET 416 may be provided in corners of a quadrant.

Figure 15A:
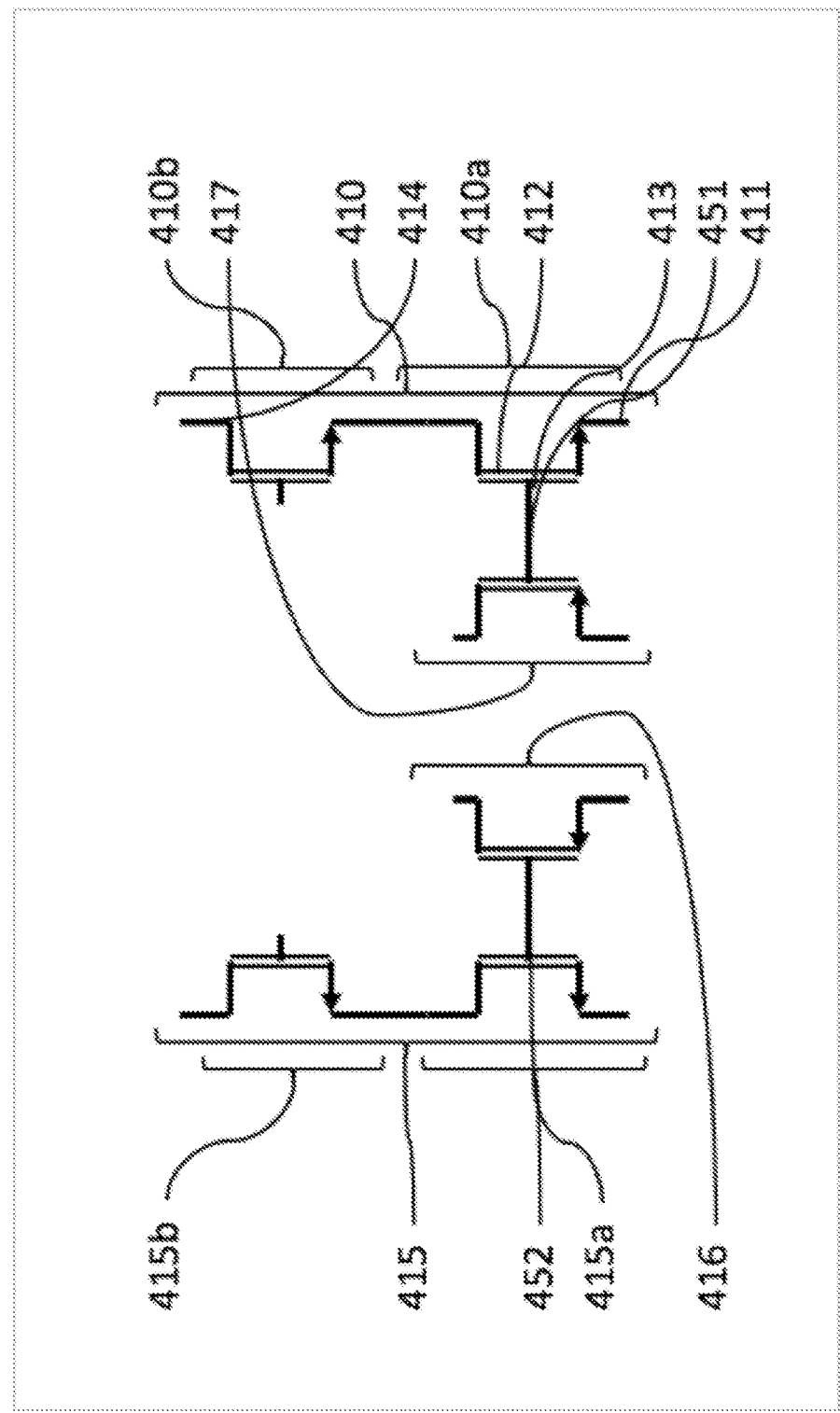
Figure 15B:
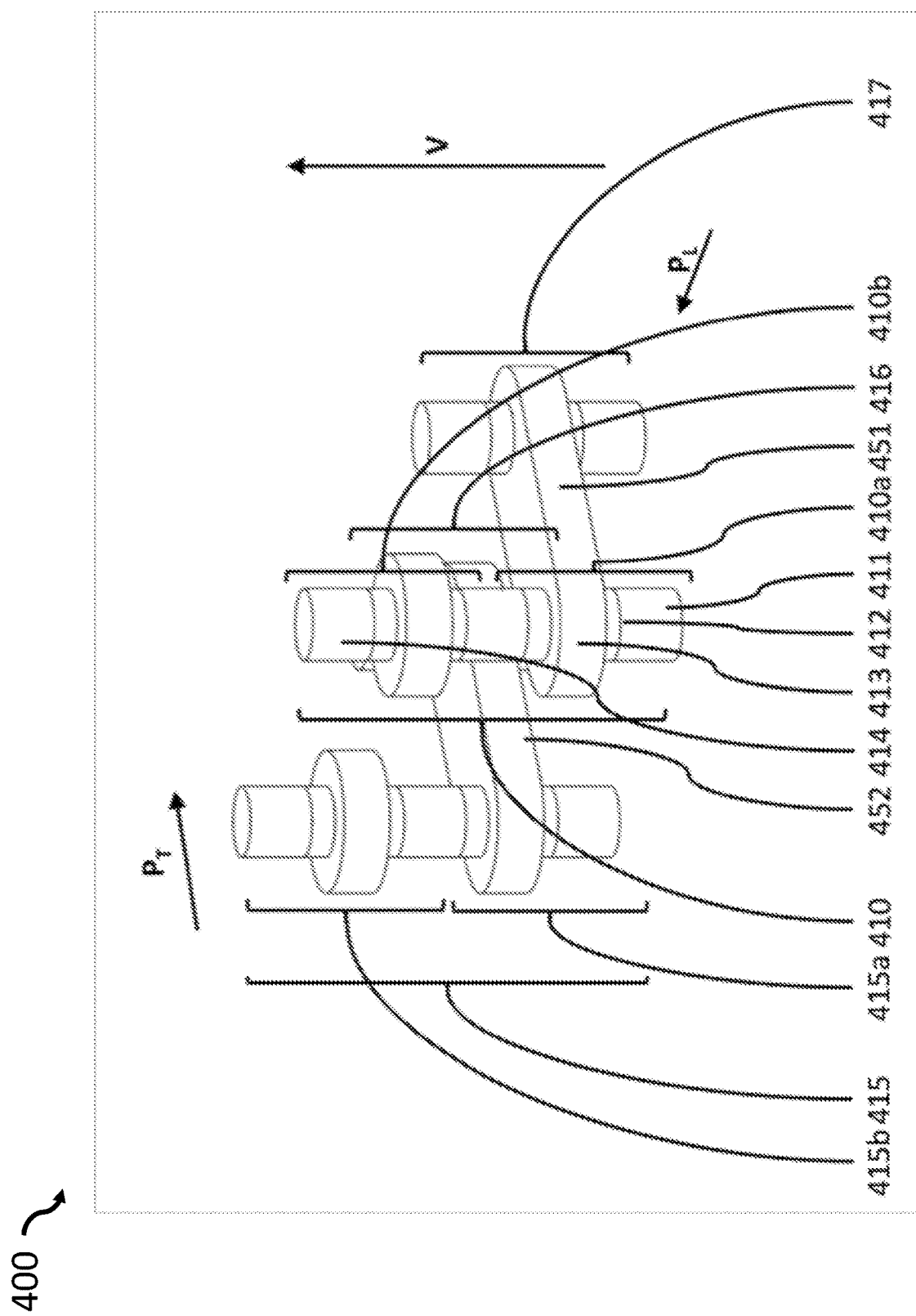

As shown in FIG. 15b, the gate 413 of the first inverter FET 410a and the gate of the second inverter FET 417 are electrically connected with each other by a conductive element 451 extending within a single layer of the integrated circuit 400. In particular, the gate of the first inverter FET 410a, the gate of the second inverter FET 417 and the conductive element 451 may be formed as one piece to facilitate manufacturing of the integrated circuit 400.

Correspondingly, a conductive element 452 is provided, which connects the gate of the FET 415a and the gate of the FET 416. The conductive element 452 extends within a single layer of the integrated circuit 400. The gate of the FET 415a, the gate of the FET 416 and the conductive element 452 may be formed as one piece, too.

In an embodiment shown in FIGS. 14b-20b, the first inverter FET 410a and the access FET 410b are n-channel FETs, nFETs, and the second inverter FET 417 is a p-channel FET, pFET. Correspondingly, the FET 415a and the FET 415b are nFETs and the FET 416 is a pFET. For given physical dimensions, nFETs may have a higher conductivity. Using FETs of the type with the higher conductivity may be particularly useful when the FETs are connected in series to reduce the power consumption of the integrated circuit. However, embodiments are conceivable in which the first inverter FET and the access FET are pFETs and the second inverter FET is a nFET. This may be useful for an integrated circuit with inverted logic.

Figure 16A:
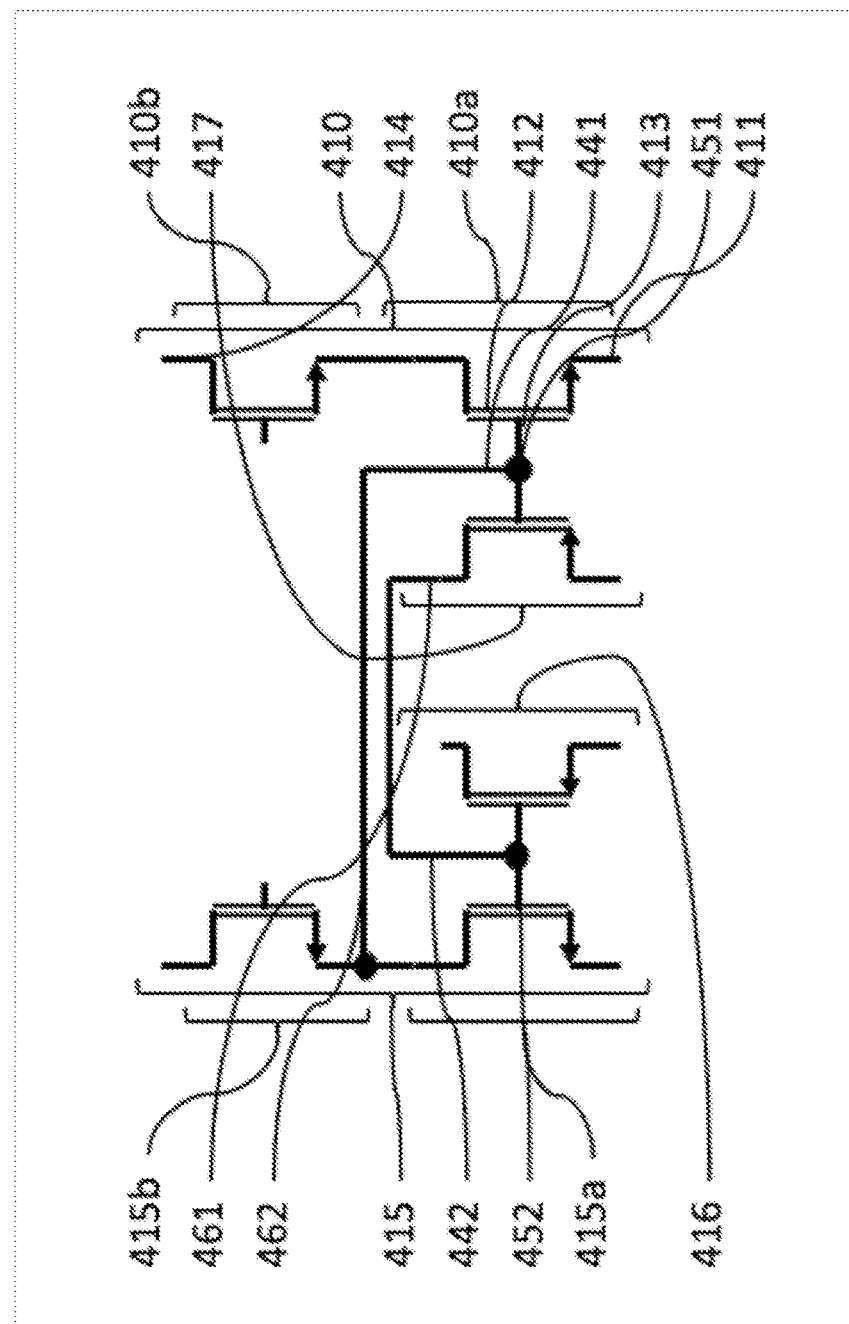
Figure 16B:
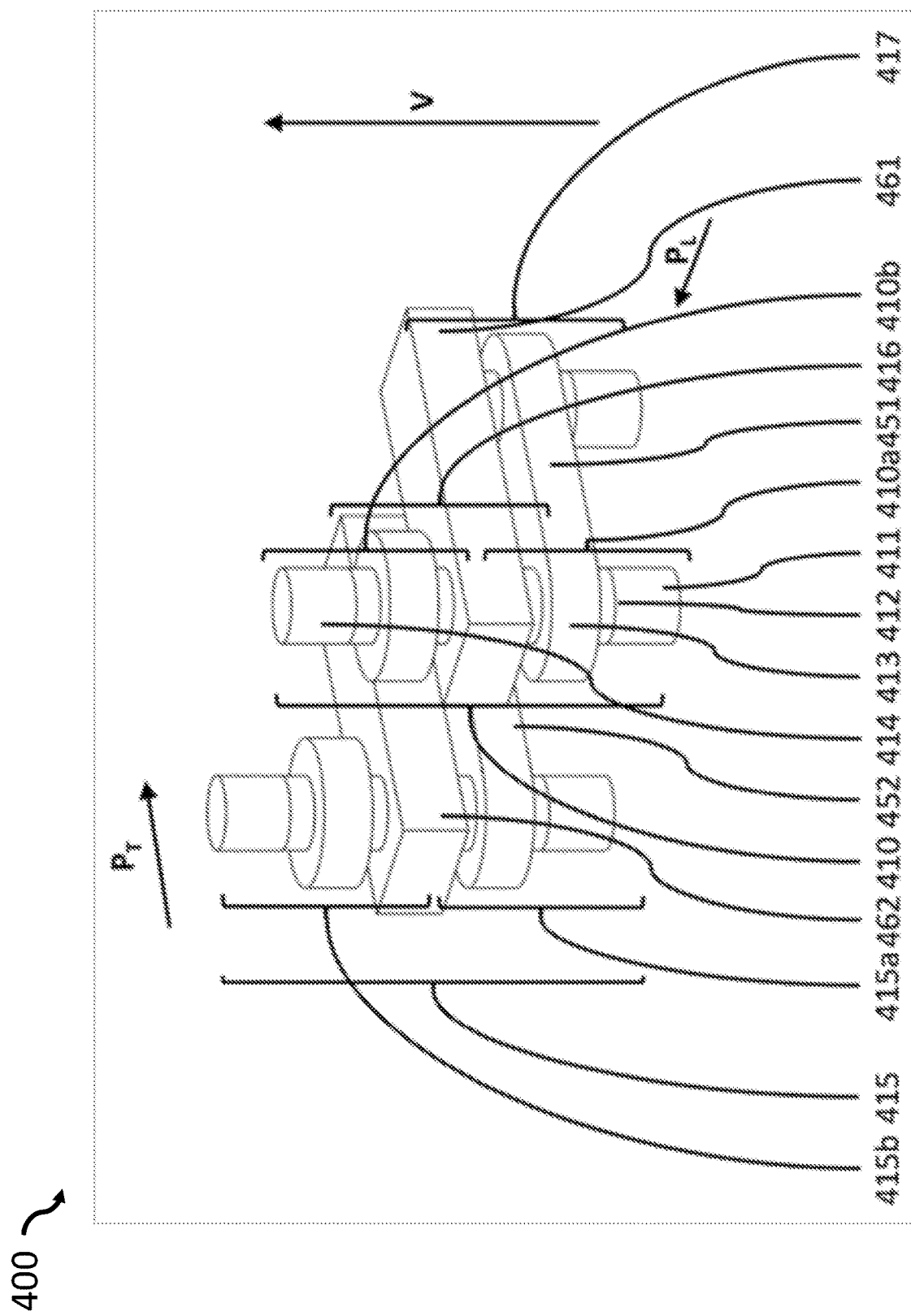
Figure 17A:
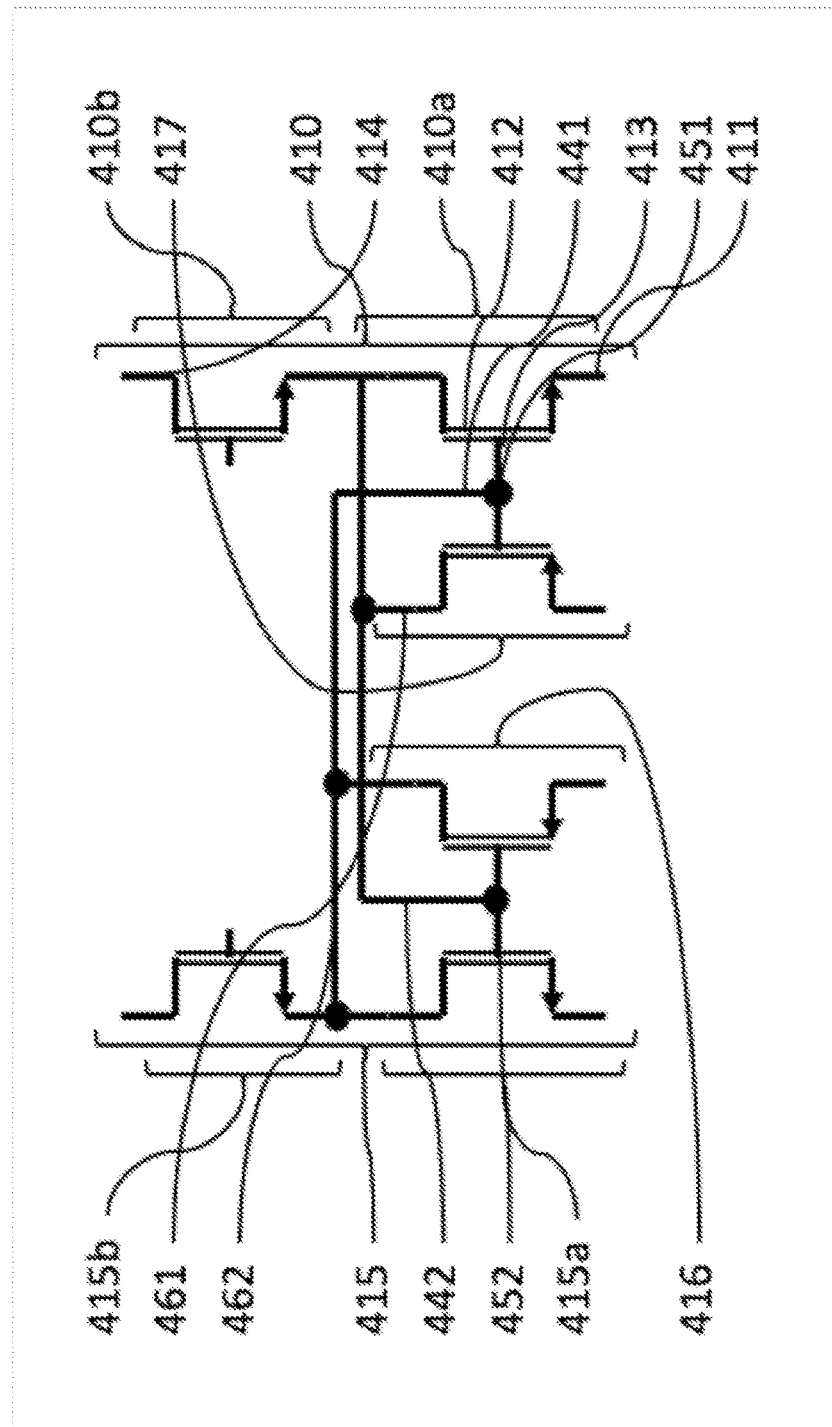
Figure 17B:
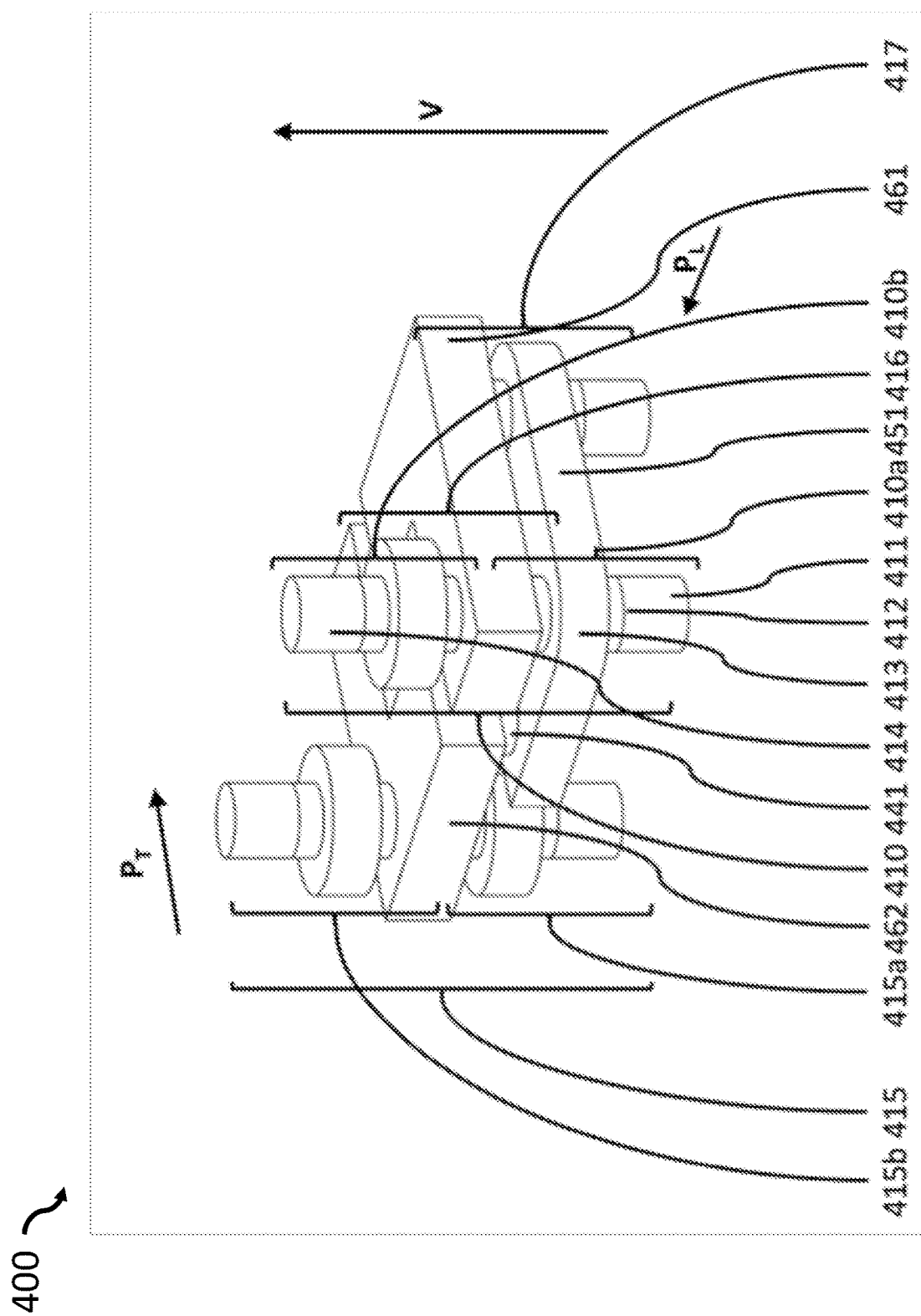

As shown in FIGS. 16b and 17b, the integrated circuit 400 includes an intermediate layer. The intermediate layer is arranged between a first gate layer that includes the gate 413 of the first inverter FET 410a and a second gate layer that includes the gate of the access FET 410b. The memory element 470 (shown in FIG. 20a) includes a second inverter 472 (shown in FIG. 20a). The second inverter 472 is formed with the FET 415a and the FET 416.

The second inverter 472 is cross-coupled with the first inverter 471 (shown in FIG. 20a) by means of two cross-coupling conductors. As shown in FIG. 17b, one cross-coupling conductor includes the conductive element 462 (shown in FIGS. 16-20a) and the vertical conductive element 441 (shown in FIGS. 16-20a). The vertical conductive element 441 provides a connection between the upper end of the FET 415a and the conductive element 451 (shown in FIGS. 15-17a, 20a and 15-20b). The other cross-coupling conductor includes the conductive element 461 and a further vertical conductive element 442 (hidden behind the conductive element 461 in FIG. 17b), which connects the conductive element 461 with the conductive element 452. Thus, the cross-coupling conductors both include a section 461, 462 extending within the intermediate layer.

Figure 18A:
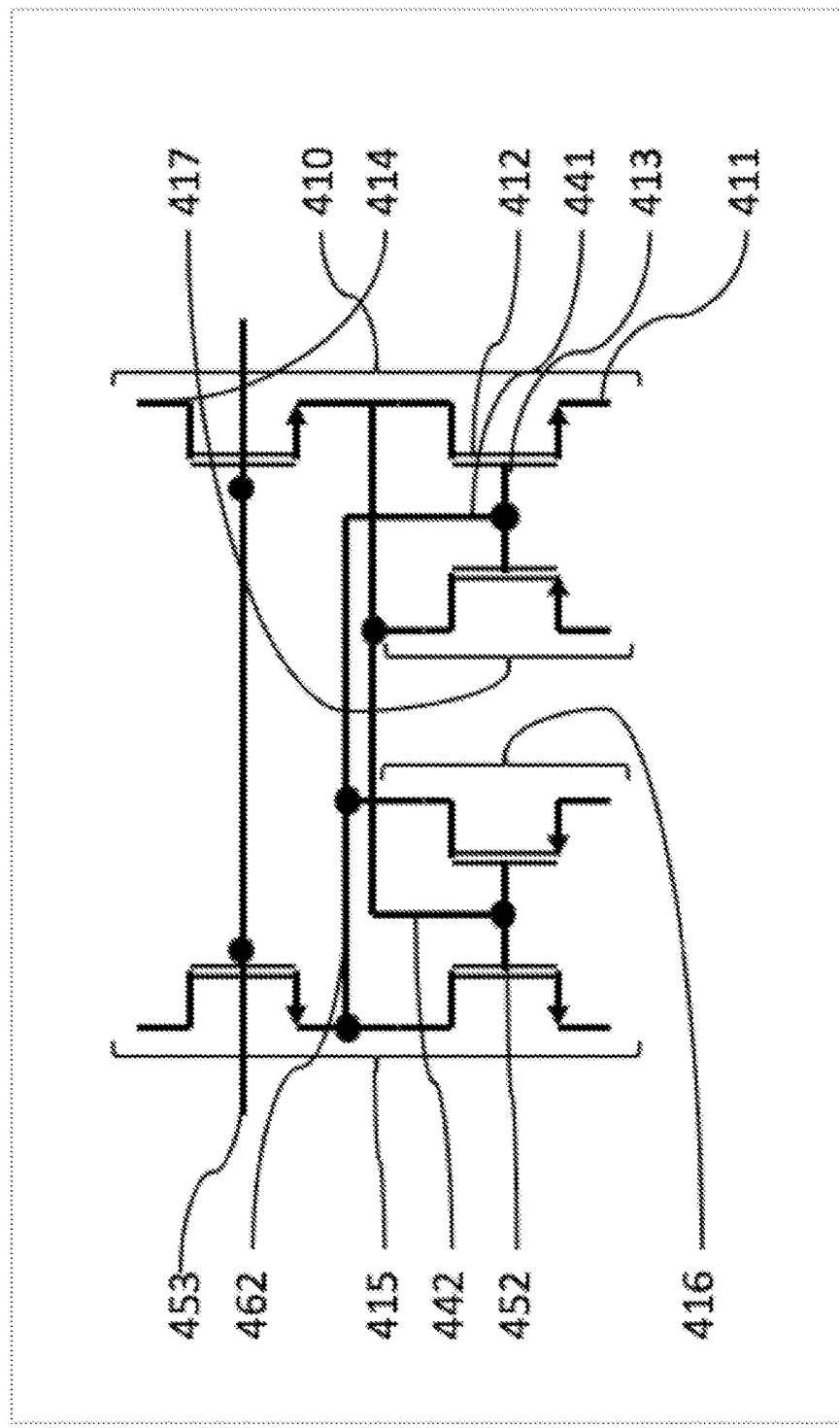
Figure 18B:
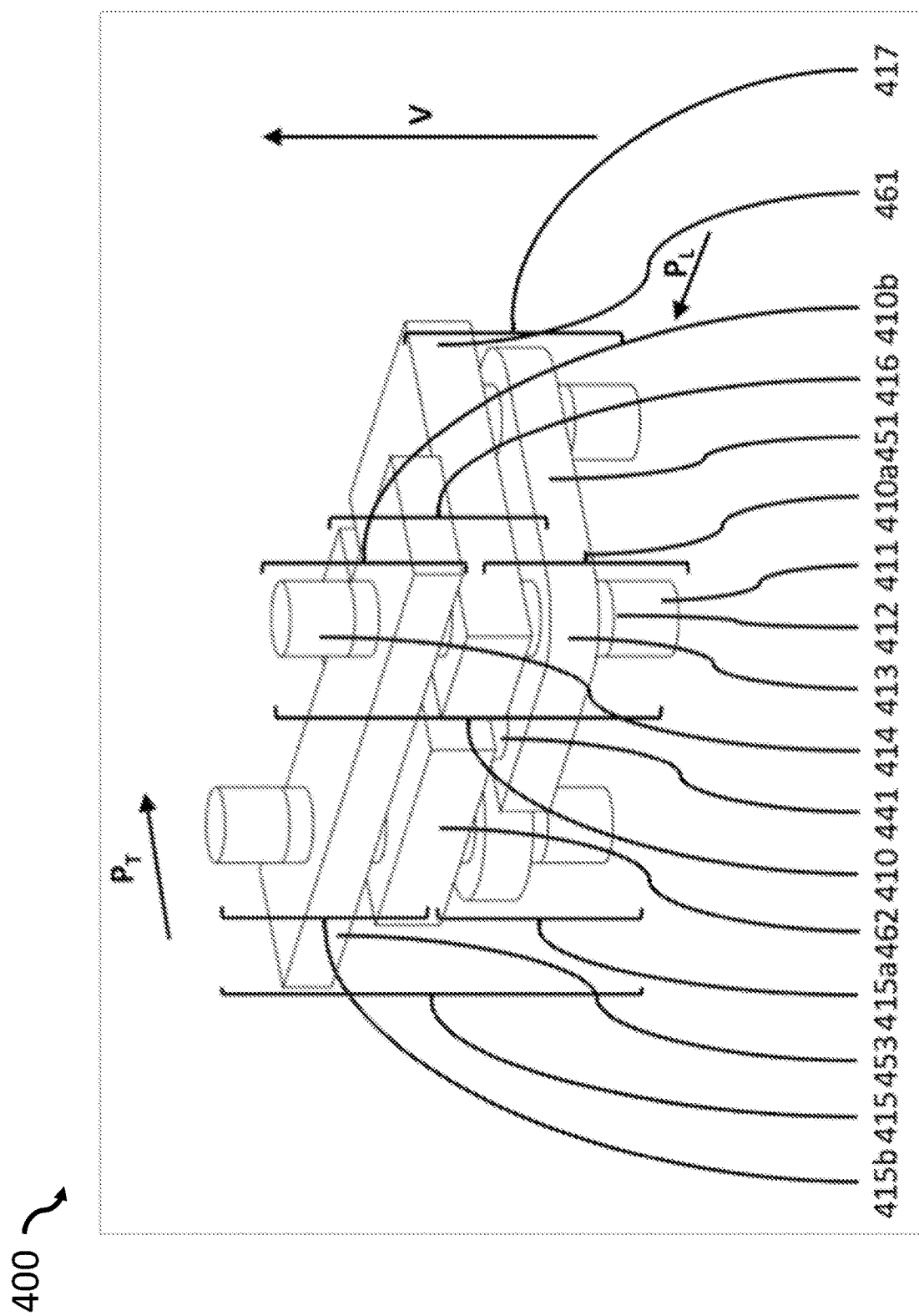

According to FIG. 18b, the access FET 410b includes a gate, wherein the gate is connected to a wordline 453. The gate of the FET 415b may be connected to the wordline 453, too. The wordline 453 may extend in the same layer as the gate of the access FET 410b. In particular, the wordline 453 and the access FET 410b of the SRAM cell 400 may be formed as one piece. This may further reduce the manufacturing complexity of the integrated circuit 400.

Figure 19A:
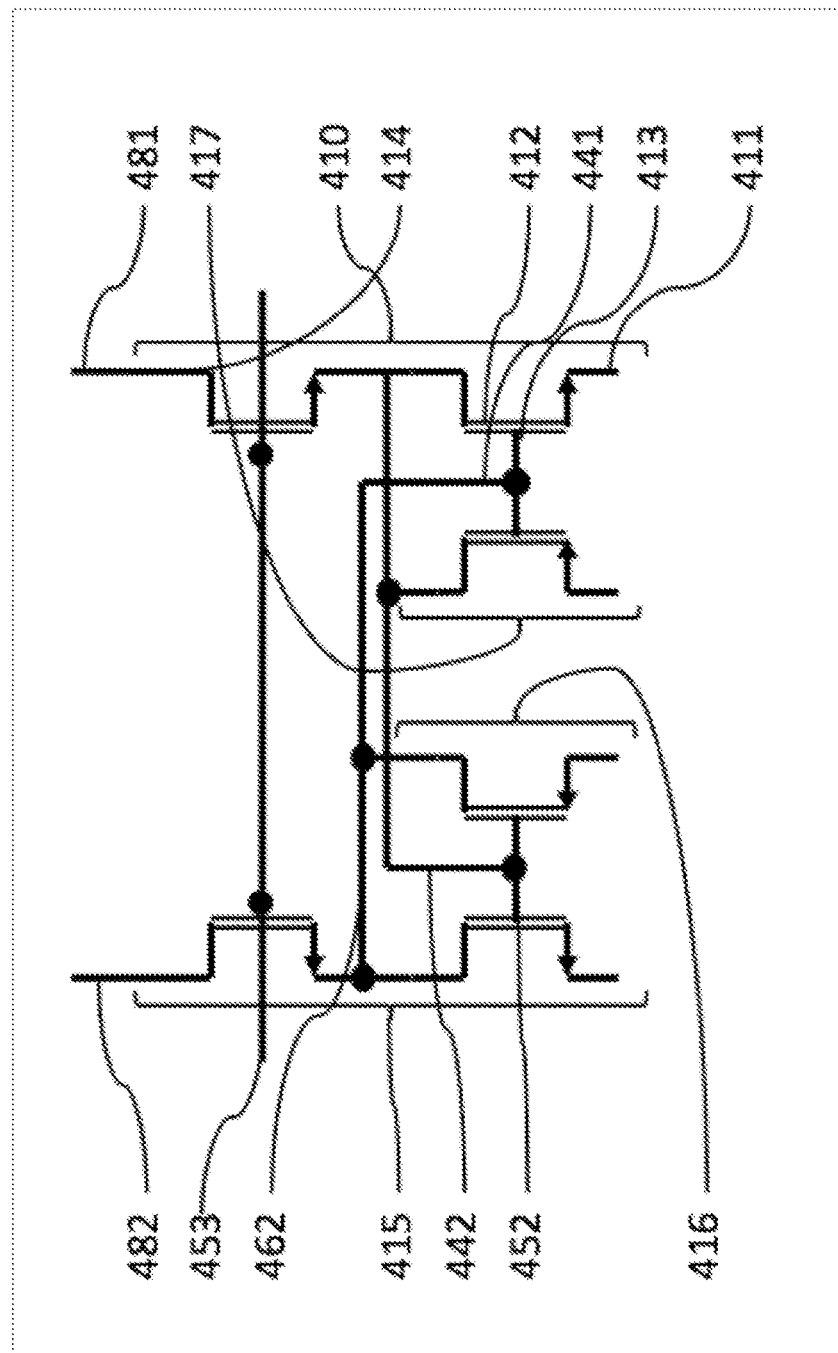
Figure 19B:
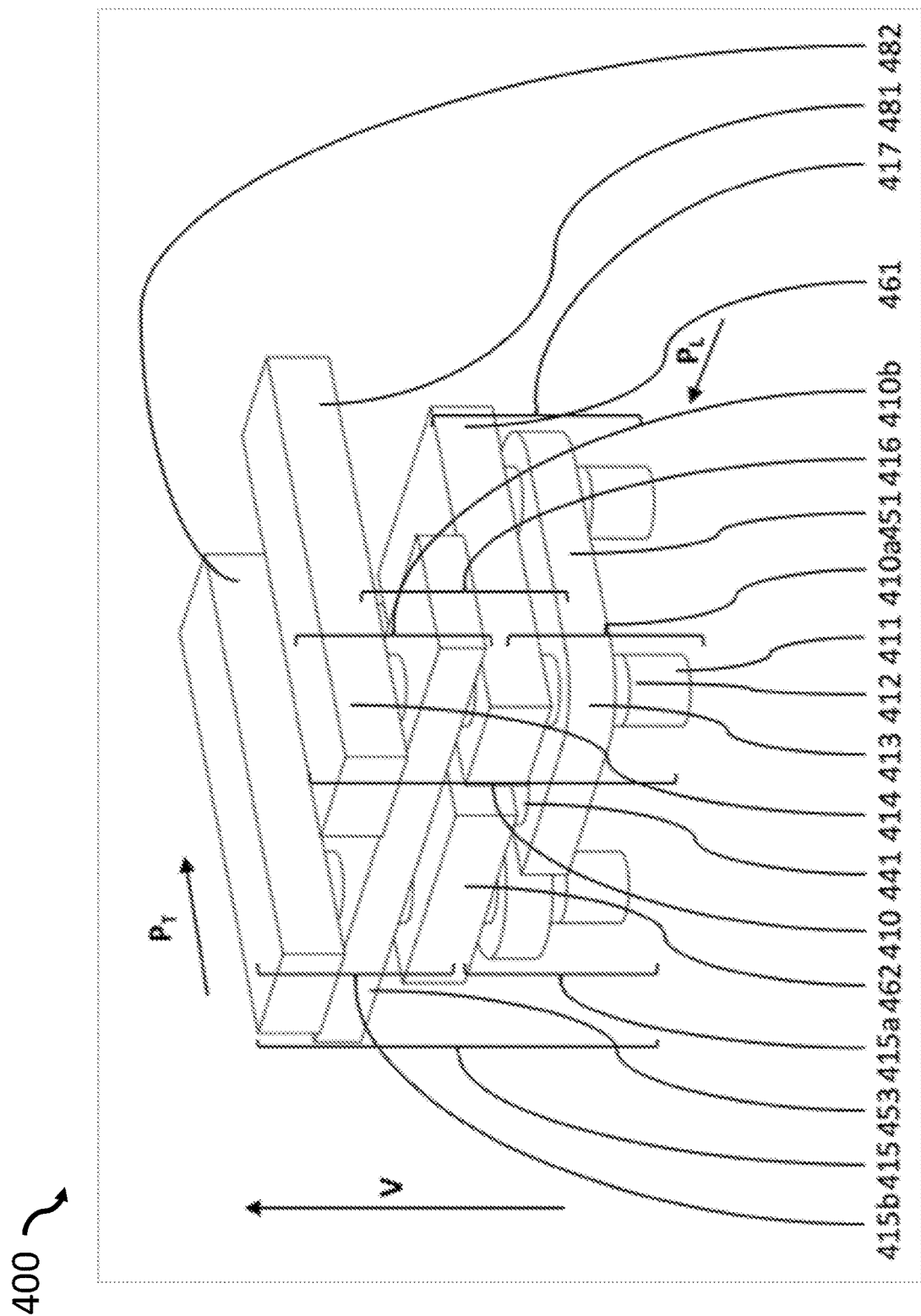

As shown in FIG. 19b, the signal ends of the stacks 410 and 415 are connected to respective bitlines 482 and 481.

The power support ends of the stacks 410, 415 are connected to the power supply rail 491 and the power support ends of the FETs 416 and 417 are connected to the power supply rail 492 as shown in FIG. 20b.

In the embodiment shown in FIGS. 13b-20b, the width of the wordline 453 in a direction $P_T$ perpendicular to the extension direction of the power supply rail 491 is only slightly larger than the gate of the access FET 410b. In other embodiments, a wider wordline 453 may be provided which also extends above the FETs 416 and 417. The wordline 453 may electrically connect the access FETs of a plurality of SRAM cells provided in a direction $P_L$ along the power supply rails 491 and 492. Thus, the wordline 453 may allow for reading or writing data from/to a plurality of SRAM cells in parallel. Theretofore, the wordline 453 may extend parallel to the power supply rail 491. More SRAM cells may be addressed by a wider wordline 453.

The bitline 481 extends perpendicular to the power supply rail 491. The bitline 481 may connect a plurality of SRAM cells provided in a direction $P_T$ transversal to the extension direction $P_L$ of the power supply rail 391. The other bitline 482 may be provided parallel to the bitline 481.

The wordline 453, the bitline 481/482 and the power supply rail 491/492 may be provided in different layers of the integrated circuit 400. Thus, a larger two dimensional array of SRAM cells may be provided without special bridging structures for insulating crossing wordlines/bitlines.

Figure 21:
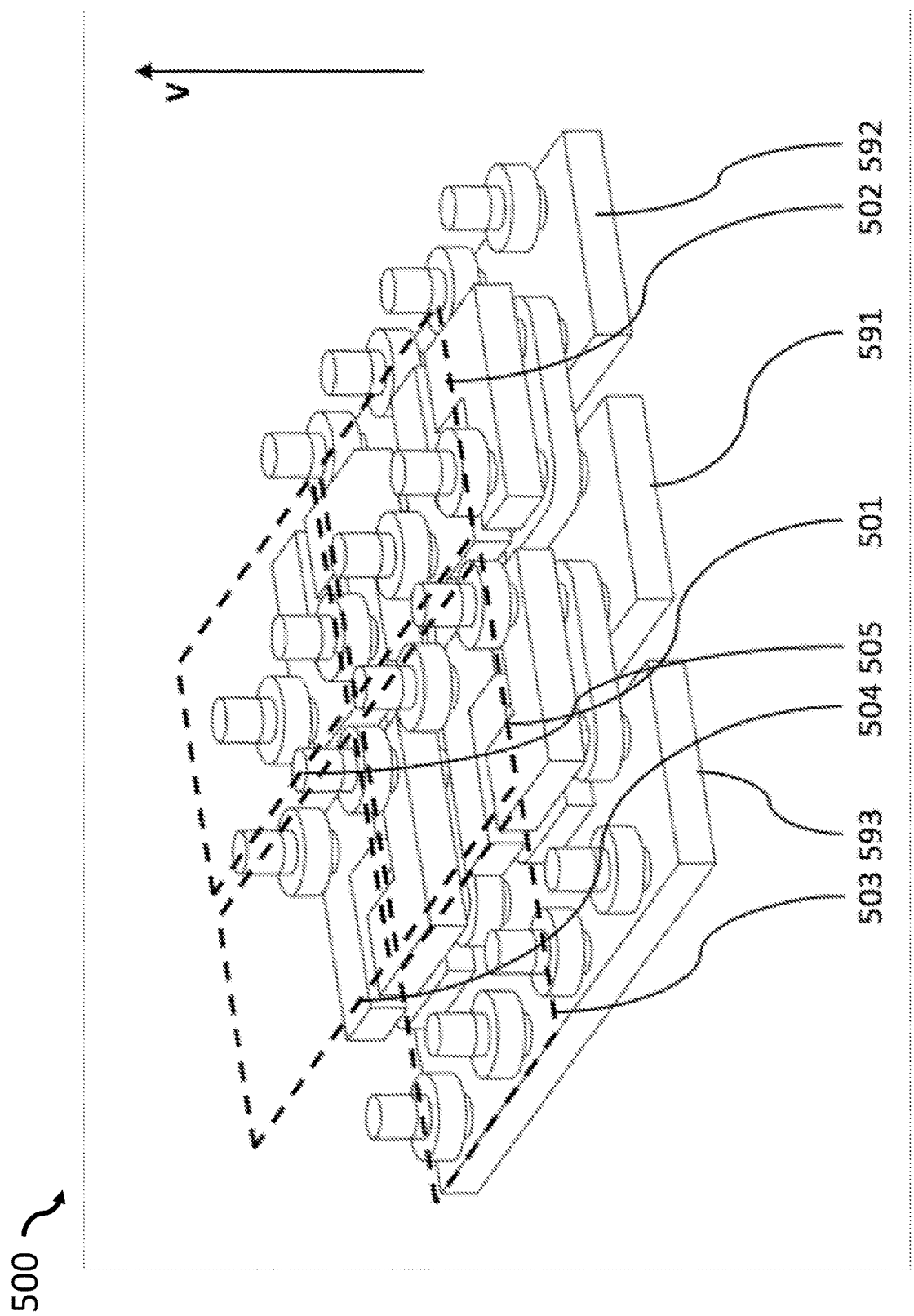
FIGS. 21-22 show the physical structure of a first array of SRAM cells.
Figure 22:
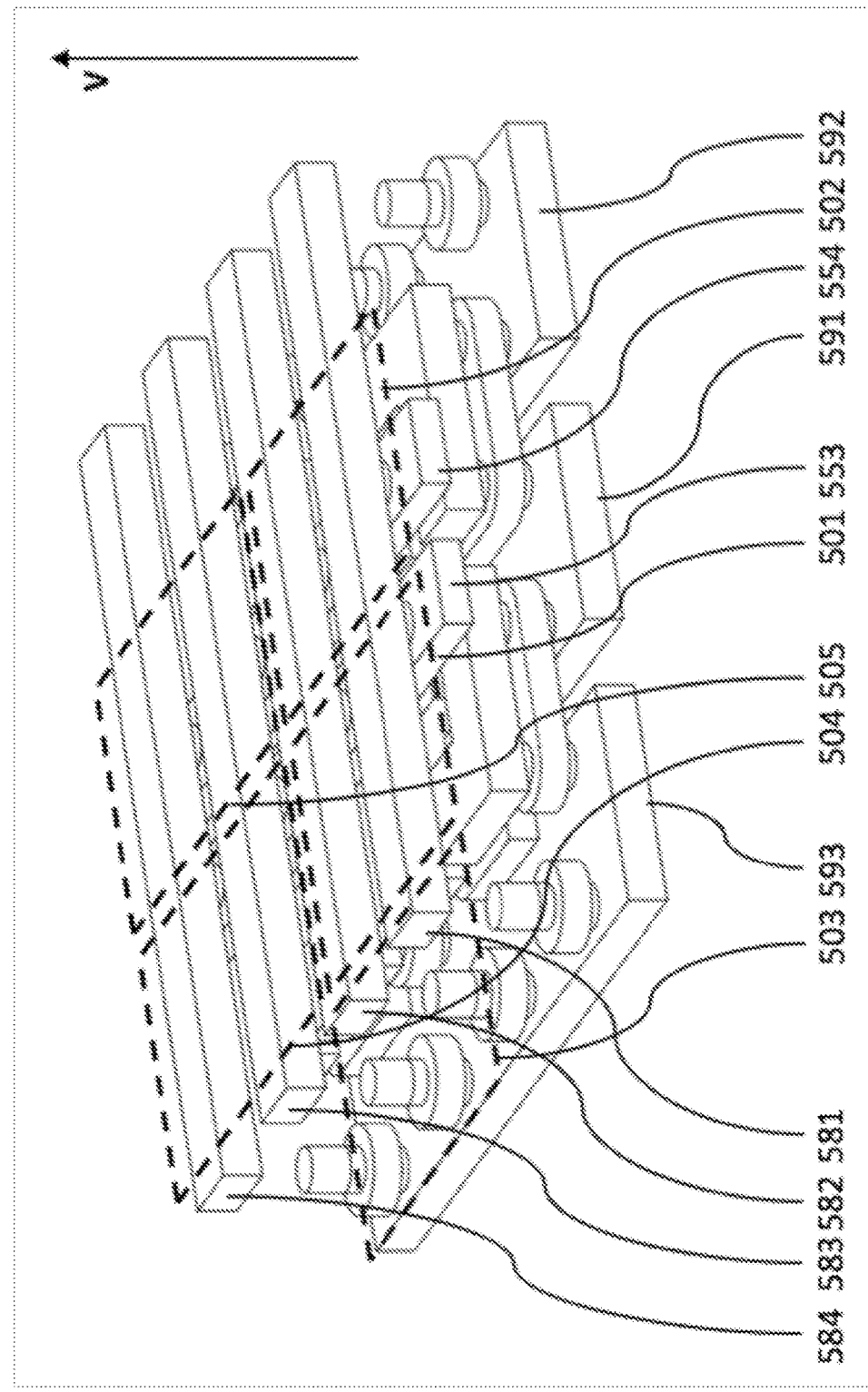

According to an embodiment shown in FIGS. 21 and 22, an integrated circuit 500 that includes multiple adjacent layers may be provided which includes mirror-symmetrical SRAM cells 501 and 502. The SRAM cells 501 and 502 may correspond to the SRAM cell of the integrated circuit 300. The plane of symmetry of the two mirror-symmetrical SRAM cells 501 and 502 may extend perpendicular to the layers of the integrated circuit 500 and parallel to the power supply rails 591, 592, 593. Two mirror-symmetrical SRAM cells 501 and 502 may share a power supply rail 591.

For example, the two mirror-symmetrical SRAM cells 501 and 502 may share the power supply rail 591 being connected to the stacks of the SRAM cells 501 and 502.

In addition, the two mirror-symmetrical SRAM cells 501 and 503 (SRAM cell 503 is only partly depicted in FIG. 21) may share a power supply rail 593 being connected to the second inverter FETs of the SRAM cells 501 and 503.

Thus, wider power supply rails 591, 592, 593 may be used for driving the SRAM cells. This may mitigate voltage fluctuations when reading/writing SRAMs cells connected to a common wordline. In addition, the distance between the SRAM cells in a direction $P_T$ transverse to the extension direction $P_L$ of the power supply rails 591, 592 may be reduced.

The integrated circuit 500 includes a pair of two further SRAM cells 504, 505. The pair of the two further SRAM cells 504, 505 is a translated version of the pair of SRAM cells 501, 502. An array of SRAM cells may be formed by providing even further translated SRAM cells along the power supply rails 591, 592, 593 and by continuing to provide mirror-symmetric SRAM cells in a direction perpendicular to the power supply rails 591, 592, 593.

As shown in FIG. 22, the wordline 553 may be used to address the SRAM cells 501 and 504. Correspondingly, the wordline 554 may be used to address the SRAM cells 502 and 505. The wordline 553 may extend only along the vertical structures that include two FETs and not above the vertical structures that include only one FET. The SRAM cells may be read/written with a bitline 581, a complementary bitline 582, a bitline 583 and a complementary bitline 584. Thus, an integrated circuit with alternating bitlines and complementary bitlines may be provided.

Figure 23:
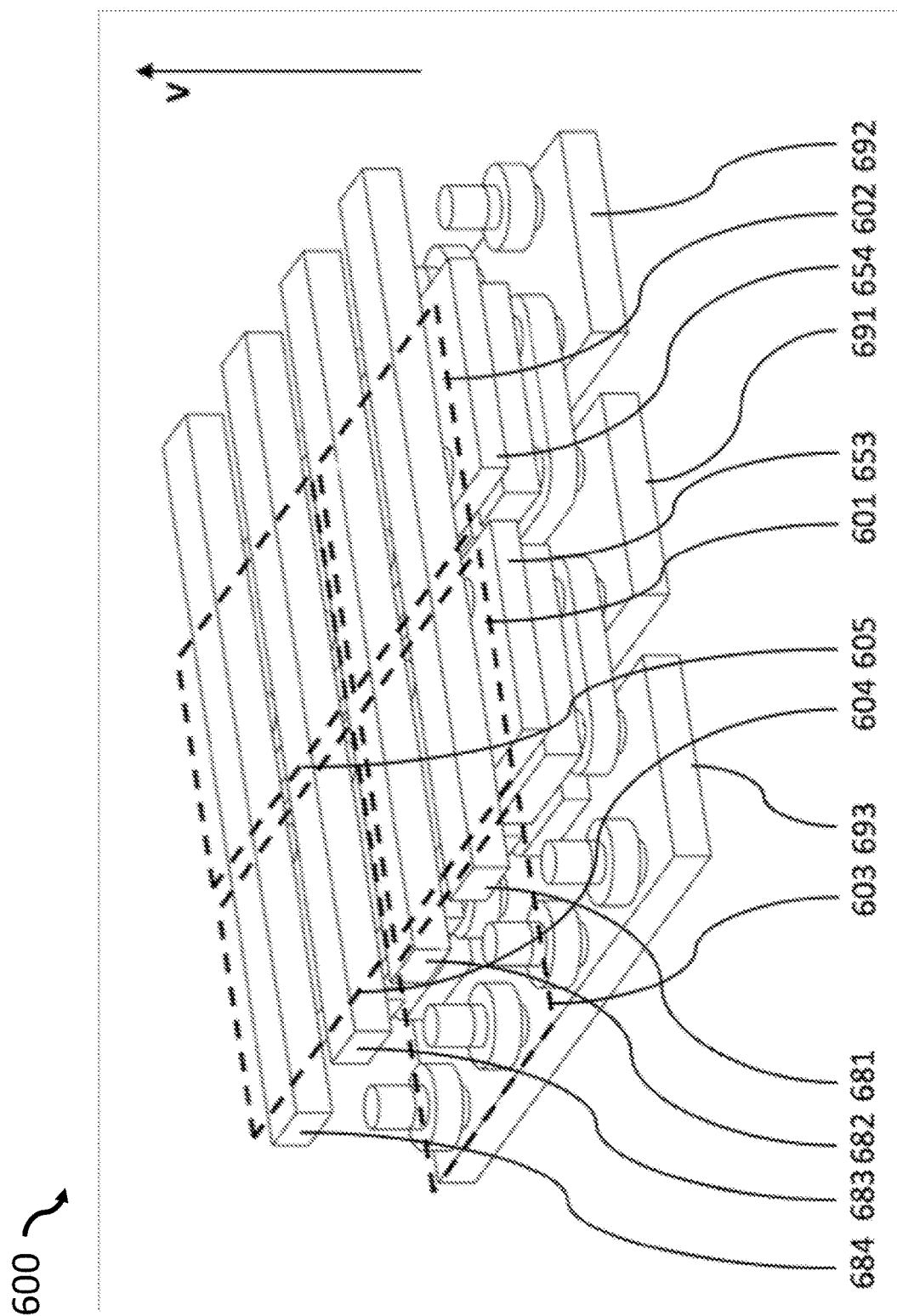
FIG. 23 shows the physical structure of a second array of SRAM cells.

FIG. 23 shows another integrated circuit 600 which is very similar to the integrated circuit 500 shown in FIGS. 21 and 22. The features 684, 683, 682, 681, 603, 693, 604, 605, 601, 691, 602 and 692 correspond to the features 584, 583, 582, 581, 503, 593, 504, 505, 501, 591, 502 and 592 (shown in FIG. 22). However, the wordlines 653 and 654 differ from the wordlines 553 and 554 (shown in FIG. 22). In particular, the wordlines 653 and 654 also extend above the vertical structures that include only one FET. The wider wordlines 653, 654 may allow for addressing more SRAM cells.

Figure 24:
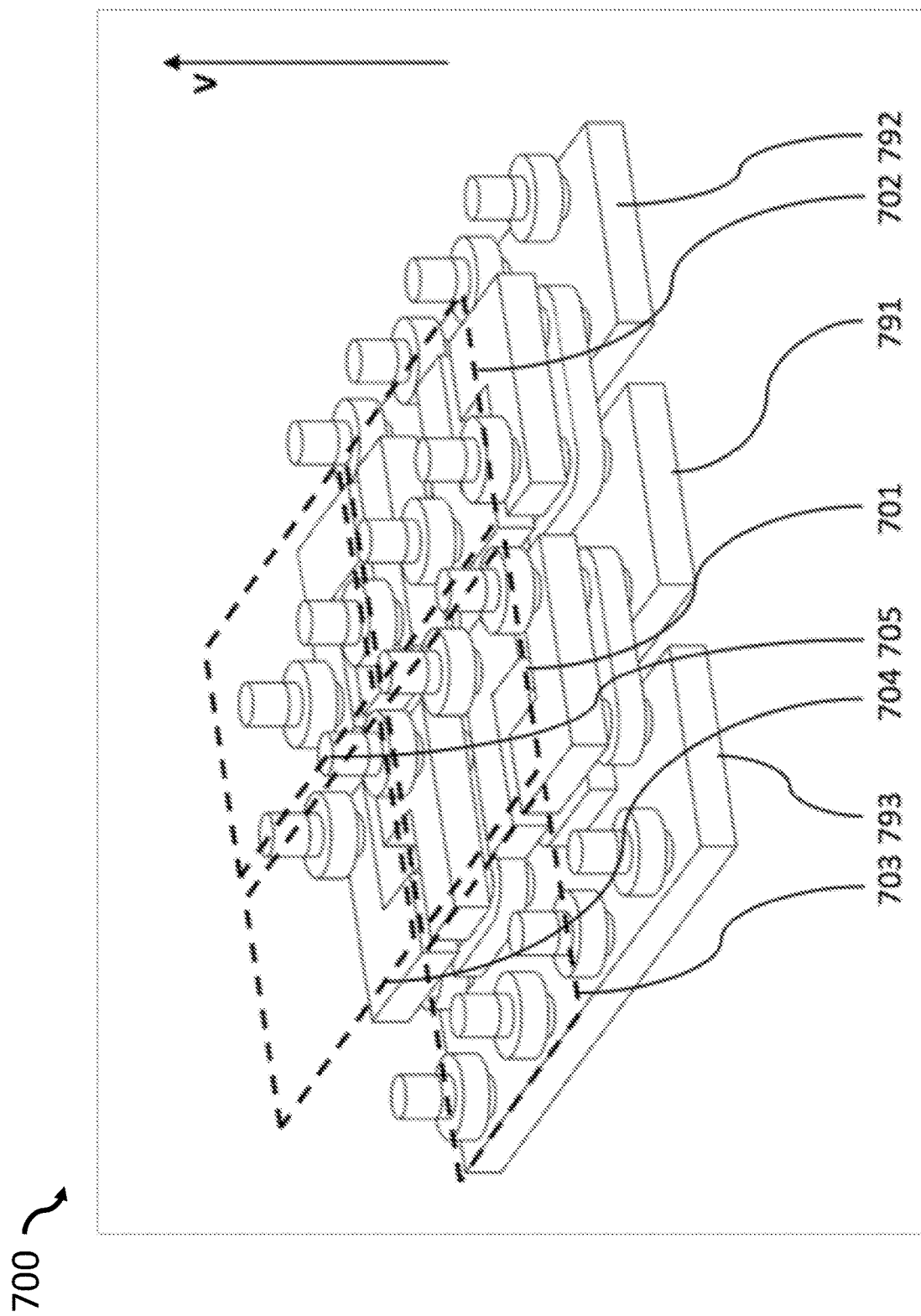
FIG. 24 shows the physical structure of a third array of SRAM cells.

FIG. 24 shows a still further integrated circuit 700. The integrated circuit with its features 703, 793, 704, 705, 701, 791, 702, 792 substantially corresponds to the integrated circuit 500 shown in FIG. 21. However, the SRAM cells 704, 705 are mirror-symmetrical versions of the SRAM cells 701, 702 instead of merely translated versions. This allows for a configuration, in which two bitlines are followed by two complementary bitlines which are again followed by two bitlines.

Figure 25:
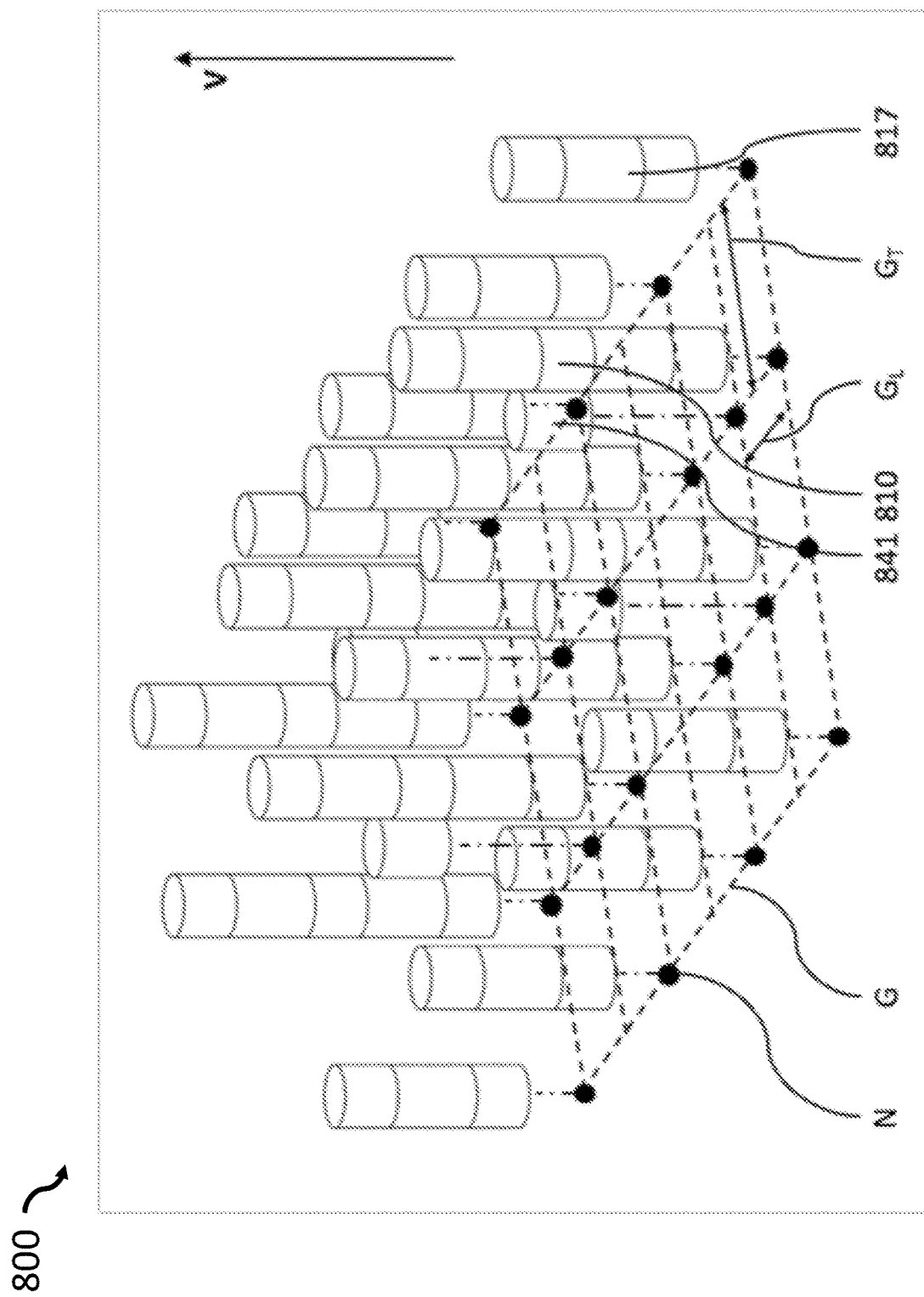
FIG. 25 shows vertical structures on nodes of a grid.

FIG. 25 illustrates another integrated circuit 800 that include multiple adjacent layers. The integrated circuit includes vertical structures extending in a vertical direction V that is substantially perpendicular to the layer of the integrated circuit. The vertical structures include a vertical connection element 841, a stack 810 of two FETs that each include a vertical channel region, and a FET 817 that also includes a vertical channel region.

The vertical structures 841, 810, 817 are arranged above nodes N of a virtual two-dimensional regular grid G. The grid G has a translational symmetry. The longitudinal spacing $G_L$ between two nodes of the grid in a longitudinal direction is different from the transversal spacing $G_T$ between two nodes of the grid in a transversal direction, wherein the longitudinal direction is perpendicular to the transversal direction. However, other embodiments may prescribe that the spacing $G_L$ between two nodes of the grid in a longitudinal direction is the same as the transversal spacing $G_T$ between two nodes of the grid in a transversal direction.

Figure 26:
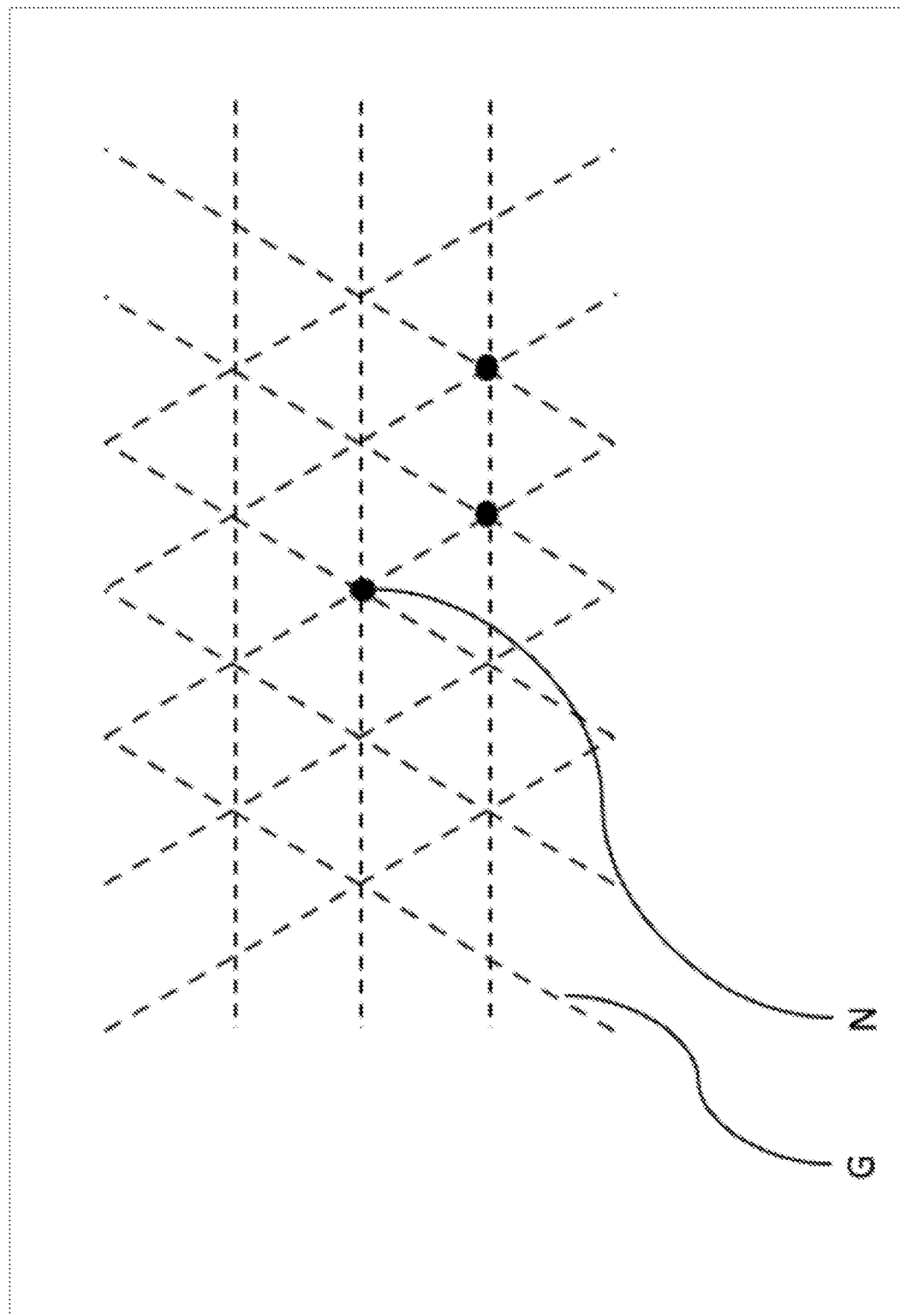
FIG. 26 shows nodes of another grid.

FIG. 26 shows a further virtual two-dimensional regular grid G having nodes N, above which vertical structures may be arranged. The grid G has a hexagonal structure.

The different elements of the integrated circuit may be embedded in an electrically insulating material. For example, the "open" spaces may be filled with a semiconductor oxide.

In the embodiments depicted in the Figs. of the application, the power supply rails have been shown below and the signal lines above the channel regions of the FETs. However, a mirrored arrangement is also conceivable, wherein the signal lines are provided below and the power supply rails above the channel regions of the FETs.

The integrated circuit may include a stack of two FETs having the same type and a stack of two FETs having the same type different from the type of the first stack. In particular, one stack may belong to a NAND cell and the other stack may belong to a NOR cell. The two stacks may be provided as vertical structures on different power supply rails.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A microelectronic device comprising a plurality of layers, the microelectronic device comprising:
    a first pair of transistors stacked vertically and connected in series, each of the first pair of transistors are of the same type; and
    a second pair of transistors connected in parallel, the second pair of transistors being a different type than the first pair of transistors, wherein the second pair of transistors are connected in parallel with the first pair of transistors,
    wherein the first pair of transistors and the second pair of transistors are arranged substantially perpendicular to the plurality of layers.

2. The microelectronic device according to claim 1, wherein a gate of one transistor of the first pair of transistors and a gate of one transistor of the second pair of transistors are connected to each other and correspond to a first input of the microelectronic device, wherein the gate of the one transistor of the first pair of transistors and the gate of the one transistor of the second pair of transistors are arranged in the same layer of the microelectronic device.

3. The microelectronic device according to claim 1, wherein a gate of one transistor of the first pair of transistors and a gate of one transistor of the second pair of transistors are connected to each other and correspond to a second input of the microelectronic device, wherein the gate of the one transistor of the first pair of transistors and the gate of the one transistor of the second pair of transistors are arranged in different layers of the microelectronic device.

4. The microelectronic device according to claim 1, further comprising:
    an internal connection element arranged in a single layer and connecting the second pair of transistors with each other.

5. The microelectronic device according to claim 1, further comprising:
    power supply rails arranged at one end of the first pair of vertically stacked transistors, and
    signal interconnect conductors arranged at an opposite end of the first pair of vertically stacked transistors.

6. The microelectronic device according to claim 1, wherein the microelectronic device is a NAND gate or a NOR gate.

7. A microelectronic device comprising a plurality of layers, the microelectronic device comprising:
    a first pair of transistors stacked vertically and connected in series, each of the first pair of transistors are of the same type; and
    a second pair of transistors connected in parallel and arranged in the same layer, the second pair of transistors being a different type than the first pair of transistors, wherein the second pair of transistors are connected in parallel with the first pair of transistors,
    wherein the first pair of transistors and the second pair of transistors are arranged substantially perpendicular to the plurality of layers,
    wherein a gate of one transistor of the first pair of transistors and a gate of one transistor of the second pair of transistors are connected to each other and correspond to a first input of the microelectronic device, wherein the gate of the one transistor of the first pair of transistors and the gate of the one transistor of the second pair of transistors are arranged in the same layer of the microelectronic device, and
    wherein a gate of one transistor of the first pair of transistors and a gate of one transistor of the second pair of transistors are connected to each other and correspond to a second input of the microelectronic device, wherein the gate of the one transistor of the first pair of transistors and the gate of the one transistor of the second pair of transistors are arranged in different layers of the microelectronic device.

8. The microelectronic device according to claim 7, further comprising:
    an internal connection element arranged in a single layer and connecting the second pair of transistors with each other.

9. The microelectronic device according to claim 7, further comprising:
    power supply rails connected to one end of the first pair of vertically stacked transistors, and
    signal interconnect conductors connected to an opposite end of the first pair of vertically stacked transistors.

10. The microelectronic device according to claim 7, wherein the microelectronic device is a NAND gate or a NOR gate.

11. The microelectronic device according to claim 9, wherein the power supply rails comprise a VDD power supply rail and a ground power supply rail.

12. The microelectronic device according to claim 7, further comprising:
    power supply rails arranged in a first layer; and
    signal interconnect conductors arranged in a second layer, wherein the first pair of vertically stacked transistors and the second pair of transistors are arranged between the first layer and the second layer.

13. A method of forming a microelectronic device comprising a plurality of layers, the method comprising:
    forming a first pair of transistors stacked vertically and connected in series, each of the first pair of transistors are of the same type; and
    forming a second pair of transistors connected in parallel, the second pair of transistors being a different type than the first pair of transistors, wherein the second pair of transistors are connected in parallel with the first pair of transistors,
    wherein the first pair of transistors and the second pair of transistors are formed substantially perpendicular to the plurality of layers.

14. The method according to claim 13, wherein a gate of one transistor of the first pair of transistors and a gate of one transistor of the second pair of transistors are connected to each other and correspond to a first input of the microelectronic device, wherein the gate of the one transistor of the first pair of transistors and the gate of the one transistor of the second pair of transistors are arranged in the same layer of the microelectronic device.

15. The method according to claim 13, wherein a gate of one transistor of the first pair of transistors and a gate of one transistor of the second pair of transistors are connected to each other and correspond to a second input of the microelectronic device, wherein the gate of the one transistor of the first pair of transistors and the gate of the one transistor of the second pair of transistors are arranged in different layers of the microelectronic device.

16. The method according to claim 13, further comprising:
forming an internal connection element arranged in a single layer and connecting the second pair of transistors with each other.

17. The method according to claim 13, further comprising:
forming power supply rails arranged at one end of the first pair of vertically stacked transistors, and
forming signal interconnect conductors arranged at an opposite end of the first pair of vertically stacked transistors.

18. The method according to claim 13, wherein the microelectronic device is a NAND gate or a NOR gate.

19. A method of forming a microelectronic device comprising a plurality of layers, the method comprising:
forming a first pair of transistors stacked vertically and connected in series, each of the first pair of transistors are of the same type; and
forming a second pair of transistors connected in parallel and arranged in the same layer, the second pair of transistors being a different type than the first pair of transistors, wherein the second pair of transistors are connected in parallel with the first pair of transistors,
wherein the first pair of transistors and the second pair of transistors are formed substantially perpendicular to the plurality of layers,
wherein a gate of one transistor of the first pair of transistors and a gate of one transistor of the second pair of transistors are connected to each other and correspond to a first input of the microelectronic device, wherein the gate of the one transistor of the first pair of transistors and the gate of the one transistor of the second pair of transistors are arranged in the same layer of the microelectronic device, and
wherein a gate of one transistor of the first pair of transistors and a gate of one transistor of the second pair of transistors are connected to each other and correspond to a second input of the microelectronic device, wherein the gate of the one transistor of the first pair of transistors and the gate of the one transistor of the second pair of transistors are arranged in different layers of the microelectronic device.

20. The method according to claim 19, further comprising:
forming an internal connection element arranged in a single layer and connecting the second pair of transistors with each other.

21. The method according to claim 19, further comprising:
forming power supply rails connected to one end of the first pair of vertically stacked transistors, and
forming signal interconnect conductors connected to an opposite end of the first pair of vertically stacked transistors.

22. The method according to claim 19, wherein the microelectronic device is a NAND gate or a NOR gate.

23. The method according to claim 21, wherein the power supply rails comprise a VDD power supply rail and a ground power supply rail.

24. The method according to claim 19, further comprising:
forming power supply rails arranged in a first layer;
forming signal interconnect conductors arranged in a second layer, wherein the first pair of vertically stacked transistors and the second pair of transistors are arranged between the first layer and the second layer.

* * * * *